(12) United States Patent
Pitts et al.

(10) Patent No.: US 10,298,834 B2
(45) Date of Patent: *May 21, 2019

(54) VIDEO REFOCUSING

(71) Applicant: GOOGLE LLC, Mountain View, CA (US)

(72) Inventors: Colvin Pitts, Snohomish, WA (US); Yi-Ren Ng, Palo Alto, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/207,110

(22) Filed: Jul. 11, 2016

(65) Prior Publication Data

US 2017/0134639 A1 May 11, 2017

Related U.S. Application Data

(60) Continuation-in-part of application No. 14/022,651, filed on Sep. 10, 2013, which is a division of
(Continued)

(51) Int. Cl.
*G06T 5/50* (2006.01)
*G06T 5/00* (2006.01)
(Continued)

(52) U.S. Cl.
CPC ......... *H04N 5/23212* (2013.01); *G06T 5/002* (2013.01); *G06T 5/003* (2013.01);
(Continued)

(58) Field of Classification Search
None
See application file for complete search history.

(56) References Cited

U.S. PATENT DOCUMENTS

| 725,567 A | 4/1903 | Ives |
| 4,383,170 A | 5/1983 | Takagi et al. |

(Continued)

FOREIGN PATENT DOCUMENTS

| CN | 101226292 | 7/2008 |
| CN | 101309359 | 11/2008 |

(Continued)

OTHER PUBLICATIONS

Adelson, E. H., et al., "Single Lens Stereo with a Plenoptic Camera" IEEE Translation on Pattern Analysis and Machine Intelligence, Feb. 1992. vol. 14, No. 2, pp. 99-106.
(Continued)

*Primary Examiner* — Kim Y Vu
*Assistant Examiner* — Nathan Bloom

(57) ABSTRACT

A video refocusing system operates in connection with refocusable video data, information, images and/or frames, which may be light field video data, information, images and/or frames, that may be focused and/or refocused after acquisition or recording. A video acquisition device acquires first refocusable light field video data of a scene, stores first refocusable video data representative of the first refocusable light field video data, acquires second refocusable light field video data of the scene after acquiring the first refocusable light field video data, determines a first virtual focus parameter (such as a virtual focus depth) using the second refocusable light field video data, generates first video data using the stored first refocusable video data and the first virtual focus parameter, wherein the first video data includes a focus depth that is different from an optical focus depth of the first refocusable light field video data, and outputs the first video data.

48 Claims, 52 Drawing Sheets

Related U.S. Application Data application No. 11/948,901, filed on Nov. 30, 2007, now Pat. No. 8,559,705, application No. 15/207,110, filed on Jul. 11, 2016, which is a continuation of application No. 14/273,349, filed on May 8, 2014, which is a continuation of application No. 14/032,720, filed on Sep. 20, 2013, now Pat. No. 8,760,566, which is a division of application No. 12/622,655, filed on Nov. 20, 2009, now Pat. No. 8,570,426.

(60) Provisional application No. 60/872,089, filed on Dec. 1, 2006, provisional application No. 61/117,621, filed on Nov. 25, 2008, provisional application No. 61/120,530, filed on Dec. 8, 2008.

(51) Int. Cl.
| | |
|---|---|
| *H01L 27/146* | (2006.01) |
| *G02B 27/00* | (2006.01) |
| *H04N 5/232* | (2006.01) |
| *H04N 13/207* | (2018.01) |
| *G06T 5/20* | (2006.01) |

(52) U.S. Cl.
CPC .................. *G06T 5/20* (2013.01); *G06T 5/50* (2013.01); *H04N 13/207* (2018.05); *G02B 27/0075* (2013.01); *G06T 2200/24* (2013.01); *G06T 2207/20092* (2013.01); *G06T 2207/20104* (2013.01); *G06T 2207/20108* (2013.01); *H01L 27/14627* (2013.01)

(56) References Cited

U.S. PATENT DOCUMENTS

| | | | |
|---|---|---|---|
| 4,661,986 A | 4/1987 | Adelson | |
| 4,694,185 A | 9/1987 | Weiss | |
| 4,920,419 A | 4/1990 | Easterly | |
| 5,076,687 A | 12/1991 | Adelson | |
| 5,077,810 A | 12/1991 | D'Luna | |
| 5,157,465 A | 10/1992 | Kronberg | |
| 5,251,019 A | 10/1993 | Moorman et al. | |
| 5,282,045 A | 1/1994 | Mimura et al. | |
| 5,499,069 A | 3/1996 | Griffith | |
| 5,572,034 A | 11/1996 | Karellas | |
| 5,610,390 A | 3/1997 | Miyano | |
| 5,729,471 A | 3/1998 | Jain et al. | |
| 5,748,371 A | 5/1998 | Cathey, Jr. et al. | |
| 5,757,423 A | 5/1998 | Tanaka et al. | |
| 5,818,525 A | 10/1998 | Elabd | |
| 5,835,267 A | 11/1998 | Mason et al. | |
| 5,907,619 A | 5/1999 | Davis | |
| 5,949,433 A | 9/1999 | Klotz | |
| 5,974,215 A | 10/1999 | Bilbro et al. | |
| 6,005,936 A | 12/1999 | Shimizu et al. | |
| 6,021,241 A | 2/2000 | Bilbro et al. | |
| 6,023,523 A | 2/2000 | Cohen et al. | |
| 6,028,606 A | 2/2000 | Kolb et al. | |
| 6,034,690 A | 3/2000 | Gallery et al. | |
| 6,061,083 A | 5/2000 | Aritake et al. | |
| 6,061,400 A | 5/2000 | Pearlstein et al. | |
| 6,069,565 A | 5/2000 | Stern et al. | |
| 6,075,889 A | 6/2000 | Hamilton, Jr. et al. | |
| 6,084,979 A | 7/2000 | Kanade et al. | |
| 6,091,860 A | 7/2000 | Dimitri | |
| 6,097,394 A | 8/2000 | Levoy et al. | |
| 6,115,556 A | 9/2000 | Reddington | |
| 6,137,100 A | 10/2000 | Fossum et al. | |
| 6,169,285 B1 | 1/2001 | Pertrillo et al. | |
| 6,201,899 B1 | 3/2001 | Bergen | |
| 6,221,687 B1 | 4/2001 | Abramovich | |
| 6,320,979 B1 | 11/2001 | Melen | |
| 6,424,351 B1 | 7/2002 | Bishop et al. | |
| 6,448,544 B1 | 9/2002 | Stanton et al. | |
| 6,466,207 B1 * | 10/2002 | Gortler .................. G06T 15/205 345/419 |
| 6,476,805 B1 | 11/2002 | Shum et al. | |
| 6,479,827 B1 | 11/2002 | Hamamoto et al. | |
| 6,483,535 B1 | 11/2002 | Tamburrino et al. | |
| 6,529,265 B1 | 3/2003 | Henningsen | |
| 6,577,342 B1 | 6/2003 | Wester | |
| 6,587,147 B1 | 7/2003 | Li | |
| 6,597,859 B1 | 7/2003 | Leinhardt et al. | |
| 6,606,099 B2 | 8/2003 | Yamada | |
| 6,658,168 B1 | 12/2003 | Kim | |
| 6,674,430 B1 | 1/2004 | Kaufman et al. | |
| 6,687,419 B1 | 2/2004 | Atkin | |
| 6,768,980 B1 | 7/2004 | Meyer et al. | |
| 6,785,667 B2 | 8/2004 | Orbanes et al. | |
| 6,833,865 B1 | 12/2004 | Fuller et al. | |
| 6,842,297 B2 | 1/2005 | Dowski, Jr. et al. | |
| 6,900,841 B1 | 5/2005 | Mihara | |
| 6,924,841 B2 | 8/2005 | Jones | |
| 6,927,922 B2 | 8/2005 | George et al. | |
| 7,003,061 B2 | 2/2006 | Wiensky | |
| 7,015,954 B1 | 3/2006 | Foote et al. | |
| 7,025,515 B2 | 4/2006 | Woods | |
| 7,034,866 B1 | 4/2006 | Colmenarez et al. | |
| 7,079,698 B2 | 7/2006 | Kobayashi | |
| 7,102,666 B2 | 9/2006 | Kanade et al. | |
| 7,164,807 B2 | 1/2007 | Morton | |
| 7,206,022 B2 | 4/2007 | Miller et al. | |
| 7,239,345 B1 | 7/2007 | Rogina | |
| 7,286,295 B1 | 10/2007 | Sweatt et al. | |
| 7,304,670 B1 | 12/2007 | Hussey et al. | |
| 7,329,856 B2 | 2/2008 | Ma et al. | |
| 7,336,430 B2 | 2/2008 | George | |
| 7,417,670 B1 | 8/2008 | Linzer et al. | |
| 7,469,381 B2 | 12/2008 | Ording | |
| 7,477,304 B2 | 1/2009 | Hu | |
| 7,587,109 B1 | 9/2009 | Reininger | |
| 7,620,309 B2 | 11/2009 | Georgiev | |
| 7,623,726 B1 | 11/2009 | Georgiev | |
| 7,633,513 B2 | 12/2009 | Kondo et al. | |
| 7,683,951 B2 | 3/2010 | Aotsuka | |
| 7,687,757 B1 | 3/2010 | Tseng et al. | |
| 7,724,952 B2 | 5/2010 | Shum et al. | |
| 7,748,022 B1 | 6/2010 | Frazier | |
| 7,847,825 B2 | 12/2010 | Aoki et al. | |
| 7,936,377 B2 | 5/2011 | Friedhoff et al. | |
| 7,941,634 B2 | 5/2011 | Georgi | |
| 7,945,653 B2 | 5/2011 | Zuckerberg et al. | |
| 7,949,252 B1 | 5/2011 | Georgiev | |
| 7,982,776 B2 | 7/2011 | Dunki-Jacobs et al. | |
| 8,013,904 B2 | 9/2011 | Tan et al. | |
| 8,085,391 B2 | 12/2011 | Machida et al. | |
| 8,106,856 B2 | 1/2012 | Matas et al. | |
| 8,115,814 B2 | 2/2012 | Iwase et al. | |
| 8,155,456 B2 | 4/2012 | Babacan | |
| 8,155,478 B2 | 4/2012 | Vitsnudel et al. | |
| 8,189,089 B1 | 5/2012 | Georgiev et al. | |
| 8,228,417 B1 | 7/2012 | Georgiev et al. | |
| 8,248,515 B2 | 8/2012 | Ng et al. | |
| 8,259,198 B2 | 9/2012 | Cote et al. | |
| 8,264,546 B2 | 9/2012 | Witt | |
| 8,289,440 B2 | 10/2012 | Knight et al. | |
| 8,290,358 B1 | 10/2012 | Georgiev | |
| 8,310,554 B2 | 11/2012 | Aggarwal et al. | |
| 8,315,476 B1 | 11/2012 | Georgiev et al. | |
| 8,345,144 B1 | 1/2013 | Georgiev et al. | |
| 8,400,533 B1 | 3/2013 | Szedo | |
| 8,400,555 B1 | 3/2013 | Georgiev et al. | |
| 8,411,948 B2 | 4/2013 | Rother | |
| 8,427,548 B2 | 4/2013 | Lim et al. | |
| 8,442,397 B2 | 5/2013 | Kang et al. | |
| 8,446,516 B2 | 5/2013 | Pitts et al. | |
| 8,494,304 B2 | 7/2013 | Venable et al. | |
| 8,531,581 B2 | 9/2013 | Shroff | |
| 8,542,933 B2 | 9/2013 | Venkataraman et al. | |
| 8,559,705 B2 | 10/2013 | Ng | |
| 8,577,216 B2 | 11/2013 | Li et al. | |
| 8,581,998 B2 | 11/2013 | Ohno | |
| 8,589,374 B2 | 11/2013 | Chaudhri | |

(56) References Cited

U.S. PATENT DOCUMENTS

| | | |
|---|---|---|
| 8,593,564 B2 | 11/2013 | Border et al. |
| 8,605,199 B2 | 12/2013 | Imai |
| 8,614,764 B2 | 12/2013 | Pitts et al. |
| 8,619,082 B1 | 12/2013 | Ciurea et al. |
| 8,629,930 B2 | 1/2014 | Brueckner et al. |
| 8,665,440 B1 | 3/2014 | Kompaniets et al. |
| 8,675,073 B2 | 3/2014 | Aagaard et al. |
| 8,724,014 B2 | 5/2014 | Ng et al. |
| 8,736,710 B2 | 5/2014 | Spielberg |
| 8,736,751 B2 | 5/2014 | Yun |
| 8,749,620 B1 | 6/2014 | Pitts et al. |
| 8,750,509 B2 | 6/2014 | Renkis |
| 8,754,829 B2 | 6/2014 | Lapstun |
| 8,768,102 B1 | 7/2014 | Ng et al. |
| 8,760,566 B2 | 8/2014 | Pitts et al. |
| 8,797,321 B1 | 8/2014 | Bertolami et al. |
| 8,811,769 B1 | 8/2014 | Pitts et al. |
| 8,831,377 B2 | 9/2014 | Pitts et al. |
| 8,848,970 B2 | 9/2014 | Aller et al. |
| 8,860,856 B2 | 10/2014 | Wetzstein et al. |
| 8,879,901 B2 | 11/2014 | Caldwell et al. |
| 8,903,232 B1 | 12/2014 | Caldwell |
| 8,908,058 B2 | 12/2014 | Akeley et al. |
| 8,948,545 B2 | 2/2015 | Akeley et al. |
| 8,953,882 B2 | 2/2015 | Lim et al. |
| 8,971,625 B2 | 3/2015 | Pitts et al. |
| 8,976,288 B2 | 3/2015 | Ng et al. |
| 8,988,317 B1 | 3/2015 | Liang et al. |
| 8,995,785 B2 | 3/2015 | Knight et al. |
| 8,997,021 B2 | 3/2015 | Liang et al. |
| 9,001,226 B1 | 4/2015 | Ng et al. |
| 9,013,611 B1 | 4/2015 | Szedo |
| 9,106,914 B2 | 8/2015 | Doser |
| 9,172,853 B2 | 10/2015 | Pitts et al. |
| 9,184,199 B2 | 11/2015 | Pitts et al. |
| 9,201,193 B2 | 12/2015 | Smith |
| 9,210,391 B1 | 12/2015 | Mills |
| 9,214,013 B2 | 12/2015 | Venkataraman et al. |
| 9,294,662 B2 | 3/2016 | Vondran, Jr. et al. |
| 9,300,932 B2 | 3/2016 | Knight et al. |
| 9,305,375 B2 | 4/2016 | Akeley |
| 9,305,956 B2 | 4/2016 | Pittes et al. |
| 9,386,288 B2 | 7/2016 | Akeley et al. |
| 9,392,153 B2 | 7/2016 | Myhre et al. |
| 9,419,049 B2 | 8/2016 | Pitts et al. |
| 9,467,607 B2 | 10/2016 | Ng et al. |
| 9,497,380 B1 | 11/2016 | Jannard et al. |
| 9,607,424 B2 | 3/2017 | Ng et al. |
| 9,628,684 B2 | 4/2017 | Liang et al. |
| 9,635,332 B2 | 4/2017 | Carroll et al. |
| 9,639,945 B2 | 5/2017 | Oberheu et al. |
| 9,647,150 B2 | 5/2017 | Blasco Claret |
| 9,681,069 B2 | 6/2017 | El-Ghoroury et al. |
| 9,774,800 B2 | 9/2017 | El-Ghoroury et al. |
| 9,858,649 B2 | 1/2018 | Liang et al. |
| 9,866,810 B2 | 1/2018 | Knight et al. |
| 9,900,510 B1 | 2/2018 | Karafin et al. |
| 9,979,909 B2 | 5/2018 | Kuang et al. |
| 2001/0048968 A1 | 12/2001 | Cox et al. |
| 2001/0053202 A1 | 12/2001 | Mazess et al. |
| 2002/0001395 A1 | 1/2002 | Davis et al. |
| 2002/0015048 A1* | 2/2002 | Nister ............... G06T 15/20 345/625 |
| 2002/0061131 A1 | 5/2002 | Sawhney |
| 2002/0109783 A1 | 8/2002 | Hayashi et al. |
| 2002/0159030 A1 | 10/2002 | Frey et al. |
| 2002/0199106 A1 | 12/2002 | Hayashi |
| 2003/0043270 A1 | 3/2003 | Rafey |
| 2003/0081145 A1 | 5/2003 | Seaman et al. |
| 2003/0103670 A1 | 6/2003 | Schoelkopf et al. |
| 2003/0117511 A1 | 6/2003 | Belz et al. |
| 2003/0123700 A1 | 7/2003 | Wakao |
| 2003/0133018 A1 | 7/2003 | Ziemkowski |
| 2003/0147252 A1 | 8/2003 | Fioravanti |
| 2003/0156077 A1 | 8/2003 | Balogh |
| 2004/0002179 A1 | 1/2004 | Barton |
| 2004/0012688 A1 | 1/2004 | Tinnerinno et al. |
| 2004/0012689 A1 | 1/2004 | Tinnerinno et al. |
| 2004/0101166 A1 | 5/2004 | Williams et al. |
| 2004/0114176 A1 | 6/2004 | Bodin et al. |
| 2004/0135780 A1* | 7/2004 | Nims ............... H04N 13/026 345/419 |
| 2004/0189686 A1 | 9/2004 | Tanguay et al. |
| 2004/0257360 A1 | 12/2004 | Sieckmann |
| 2005/0031203 A1 | 2/2005 | Fukuda |
| 2005/0049500 A1 | 3/2005 | Babu et al. |
| 2005/0052543 A1 | 3/2005 | Li et al. |
| 2005/0080602 A1 | 4/2005 | Snyder et al. |
| 2005/0162540 A1 | 7/2005 | Yata |
| 2005/0212918 A1 | 9/2005 | Serra et al. |
| 2005/0276441 A1 | 12/2005 | Debevec |
| 2006/0008265 A1 | 1/2006 | Ito |
| 2006/0023066 A1 | 2/2006 | Li et al. |
| 2006/0050170 A1 | 3/2006 | Tanaka |
| 2006/0056040 A1 | 3/2006 | Lan |
| 2006/0056604 A1 | 3/2006 | Sylthe et al. |
| 2006/0072175 A1 | 4/2006 | Oshino |
| 2006/0082879 A1 | 4/2006 | Miyoshi et al. |
| 2006/0130017 A1 | 6/2006 | Cohen et al. |
| 2006/0208259 A1 | 9/2006 | Jeon |
| 2006/0248348 A1 | 11/2006 | Wakao et al. |
| 2006/0250322 A1 | 11/2006 | Hall et al. |
| 2006/0256226 A1 | 11/2006 | Alon et al. |
| 2006/0274210 A1 | 12/2006 | Kim |
| 2006/0285741 A1 | 12/2006 | Subbarao |
| 2007/0008317 A1* | 1/2007 | Lundstrom ............ G06T 15/08 345/424 |
| 2007/0019883 A1 | 1/2007 | Wong et al. |
| 2007/0030357 A1 | 2/2007 | Levien et al. |
| 2007/0033588 A1 | 2/2007 | Landsman |
| 2007/0052810 A1 | 3/2007 | Monroe |
| 2007/0071316 A1 | 3/2007 | Kubo |
| 2007/0081081 A1 | 4/2007 | Cheng |
| 2007/0097206 A1 | 5/2007 | Houvener |
| 2007/0103558 A1 | 5/2007 | Cai et al. |
| 2007/0113198 A1 | 5/2007 | Robertson et al. |
| 2007/0140676 A1 | 6/2007 | Nakahara |
| 2007/0188613 A1* | 8/2007 | Nobori ............... G06T 11/60 348/207.1 |
| 2007/0201853 A1 | 8/2007 | Petschnigg |
| 2007/0229653 A1 | 10/2007 | Matusik et al. |
| 2007/0230944 A1 | 10/2007 | Georgiev |
| 2007/0252074 A1 | 11/2007 | Ng et al. |
| 2007/0269108 A1 | 11/2007 | Steinberg et al. |
| 2007/0273795 A1 | 11/2007 | Jaynes |
| 2008/0007626 A1 | 1/2008 | Wernersson |
| 2008/0012988 A1 | 1/2008 | Baharav et al. |
| 2008/0018668 A1 | 1/2008 | Yamauchi |
| 2008/0031537 A1 | 2/2008 | Gutkowicz-Krusin et al. |
| 2008/0049113 A1 | 2/2008 | Hirai |
| 2008/0056569 A1 | 3/2008 | Williams et al. |
| 2008/0122940 A1 | 5/2008 | Mori |
| 2008/0129728 A1 | 6/2008 | Satoshi |
| 2008/0131019 A1 | 6/2008 | Ng |
| 2008/0144952 A1 | 6/2008 | Chen et al. |
| 2008/0152215 A1 | 6/2008 | Horie et al. |
| 2008/0168404 A1 | 7/2008 | Ording |
| 2008/0180792 A1 | 7/2008 | Georgiev |
| 2008/0187305 A1* | 8/2008 | Raskar ............... G02B 27/0075 396/268 |
| 2008/0193026 A1 | 8/2008 | Horie et al. |
| 2008/0205871 A1 | 8/2008 | Utagawa |
| 2008/0226274 A1 | 9/2008 | Spielberg |
| 2008/0232680 A1 | 9/2008 | Berestov et al. |
| 2008/0253652 A1 | 10/2008 | Gupta et al. |
| 2008/0260291 A1 | 10/2008 | Alakarhu et al. |
| 2008/0266655 A1 | 10/2008 | Levoy et al. |
| 2008/0266688 A1 | 10/2008 | Errando Smet et al. |
| 2008/0277566 A1 | 11/2008 | Utagawa |
| 2008/0309813 A1 | 12/2008 | Watanabe |
| 2008/0316301 A1 | 12/2008 | Givon |
| 2009/0027542 A1 | 1/2009 | Yamamoto et al. |
| 2009/0041381 A1 | 2/2009 | Georgiev et al. |
| 2009/0041448 A1 | 2/2009 | Georgiev et al. |

(56) References Cited

U.S. PATENT DOCUMENTS

| | | |
|---|---|---|
| 2009/0070710 A1 | 3/2009 | Kagaya |
| 2009/0102956 A1 | 4/2009 | Georgiev |
| 2009/0109280 A1 | 4/2009 | Gotsman |
| 2009/0128658 A1 | 5/2009 | Hayasaka et al. |
| 2009/0128669 A1 | 5/2009 | Ng et al. |
| 2009/0135258 A1 | 5/2009 | Nozaki |
| 2009/0140131 A1 | 6/2009 | Utagawa |
| 2009/0185051 A1 | 7/2009 | Sano |
| 2009/0185801 A1 | 7/2009 | Georgiev et al. |
| 2009/0190022 A1 | 7/2009 | Ichimura |
| 2009/0190024 A1 | 7/2009 | Hayasaka et al. |
| 2009/0195689 A1 | 8/2009 | Hwang et al. |
| 2009/0202235 A1 | 8/2009 | Li et al. |
| 2009/0204813 A1 | 8/2009 | Kwan |
| 2009/0207233 A1 | 8/2009 | Mauchly et al. |
| 2009/0268970 A1 | 10/2009 | Babacan et al. |
| 2009/0273843 A1 | 11/2009 | Raskar et al. |
| 2009/0295829 A1 | 12/2009 | Georgiev et al. |
| 2009/0309973 A1 | 12/2009 | Kogane |
| 2009/0309975 A1 | 12/2009 | Gordon |
| 2009/0310885 A1 | 12/2009 | Tamaru |
| 2009/0321861 A1 | 12/2009 | Oliver et al. |
| 2010/0003024 A1 | 1/2010 | Agrawal et al. |
| 2010/0021001 A1 | 1/2010 | Honsinger et al. |
| 2010/0026852 A1 | 2/2010 | Ng et al. |
| 2010/0050120 A1 | 2/2010 | Ohazama et al. |
| 2010/0060727 A1 | 3/2010 | Steinberg et al. |
| 2010/0097444 A1 | 4/2010 | Lablans |
| 2010/0103311 A1 | 4/2010 | Makii |
| 2010/0107068 A1 | 4/2010 | Butcher et al. |
| 2010/0111489 A1 | 5/2010 | Presler |
| 2010/0123784 A1 | 5/2010 | Ding et al. |
| 2010/0128145 A1 | 5/2010 | Pitts et al. |
| 2010/0129048 A1 | 5/2010 | Pitts et al. |
| 2010/0141780 A1 | 6/2010 | Tan et al. |
| 2010/0142839 A1 | 6/2010 | Lakus-Becker |
| 2010/0201789 A1 | 8/2010 | Yahagi |
| 2010/0253782 A1 | 10/2010 | Elazary |
| 2010/0265385 A1 | 10/2010 | Knight et al. |
| 2010/0277617 A1 | 11/2010 | Hollinger |
| 2010/0277629 A1 | 11/2010 | Tanaka |
| 2010/0303288 A1 | 12/2010 | Malone |
| 2010/0328485 A1 | 12/2010 | Imamura et al. |
| 2011/0001858 A1 | 1/2011 | Shintani |
| 2011/0018903 A1 | 1/2011 | Lapstun et al. |
| 2011/0019056 A1 | 1/2011 | Hirsch et al. |
| 2011/0025827 A1 | 2/2011 | Shpunt et al. |
| 2011/0032338 A1 | 2/2011 | Raveendran et al. |
| 2011/0050864 A1 | 3/2011 | Bond |
| 2011/0050909 A1 | 3/2011 | Ellenby |
| 2011/0069175 A1 | 3/2011 | Mistretta et al. |
| 2011/0075729 A1 | 3/2011 | Dane et al. |
| 2011/0090255 A1 | 4/2011 | Wilson et al. |
| 2011/0091192 A1 | 4/2011 | Iwane |
| 2011/0123183 A1 | 5/2011 | Adelsberger et al. |
| 2011/0129120 A1 | 6/2011 | Chan |
| 2011/0129165 A1 | 6/2011 | Lim et al. |
| 2011/0148764 A1 | 6/2011 | Gao |
| 2011/0149074 A1 | 6/2011 | Lee et al. |
| 2011/0169994 A1 | 7/2011 | DiFrancesco et al. |
| 2011/0205384 A1 | 8/2011 | Zamowski et al. |
| 2011/0221947 A1 | 9/2011 | Awazu |
| 2011/0242334 A1 | 10/2011 | Wilburn et al. |
| 2011/0242352 A1 | 10/2011 | Hikosaka |
| 2011/0249341 A1 | 10/2011 | DiFrancesco et al. |
| 2011/0261164 A1 | 10/2011 | Olesen et al. |
| 2011/0261205 A1 | 10/2011 | Sun |
| 2011/0267263 A1 | 11/2011 | Hinckley |
| 2011/0267348 A1 | 11/2011 | Lin |
| 2011/0273466 A1 | 11/2011 | Imai et al. |
| 2011/0279479 A1 | 11/2011 | Rodriguez |
| 2011/0133649 A1 | 12/2011 | Bales et al. |
| 2011/0292258 A1 | 12/2011 | Adler |
| 2011/0293179 A1 | 12/2011 | Dikmen |
| 2011/0298960 A1 | 12/2011 | Tan et al. |
| 2011/0304745 A1 | 12/2011 | Wang et al. |
| 2011/0311046 A1 | 12/2011 | Oka |
| 2011/0316968 A1 | 12/2011 | Taguchi et al. |
| 2012/0014837 A1 | 1/2012 | Fehr et al. |
| 2012/0050562 A1 | 3/2012 | Perwass et al. |
| 2012/0056889 A1 | 3/2012 | Carter et al. |
| 2012/0057040 A1 | 3/2012 | Park et al. |
| 2012/0057806 A1 | 3/2012 | Backlund et al. |
| 2012/0062755 A1 | 3/2012 | Takahashi et al. |
| 2012/0132803 A1 | 5/2012 | Hirato et al. |
| 2012/0133746 A1 | 5/2012 | Bigioi et al. |
| 2012/0147205 A1 | 6/2012 | Lelescu et al. |
| 2012/0176481 A1 | 7/2012 | Lukk et al. |
| 2012/0188344 A1 | 7/2012 | Imai |
| 2012/0201475 A1 | 8/2012 | Carmel et al. |
| 2012/0206574 A1 | 8/2012 | Shikata et al. |
| 2012/0218463 A1 | 8/2012 | Benezra et al. |
| 2012/0224787 A1 | 9/2012 | Imai |
| 2012/0229691 A1 | 9/2012 | Hiasa et al. |
| 2012/0249529 A1 | 10/2012 | Matsumoto |
| 2012/0249550 A1 | 10/2012 | Akeley |
| 2012/0249819 A1 | 10/2012 | Imai |
| 2012/0251131 A1 | 10/2012 | Henderson et al. |
| 2012/0257065 A1 | 10/2012 | Velarde et al. |
| 2012/0257795 A1 | 10/2012 | Kim et al. |
| 2012/0271115 A1 | 10/2012 | Buerk |
| 2012/0272271 A1 | 10/2012 | Nishizawa et al. |
| 2012/0287246 A1 | 11/2012 | Katayama |
| 2012/0287296 A1 | 11/2012 | Fukui |
| 2012/0287329 A1 | 11/2012 | Yahata |
| 2012/0293075 A1 | 11/2012 | Engelen et al. |
| 2012/0300091 A1 | 11/2012 | Shroff et al. |
| 2012/0237222 A9 | 12/2012 | Ng et al. |
| 2013/0002902 A1 | 1/2013 | Ito |
| 2013/0002936 A1 | 1/2013 | Hirama et al. |
| 2013/0021486 A1 | 1/2013 | Richardson |
| 2013/0038696 A1 | 2/2013 | Ding et al. |
| 2013/0041215 A1 | 2/2013 | McDowall |
| 2013/0044290 A1 | 2/2013 | Kawamura |
| 2013/0050546 A1 | 2/2013 | Kano |
| 2013/0064453 A1 | 3/2013 | Nagasaka et al. |
| 2013/0064532 A1 | 3/2013 | Caldwell et al. |
| 2013/0070059 A1 | 3/2013 | Kushida |
| 2013/0070060 A1 | 3/2013 | Chatterjee et al. |
| 2013/0077880 A1 | 3/2013 | Venkataraman et al. |
| 2013/0082905 A1 | 4/2013 | Ranieri et al. |
| 2013/0088616 A1 | 4/2013 | Ingrassia, Jr. |
| 2013/0093844 A1 | 4/2013 | Shuto |
| 2013/0093859 A1 | 4/2013 | Nakamura |
| 2013/0094101 A1 | 4/2013 | Oguchi |
| 2013/0107085 A1 | 5/2013 | Ng et al. |
| 2013/0113981 A1 | 5/2013 | Knight et al. |
| 2013/0120356 A1 | 5/2013 | Georgiev et al. |
| 2013/0120605 A1 | 5/2013 | Georgiev et al. |
| 2013/0120636 A1 | 5/2013 | Baer |
| 2013/0121577 A1 | 5/2013 | Wang |
| 2013/0127901 A1 | 5/2013 | Georgiev et al. |
| 2013/0128052 A1 | 5/2013 | Catrein et al. |
| 2013/0128081 A1 | 5/2013 | Georgiev et al. |
| 2013/0128087 A1 | 5/2013 | Georgiev et al. |
| 2013/0129213 A1 | 5/2013 | Shectman |
| 2013/0135448 A1 | 5/2013 | Nagumo et al. |
| 2013/0176481 A1 | 7/2013 | Holmes et al. |
| 2013/0188068 A1 | 7/2013 | Said |
| 2013/0215108 A1 | 8/2013 | McMahon et al. |
| 2013/0215226 A1 | 8/2013 | Chauvier et al. |
| 2013/0222656 A1 | 8/2013 | Kaneko |
| 2013/0234935 A1 | 9/2013 | Griffith |
| 2013/0242137 A1 | 9/2013 | Kirkland |
| 2013/0243391 A1 | 9/2013 | Park et al. |
| 2013/0258451 A1 | 10/2013 | El-Ghoroury et al. |
| 2013/0262511 A1 | 10/2013 | Kuffner et al. |
| 2013/0286236 A1 | 10/2013 | Mankowski |
| 2013/0321574 A1 | 12/2013 | Zhang |
| 2013/0321581 A1 | 12/2013 | El-Ghoroury |
| 2013/0321677 A1 | 12/2013 | Cote et al. |
| 2013/0329107 A1 | 12/2013 | Burley |
| 2013/0329132 A1 | 12/2013 | Tico et al. |
| 2013/0335596 A1 | 12/2013 | Demandoix et al. |

(56) References Cited

U.S. PATENT DOCUMENTS

| | | |
|---|---|---|
| 2013/0342700 A1 | 12/2013 | Kass |
| 2014/0002502 A1 | 1/2014 | Han |
| 2014/0002699 A1 | 1/2014 | Guan |
| 2014/0003719 A1 | 1/2014 | Bai et al. |
| 2014/0013273 A1 | 1/2014 | Ng |
| 2014/0035959 A1 | 2/2014 | Lapstun |
| 2014/0037280 A1 | 2/2014 | Shirakawa |
| 2014/0049663 A1 | 2/2014 | Ng et al. |
| 2014/0059462 A1 | 2/2014 | Vvernersson |
| 2014/0085282 A1 | 3/2014 | Luebke et al. |
| 2014/0092424 A1 | 4/2014 | Grosz |
| 2014/0098191 A1 | 4/2014 | Rime et al. |
| 2014/0132741 A1 | 5/2014 | Aagaard et al. |
| 2014/0133749 A1 | 5/2014 | Kuo et al. |
| 2014/0139538 A1 | 5/2014 | Barber et al. |
| 2014/0167196 A1 | 6/2014 | Heimgartner et al. |
| 2014/0168484 A1 | 6/2014 | Suzuki |
| 2014/0176540 A1 | 6/2014 | Tosic et al. |
| 2014/0176592 A1 | 6/2014 | Wilburn et al. |
| 2014/0176710 A1 | 6/2014 | Brady |
| 2014/0177905 A1 | 6/2014 | Grefalda |
| 2014/0184885 A1 | 7/2014 | Tanaka et al. |
| 2014/0192208 A1 | 7/2014 | Okincha |
| 2014/0193047 A1 | 7/2014 | Grosz |
| 2014/0195921 A1 | 7/2014 | Grosz |
| 2014/0204111 A1 | 7/2014 | Vaidyanathan et al. |
| 2014/0211077 A1 | 7/2014 | Ng et al. |
| 2014/0218540 A1 | 8/2014 | Geiss et al. |
| 2014/0226038 A1 | 8/2014 | Kimura |
| 2014/0240463 A1 | 8/2014 | Pitts et al. |
| 2014/0240578 A1 | 8/2014 | Fishman et al. |
| 2014/0245367 A1 | 8/2014 | Sasaki |
| 2014/0267243 A1 | 9/2014 | Venkataraman et al. |
| 2014/0267639 A1 | 9/2014 | Tatsuta |
| 2014/0300753 A1 | 10/2014 | Yin |
| 2014/0313350 A1 | 10/2014 | Keelan |
| 2014/0313375 A1 | 10/2014 | Milnar |
| 2014/0333787 A1 | 11/2014 | Venkataraman |
| 2014/0340390 A1 | 11/2014 | Lanman et al. |
| 2014/0347540 A1 | 11/2014 | Kang |
| 2014/0354863 A1 | 12/2014 | Ahn et al. |
| 2014/0368494 A1 | 12/2014 | Sakharnykh et al. |
| 2014/0368640 A1 | 12/2014 | Strandemar et al. |
| 2015/0062178 A1 | 3/2015 | Matas et al. |
| 2015/0062386 A1 | 3/2015 | Sugawara |
| 2015/0092071 A1 | 4/2015 | Meng et al. |
| 2015/0097985 A1 | 4/2015 | Akeley |
| 2015/0130986 A1 | 5/2015 | Ohnishi |
| 2015/0193937 A1 | 7/2015 | Georgiev et al. |
| 2015/0206340 A1 | 7/2015 | Munkberg et al. |
| 2015/0207990 A1 | 7/2015 | Ford et al. |
| 2015/0237273 A1 | 8/2015 | Sawadaishi |
| 2015/0104101 A1 | 10/2015 | Bryant et al. |
| 2015/0288867 A1 | 10/2015 | Kajimura |
| 2015/0304544 A1 | 10/2015 | Eguchi |
| 2015/0310592 A1 | 10/2015 | Kano |
| 2015/0312553 A1 | 10/2015 | Ng et al. |
| 2015/0312593 A1 | 10/2015 | Akeley et al. |
| 2015/0346832 A1 | 12/2015 | Cole et al. |
| 2015/0370011 A1 | 12/2015 | Ishihara |
| 2015/0370012 A1 | 12/2015 | Ishihara |
| 2015/0373279 A1 | 12/2015 | Osborne |
| 2016/0029017 A1 | 1/2016 | Liang |
| 2016/0065931 A1 | 3/2016 | Konieczny |
| 2016/0065947 A1 | 3/2016 | Cole et al. |
| 2016/0142615 A1 | 5/2016 | Liang |
| 2016/0155215 A1 | 6/2016 | Suzuki |
| 2016/0165206 A1 | 6/2016 | Huang et al. |
| 2016/0173844 A1 | 6/2016 | Knight et al. |
| 2016/0191823 A1 | 6/2016 | El-Ghoroury |
| 2016/0253837 A1 | 9/2016 | Zhu et al. |
| 2016/0269620 A1 | 9/2016 | Romanenko et al. |
| 2016/0307368 A1 | 10/2016 | Akeley |
| 2016/0307372 A1 | 10/2016 | Pitts et al. |
| 2016/0309065 A1 | 10/2016 | Karafin et al. |
| 2016/0353006 A1 | 12/2016 | Anderson |
| 2016/0353026 A1 | 12/2016 | Blonde et al. |
| 2016/0381348 A1 | 12/2016 | Hayasaka |
| 2017/0031146 A1 | 2/2017 | Zheng |
| 2017/0059305 A1 | 3/2017 | Nonn et al. |
| 2017/0067832 A1 | 3/2017 | Ferrara, Jr. et al. |
| 2017/0078578 A1 | 3/2017 | Sato |
| 2017/0094906 A1 | 3/2017 | Liang et al. |
| 2017/0134639 A1 | 5/2017 | Pitts et al. |
| 2017/0139131 A1 | 5/2017 | Karafin et al. |
| 2017/0221226 A1 | 8/2017 | Shen |
| 2017/0237971 A1 | 8/2017 | Pitts et al. |
| 2017/0243373 A1 | 8/2017 | Bevensee et al. |
| 2017/0244948 A1 | 8/2017 | Pang et al. |
| 2017/0256036 A1 | 9/2017 | Song et al. |
| 2017/0263012 A1 | 9/2017 | Sabater et al. |
| 2017/0302903 A1 | 10/2017 | Ng et al. |
| 2017/0358092 A1 | 12/2017 | Bleibel et al. |
| 2017/0365068 A1 | 12/2017 | Tan et al. |
| 2017/0374411 A1 | 12/2017 | Lederer et al. |
| 2018/0007253 A1 | 1/2018 | Abe |
| 2018/0012397 A1 | 1/2018 | Carothers |
| 2018/0020204 A1 | 1/2018 | Pang et al. |
| 2018/0024753 A1 | 1/2018 | Gewickey et al. |
| 2018/0033209 A1 | 2/2018 | Akeley et al. |
| 2018/0034134 A1 | 2/2018 | Pang et al. |
| 2018/0070066 A1 | 3/2018 | Knight et al. |
| 2018/0070067 A1 | 3/2018 | Knight et al. |
| 2018/0082405 A1 | 3/2018 | Liang |
| 2018/0089903 A1 | 3/2018 | Pang et al. |
| 2018/0097867 A1 | 4/2018 | Pang et al. |
| 2018/0158198 A1 | 6/2018 | Karnad |

FOREIGN PATENT DOCUMENTS

| | | |
|---|---|---|
| DE | 19624421 | 6/1996 |
| JP | 2010020100 | 1/2010 |
| JP | 2011135170 | 7/2011 |
| WO | 03052465 | 6/2003 |
| WO | 06039486 | 4/2006 |
| WO | 07092545 | 8/2007 |
| WO | 07092581 | 8/2007 |
| WO | 2011010234 | 3/2011 |
| WO | 2011029209 | 3/2011 |
| WO | 2011081187 | 7/2011 |

OTHER PUBLICATIONS

Adelson, E. H., and Bergen, J. R. 1991. The plenoptic function and the elements of early vision. In Computational Models of Visual Processing, edited by Michael S. Landy and J. Anthony Movshon. Cambridge, Mass.: mit Press.

Agarwala, A., et al., "Interactive Digital Photomontage," ACM Transactions on Graphics, Proceedings of SIGGRAPH 2004, vol. 32, No. 3, 2004.

Chai, Jin-Xang et al., "Plenoptic Sampling", ACM SIGGRAPH 2000, Annual Conference Series, 2000, pp. 307-318.

Dowski et al., "Wavefront coding: a modern method of achieving high performance and/or low cost imaging systems" SPIE Proceedings, vol. 3779, Jul. 1999, pp. 137-145.

Georgiev, T., et al., Plenoptic Camera 2.0 (2008).

Georgiev, T., et al., "Unified Frequency Domain Analysis of Lightheld Cameras" (2008).

Georgiev, T., et al., "Spatio-Angular Resolution Tradeoff in Integral Photography," Proceedings of Eurographics Symposium on Rendering, 2006.

Gortler et al., "The lumigraph" SIGGRAPH 96, pp. 43-54.

Haeberli, "A Multifocus Method for Controlling Depth of Field" GRAPHICA Obscura, 1994, pp. 1-3.

Isaksen, A., et al., "Dynamically Reparameterized Light Fields," SIGGRAPH 2000, pp. 297-306.

Ives, H., "Optical properties of a Lippman lenticulated sheet," J. Opt. Soc. Am. 21, 171 (1931).

Jackson et al., "Selection of a Convolution Function for Fourier Inversion Using Gridding" IEEE Transactions on Medical Imaging, Sep. 1991, vol. 10, No. 3, pp. 473-478.

(56) References Cited

OTHER PUBLICATIONS

Levoy, M., et al., "Light Field Microscopy," ACM Transactions on Graphics, vol. 25, No. 3, Proceedings SIGGRAPH 2006.
Levoy, M., et al.,"Light Field Rendering" SIGGRAPH 96 Proceeding, 1996. pp. 31-42.
Levoy, M., "Light Fields and Computational Imaging" IEEE Computer Society, Aug. 2006, pp. 46-55.
Lippmann, "Reversible Prints", Communication at the French Society of Physics, Journal of Physics, Mar. 20, 1908, pp. 821-825.
Lumsdaine et al., "Full Resolution Lightfield Rendering" Adobe Technical Report Jan. 2008, pp. 1-12.
Mallat, Stephane, "A Wavelet Tour of Signal Processing", Academic Press 1998.
Naemura et al., "3-D Computer Graphics based on Integral Photography" Optics Express, Feb. 12, 2001. vol. 8, No. 2, pp. 255-262.
Nakamura, J., "Image Sensors and Signal Processing for Digital Still Cameras" (Optical Science and Engineering), 2005.
Ng, R., et al. "Light Field Photography with a Hand-held Plenoptic Camera," Stanford Technical Report, CSTR 2005-2, 2005.
Ng, R., "Digital Light Field Photography," Dissertation, Department of Computer Science, Stanford University, Jun. 2006.
Ng, R., "Fourier Slice Photography," ACM Transactions on Graphics, Proceedings of SIGGRAPH 2005, vol. 24, No. 3, 2005, pp. 735-744.
Ogden, J., "Pyramid-Based Computer Graphics", 1985.
Okano et al., "Three-dimensional video system based on integral photography" Optical Engineering, Jun. 1999, vol. 38, No. 6, pp. 1072-1077.
Sokolov, "Autostereoscopy and Integral Photography by Professor Lippmann's Method", 1911, pp. 23-29.
Story, D., "The Future of Photography", Optics Electronics, Oct. 2008.
Tanida et al., "Thin observation module by bound optics (TOMBO): concept and experimental verification" Applied Optics 40, 11 (Apr. 10, 2001), pp. 1806-1813.
Vaish et al., "Synthetic Aperture Focusing Using a Shear-Warp Factorization of the Viewing Transform," Workshop on Advanced 3D Imaging for Safety and Security (in conjunction with CVPR 2005).
Vaish et al., "Using plane + parallax for calibrating dense camera arrays", In Proceedings CVPR 2004, pp. 2-9.
Portable Network Graphics format: http://en.wikipedia.org/wiki/Portable_Network_Graphics. Retrieved Jan. 2013.
Exchangeable image file format: http://en.wikipedia.org/wiki/Exchangeable_image_file_format. Retrieved Jan. 2013.
Extensible Metadata Platform: http://en.wikipedia.org/wiki/Extensible_Metadata_Platform. Retrieved Jan. 2013.
Compression standard JPEG XR: http://en.wikipedia.org/wiki/JPEG_XR. Retrieved Jan. 2013.
Methods of Variable Bitrate Encoding (http://en.wikipedia.org/wiki/Variable_bitrate#Methods_of_VBR_encoding). Retrieved Jan. 2013.
Lazy loading of image data (http://en.wikipedia.org/wiki/Lazy_loading). Retrieved Jan. 2013.
Key framing for video animation (http://en.wikipedia.org/wiki/Key_frame). Retrieved Jan. 2013.
Autofocus systems and methods (http://en.wikipedia.org/wiki/Autofocus). Retrieved Jan. 2011.
Wilburn et al., "High Performance Imaging using Large Camera Arrays", ACM Transactions on Graphics (TOG), vol. 24, Issue 3 (Jul. 2005), Proceedings of ACM SIGGRAPH 2005, pp. 765-776.
Williams, L., "Pyramidal Parametrics", Computer Graphics (1983).
Data overlay techniques for real-time visual feed. For example, heads-up displays (http://en.wikipedia.org/wiki/Head-up_display). Retrieved Jan. 2013.
Moreno-Noguer, Francesc, et al., "Active Refocusing of Images and Videos", ACM Trans. on Graphics, Aug. 2007, pp. 1-9.
Meng, J. et al., "An Approach on Hardware Design for Computational Photography Applications Based on Light Field Refocusing Algorithm," Nov. 18, 2007, 12 pages.

Ives, H. "Parallax Panoramagrams Made with a Large Diameter Lens", Journal of the Optical Society of America; 1930.
Kautz, J., et al., "Fast arbitrary BRDF shading for low-frequency lighting using spherical harmonics", in Eurographic Rendering Workshop 2002, 291-296.
Koltun, et al., "Virtual Occluders: An Efficient Interediate PVS Representation", Rendering Techniques 2000: Proc. 11th Eurographics Workshop Rendering, pp. 59-70, Jun. 2000.
Kopf, J., et al., Deep Photo: Model-Based Photograph Enhancement and Viewing, SIGGRAPH Asia 2008.
Lehtinen, J., et al. "Matrix radiance transfer", in Symposium on Interactive 3D Graphics, 59-64, 2003.
Lesser, Michael, "Back-Side Illumination", 2009.
Levin, A., et al., "Image and Depth from a Conventional Camera with a Coded Aperture", SIGGRAPH 2007, pp. 1-9.
Levoy, M. "Light Field Photography and Videography," Oct. 18, 2005.
Levoy, M. "Stanford Light Field Microscope Project," 2008; http://graphics.stanford.edu/projects/lfmicroscope/, 4 pages.
Levoy, M., "Autofocus: Contrast Detection", http://graphics.stanford.edu/courses/cs178/applets/autofocusPD.html, pp. 1-3, 2010.
Levoy, M., "Autofocus: Phase Detection", http://graphics.stanford.edu/courses/cs178/applets/autofocusPD.html, pp. 1-3, 2010.
Liang, Chia-Kai, et al., "Programmable Aperture Photography: Multiplexed Light Field Acquisition", ACM SIGGRAPH, 2008.
Maeda, Y. et al., "A CMOS Image Sensor with Pseudorandom Pixel Placement for Clear Imaging," 2009 International Symposium on Intelligent Signal Processing and Communication Systems, Dec. 2009.
Magnor, M. et al., "Model-Aided Coding of Multi-Viewpoint Image Data," Proceedings IEEE Conference on Image Processing, ICIP-2000, Vancouver, Canada, Sep. 2000. https://graphics.tu-bs.de/static/people/magnor/publications/icip00.pdf.
Malzbender, et al., "Polynomial Texture Maps", Proceedings SIGGRAPH 2001.
Marshall, Richard J. et al., "Improving Depth Estimation from a Plenoptic Camera by Patterned Illumination," Proc. of SPIE, vol. 9528, 2015, pp. 1-6.
Masselus, Vincent, et al., "Relighting with 4D Incident Light Fields", SIGGRAPH 2003.
Meynants, G., et al., "Pixel Binning in CMOS Image Sensors," Frontiers in Electronic Imaging Conference, 2009.
National Instruments, "Anatomy of a Camera," pp. 1-5, Sep. 6, 2006.
Nayar, Shree, et al., "Shape from Focus", IEEE Transactions on Pattern Analysis and Machine Intelligence, vol. 16, No. 8, pp. 824-831, Aug. 1994.
Ng, R., et al., "All-Frequency Shadows Using Non-linear Wavelet Lighting Approximation. ACM Transactions on Graphics," ACM Transactions on Graphics; Proceedings of SIGGRAPH 2003.
Ng, R., et al., "Triple Product Wavelet Integrals for All-Frequency Relighting", ACM Transactions on Graphics (Proceedings of SIGGRAPH 2004).
Nguyen, Hubert. "Practical Post-Process Depth of Field." GPU Gems 3. Upper Saddle River, NJ: Addison-Wesley, 2008.
Nimeroff, J., et al., "Efficient rendering of naturally illuminatied environments" in Fifth Eurographics Workshop on Rendering, 359-373, 1994.
Nokia, "City Lens", May 2012.
Orzan, Alexandrina, et al., "Diffusion Curves: A Vector Representation for Smooth-Shaded Images," ACM Transactions on Graphics—Proceedings of SIGGRAPH 2008; vol. 27; 2008.
Pain, B., "Back-Side Illumination Technology for SOI-CMOS Image Sensors", 2009.
Perez, Patrick et al., "Poisson Image Editing," ACM Transactions on Graphics—Proceedings of ACM SIGGRAPH 2003; vol. 22, Issue 3; Jul. 2003; pp. 313-318.
Petschnigg, George, et al., "Digial Photography with Flash and No-Flash Image Pairs", SIGGRAPH 2004.
Primesense, "The Primesense 3D Awareness Sensor", 2007.
Ramamoorthi, R., et al, "Frequency space environment map rendering" ACM Transactions on Graphics (SIGGRAPH 2002 proceedings) 21, 3, 517-526.

(56) References Cited

OTHER PUBLICATIONS

Ramamoorthi, R., et al., "An efficient representation for irradiance environment maps", in Proceedings of SIGGRAPH 2001, 497-500.
Raskar, Ramesh et al., "Glare Aware Photography: 4D Ray Sampling for Reducing Glare Effects of Camera Lenses," ACM Transactions on Graphics—Proceedings of ACM SIGGRAPH, Aug. 2008; vol. 27, Issue 3; pp. 1-10.
Raskar, Ramesh et al., "Non-photorealistic Camera: Depth Edge Detection and Stylized Rendering using Multi-Flash Imaging", SIGGRAPH 2004.
Raytrix, "Raytrix Lightfield Camera," Raytrix GmbH, Germany 2012, pp. 1-35.
Roper Scientific, Germany "Fiber Optics," 2012.
Scharstein, Daniel, et al., "High-Accuracy Stereo Depth Maps Using Structured Light," CVPR'03 Proceedings of the 2003 IEEE Computer Society, pp. 195-202.
Schirmacher, H. et al., "High-Quality Interactive Lumigraph Rendering Through Warping," May 2000, Graphics Interface 2000.
Shade, Jonathan, et al., "Layered Depth Images", SIGGRAPH 98, pp. 1-2.
Shreiner, OpenGL Programming Guide, 7th edition, Chapter 8, 2010.
Simpleviewer, "Tiltview", http://simpleviewer.net/tiltviewer. Retrieved Jan. 2013.
Skodras, A. et al., "The JPEG 2000 Still Image Compression Standard," Sep. 2001, IEEE Signal Processing Magazine, pp. 36-58.
Sloan, P., et al., "Precomputed radiance transfer for real-time rendering in dynamic, low-frequency lighting environments", ACM Transactions on Graphics 21, 3, 527-536, 2002.
Snavely, Noah, et al., "Photo-tourism: Exploring Photo collections in 3D", ACM Transactions on Graphics (SIGGRAPH Proceedings), 2006.
Sony Corp, "Interchangeable Lens Digital Camera Handbook", 2011.
Sony, Sony's First Curved Sensor Photo: http://www.engadget.com; Jul. 2014.
Stensvold, M., "Hybrid AF: A New Approach to Autofocus Is Emerging for both Still and Video", Digital Photo Magazine, Nov. 13, 2012.
Sun, Jian, et al., "Stereo Matching Using Belief Propagation", 2002.
Tagging photos on Flickr, Facebook and other online photo sharing sites (see, for example, http://support.gnip.com/customer/portal/articles/809309-flickr-geo-photos-tag-search). Retrieved Jan. 2013.
U.S. Appl. No. 15/967,076, filed Apr. 30, 2018 listing Jiantao Kuang et al. as inventors, entitled "Automatic Lens Flare Detection and Correction for Light-Field Images".
U.S. Appl. No. 15/666,298, filed Aug. 1, 2017 listing Yonggang Ha et al. as inventors, entitled "Focal Reducer With Controlled Optical Properties for Interchangeable Lens Light-Field Camera".
U.S. Appl. No. 15/590,808, filed May 9, 2017 listing Alex Song et al. as inventors, entitled "Adaptive Control for Immersive Experience Delivery".
U.S. Appl. No. 15/864,938, filed Jan. 8, 2018 listing Jon Karafin et al. as inventors, entitled "Motion Blue for Light-Field Images".
U.S. Appl. No. 15/703,553, filed Sep. 13, 2017 listing Jon Karafin et al. as inventors, entitled "4D Camera Tracking and Optical Stabilization".
U.S. Appl. No. 15/590,841, filed May 9, 2017 listing Kurt Akeley et al. as inventors, entitled "Vantage Generation and Interactive Playback".
U.S. Appl. No. 15/590,951, filed May 9, 2017 listing Alex Song et al. as inventors, entitled "Wedge-Based Light-Field Video Capture".
U.S. Appl. No. 15/944,551, filed Apr. 3, 2018 listing Zejing Wang et al. as inventors, entitled "Generating Dolly Zoom Effect Using Light Field Image Data".
U.S. Appl. No. 15/874,723, filed Jan. 18, 2018 listing Mark Weir et al. as inventors, entitled "Multi-Camera Navigation Interface".
U.S. Appl. No. 15/897,994, filed Feb. 15, 2018 listing Trevor Carothers et al. as inventors, entitled "Generation of Virtual Reality With 6 Degrees of Freesom From Limited Viewer Data".
U.S. Appl. No. 15/605,037, filed May 25, 2017 listing Zejing Wang et al. as inventors, entitled "Multi-View Back-Projection to a Light-Field".
U.S. Appl. No. 15/897,836, filed Feb. 15, 2018 listing Francois Bleibel et al. as inventors, entitled "Multi-View Contour Tracking".
U.S. Appl. No. 15/897,942, filed Feb. 15, 2018 listing Francois Bleibel et al. as inventors, entitled "Multi-View Contour Tracking With Grabcut".
Adelsberger, R. et al., "Spatially Adaptive Photographic Flash," ETH Zurich, Department of Computer Science, Technical Report 612, 2008, pp. 1-12.
Adobe, "Photoshop CS6 / in depth: Digital Negative (DNG)", http://www.adobe.com/products/photoshop/extend.displayTab2html. Retrieved Jan. 2013.
Apple, "Apple iPad: Photo Features on the iPad", Retrieved Jan. 2013.
Bae, S., et al., "Defocus Magnification", Computer Graphics Forum, vol. 26, Issue 3 (Proc. of Eurographics 2007), pp. 1-9.
Belhumeur, Peter et al., "The Bas-Relief Ambiguity", International Journal of Computer Vision, 1997, pp. 1060-1066.
Belhumeur, Peter, et al., "The Bas-Relief Ambiguity", International Journal of Computer Vision, 1999, pp. 33-44, revised version.
Bhat, P. et al. "GradientShop: A Gradient-Domain Optimization Framework for Image and Video Filtering," SIGGRAPH 2010; 14 pages.
Bolles, R., et al., "Epipolar-Plane Image Analysis: An Approach to Determining Structure from Motion", International Journal of Computer Vision, 1, 7-55 (1987).
Bourke, Paul, "Image filtering in the Frequency Domain," pp. 1-9, Jun. 1998.
Canon, Canon Speedlite wireless flash system, User manual for Model 550EX, Sep. 1998.
Chen, S. et al., "A CMOS Image Sensor with On-Chip Image Compression Based on Predictive Boundary Adaptation and Memoryless QTD Algorithm," Very Large Scalee Integration (VLSI) Systems, IEEE Transactions, vol. 19, Issue 4; Apr. 2011.
Chen, W., et al., "Light Field mapping: Efficient representation and hardware rendering of surface light fields", ACM Transactions on Graphics 21, 3, 447-456, 2002.
Cohen, Noy et al., "Enhancing the performance of the light field microscope using wavefront coding," Optics Express, vol. 22, issue 20; 2014.
Daly, D., "Microlens Arrays" Retrieved Jan. 2013.
Debevec, et al, "A Lighting Reproduction Approach to Live-Action Compoisting" Proceedings SIGGRAPH 2002.
Debevec, P., et al., "Acquiring the reflectance field of a human face", SIGGRAPH 2000.
Debevec, P., et al., "Recovering high dynamic radiance maps from photographs", SIGGRAPH 1997, 369-378.
Design of the xBox menu. Retrieved Jan. 2013.
Digital Photography Review, "Sony Announce new RGBE CCD," Jul. 2003.
Dorsey, J., et al., "Design and simulation of opera light and projection effects", in Computer Graphics (Proceedings of SIGGRAPH 91), vol. 25, 41-50.
Dorsey, J., et al., "Interactive design of complex time dependent lighting", IEEE Computer Graphics and Applications 15, 2 (Mar. 1995), 26-36.
Dowski, Jr. "Extended Depth of Field Through Wave-Front Coding," Applied Optics, vol. 34, No. 11, Apr. 10, 1995; pp. 1859-1866.
Duparre, J. et al., "Micro-Optical Artificial Compound Eyes," Institute of Physics Publishing, Apr. 2006.
Eisemann, Elmar, et al., "Flash Photography Enhancement via Intrinsic Relighting", SIGGRAPH 2004.
Fattal, Raanan, et al., "Multiscale Shape and Detail Enhancement from Multi-light Image Collections", SIGGRAPH 2007.
Fernando, Randima, "Depth of Field—A Survey of Techniques," GPU Gems. Boston, MA; Addison-Wesley, 2004.
Fitzpatrick, Brad, "Camlistore", Feb. 1, 2011.
Fujifilm, Super CCD EXR Sensor by Fujifilm, brochure reference No. EB-807E, 2008.
Georgiev, T. et al., "Reducing Plenoptic Camera Artifacts," Computer Graphics Forum, vol. 29, No. 6, pp. 1955-1968; 2010.

(56) References Cited

OTHER PUBLICATIONS

Georgiev, T., et al., "Suppersolution with Plenoptic 2.0 Cameras," Optical Society of America 2009; pp. 1-3.
Girod, B., "Mobile Visual Search", IEEE Signal Processing Magazine, Jul. 2011.
Groen et al., "A Comparison of Different Focus Functions for Use in Autofocus Algorithms," Cytometry 6:81-91, 1985.
Heide, F. et al., "High-Quality Computational Imaging Through Simple Lenses," ACM Transactions on Graphics, SIGGRAPH 2013; pp. 1-7.
Heidelberg Collaboratory for Image Processing, "Consistent Depth Estimation in a 4D Light Field," May 2013.
Hirigoyen, F., et al., "1.1 um Backside Imager vs. Frontside Image: an optics-dedicated FDTD approach", IEEE 2009 International Image Sensor Workshop.
Huang, Fu-Chung et al., "Eyeglasses-free Display: Towards Correcting Visual Aberrations with Computational Light Held Displays," ACM Transaction on Graphics, Aug. 2014, pp. 1-12.
Takahashi, Keita, et al., "All in-focus View Synthesis from Under-Sampled Light Fields", ICAT 2003, Tokyo, Japan.
Tao, Michael, et al., "Depth from Combining Defocus and Correspondence Using Light-Field Cameras", Dec. 2013.
Techcrunch, "Coolinis", Retrieved Jan. 2013.
Teo, P., et al., "Efficient linear rendering for interactive light design", Tech. Rep. STAN-CS-TN-97-60, 1998, Stanford University.
Teranishi, N. "Evolution of Optical Structure in Images Sensors," Electron Devices Meeting (IEDM) 2012 IEEE International; Dec. 10-13, 2012.
VR Playhouse, "The Surrogate," http://www.vrplayhouse.com/the-surrogate.
Wanner, S. et al., "Globally Consistent Depth Labeling of 4D Light Fields," IEEE Conference on Computer Vision and Pattern Recognition, 2012.
Wanner, S. et al., "Variational Light Field Analysis for Disparity Estimation and Super-Resolution," IEEE Transacations on Pattern Analysis and Machine Intellegence, 2013.
Wenger, et al, "Performance Relighting and Reflectance Transformation with Time-Multiplexed Illumination", Institute for Creative Technologies, SIGGRAPH 2005.
Wetzstein, Gordon, et al., "Sensor Saturation in Fourier Multiplexed Imaging", IEEE Conference on Computer Vision and Pattern Recognition (2010).
Wikipedia—Adaptive Optics: http://en.wikipedia.org/wiki/adaptive_optics. Retrieved Feb. 2014.
Wikipedia—Bayer Filter: http:/en.wikipedia.org/wiki/Bayer_filter. Retrieved Jun. 20, 2013.
Wikipedia—Color Image Pipeline: http://en.wikipedia.org/wiki/color_image_pipeline. Retrieved Jan. 15, 2014.
Wikipedia—CYGM Filter: http://en.wikipedia.org/wiki/CYGM_filter. Retrieved Jun. 20, 2013.
Wikipedia—Exchangeable image file format: http://en.wikipedia.org/wiki/Exchangeable_image_file_format. Retrieved Jan. 2013.
Wikipedia—Expeed: http://en.wikipedia.org/wiki/EXPEED. Retrieved Jan. 15, 2014.
Wikipedia—Unsharp Mask Technique: https://en.wikipedia.org/wiki/Unsharp_masking. Retrieved May 3, 2016.
Wilburn, Bennett, et al., "High Speed Video Using a Dense Camera Array", 2004.
Wilburn, Bennett, et al., "The Light Field Video Camera", Proceedings of Media Processors 2002.
Winnemoller, H., et al., "Light Waving: Estimating Light Positions From Photographs Alone", Eurographics 2005.
Wippermann, F. "Chirped Refractive Microlens Array," Dissertation 2007.
Wuu, S., et al., "A Manufacturable Back-Side Illumination Technology Using Bulk Si Substrate for Advanced CMOS Image Sensors", 2009 International Image Sensor Workshop, Bergen, Norway.
Wuu, S., et al., "BSI Technology with Bulk Si Wafer", 2009 International Image Sensor Workshop, Bergen, Norway.
Xiao, Z. et al., "Aliasing Detection and Reduction in Plenoptic Imaging," IEEE Conference on Computer Vision and Pattern Recognition; 2014.
Xu, Xin et al., "Robust Automatic Focus Algorithm for Low Contrast Images Using a New Contrast Measure," Sensors 2011; 14 pages.
Zheng, C. et al., "Parallax Photography: Creating 3D Cinematic Effects from Stills", Proceedings of Graphic Interface, 2009.
Zitnick, L. et al., "High-Quality Video View Interpolation Using a Layered Representation," Aug. 2004; ACM Transactions on Graphics (TOG), Proceedings of ACM SIGGRAPH 2004; vol. 23, Issue 3; pp. 600-608.
Zoberbier, M., et al., "Wafer Cameras—Novel Fabrication and Packaging Technologies", 2009 International Image Senor Workshop, Bergen, Norway, 5 pages.

\* cited by examiner

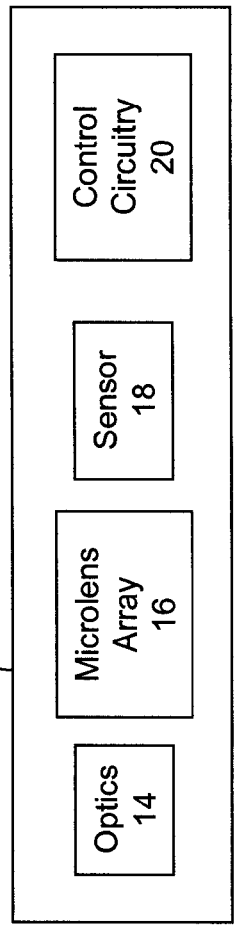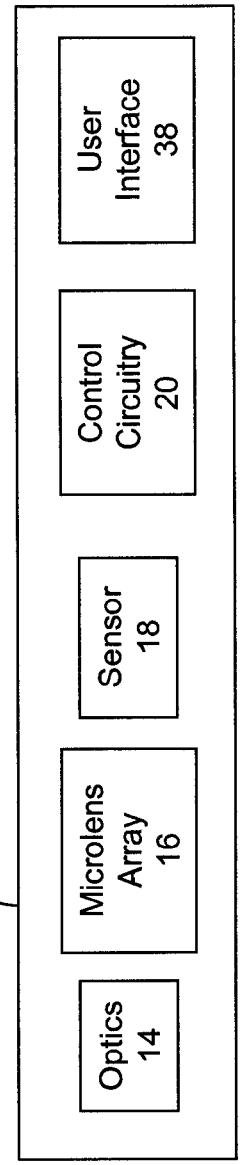

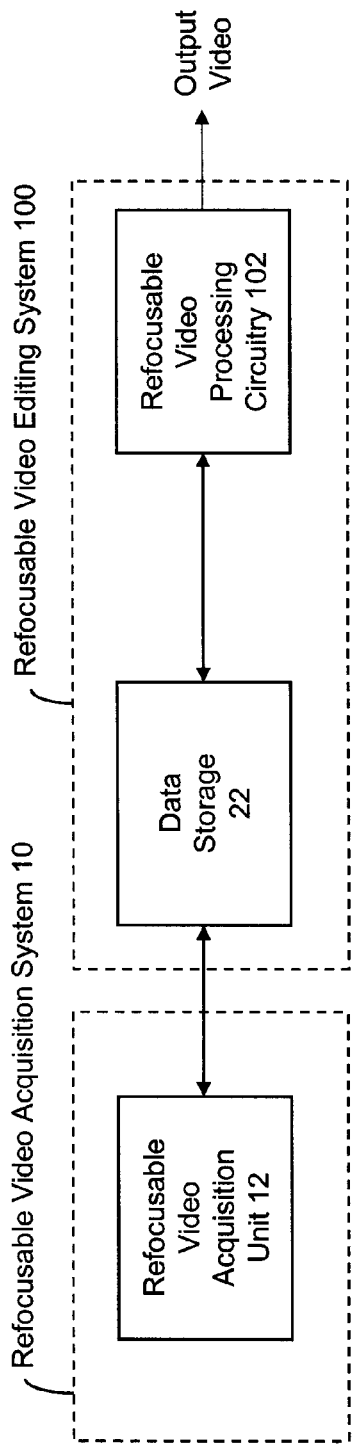
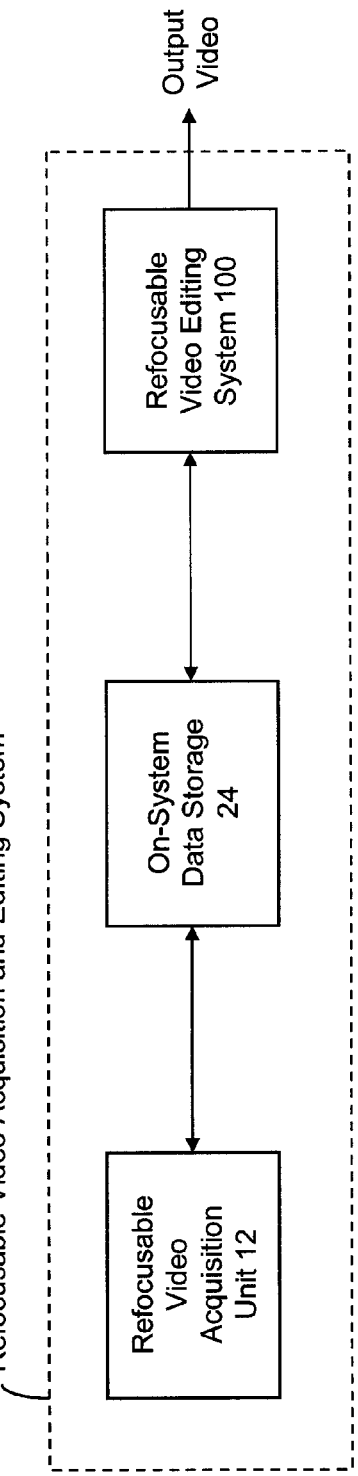
FIGURE 3A
FIGURE 3B

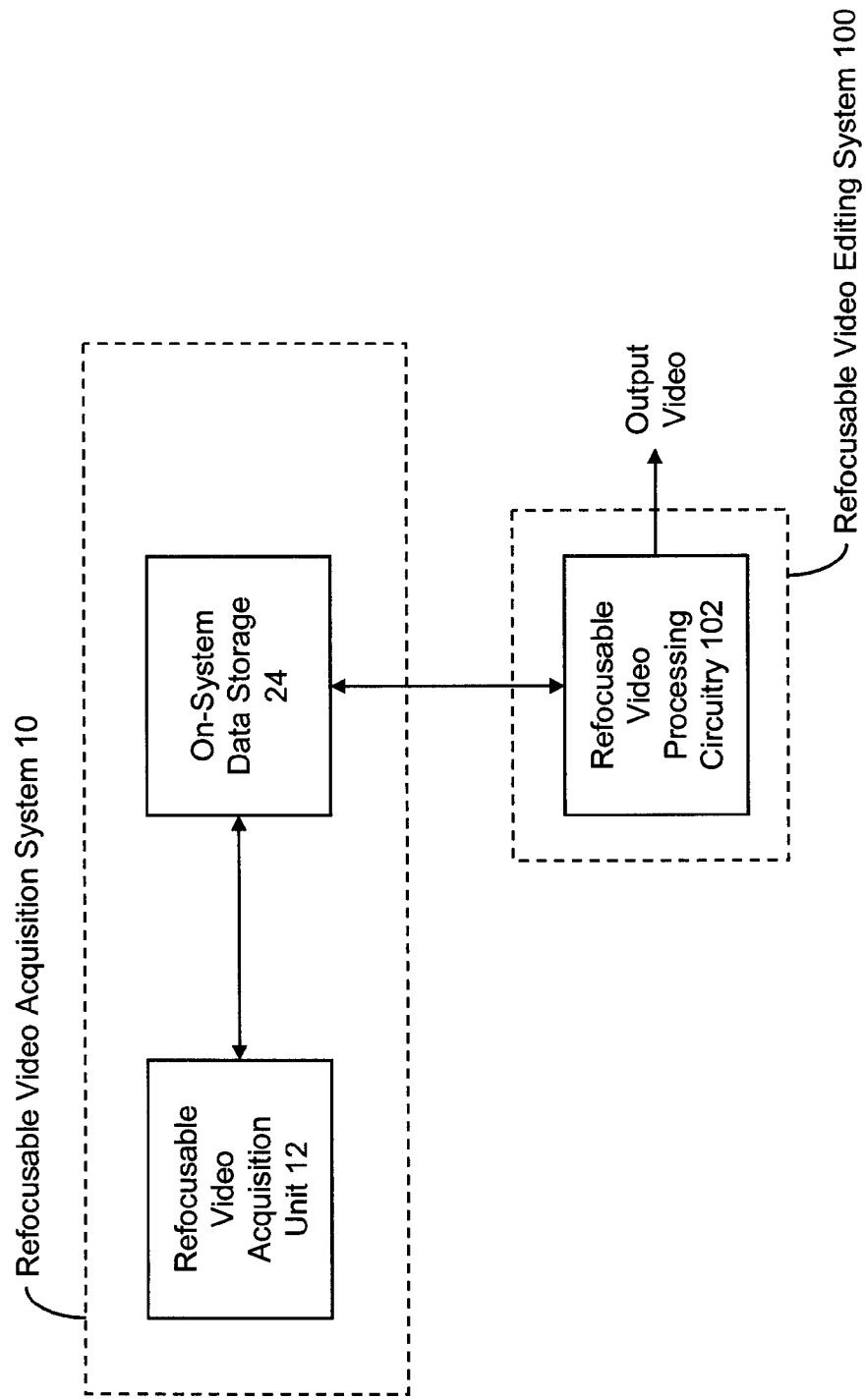

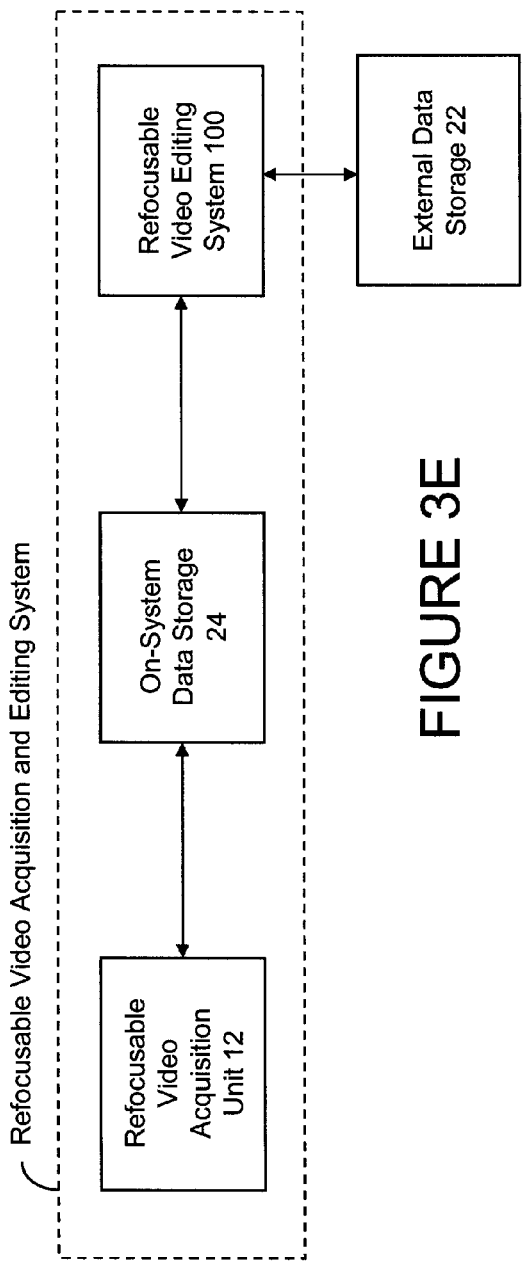
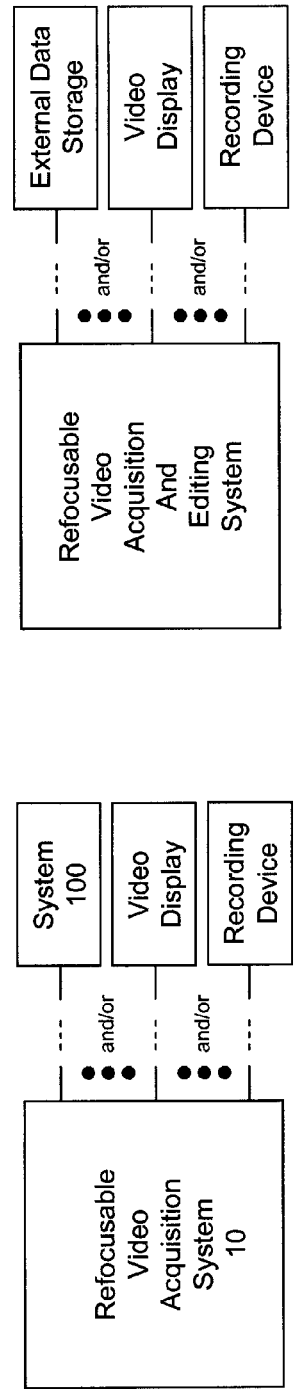
FIGURE 3E
FIGURE 3G
FIGURE 3F

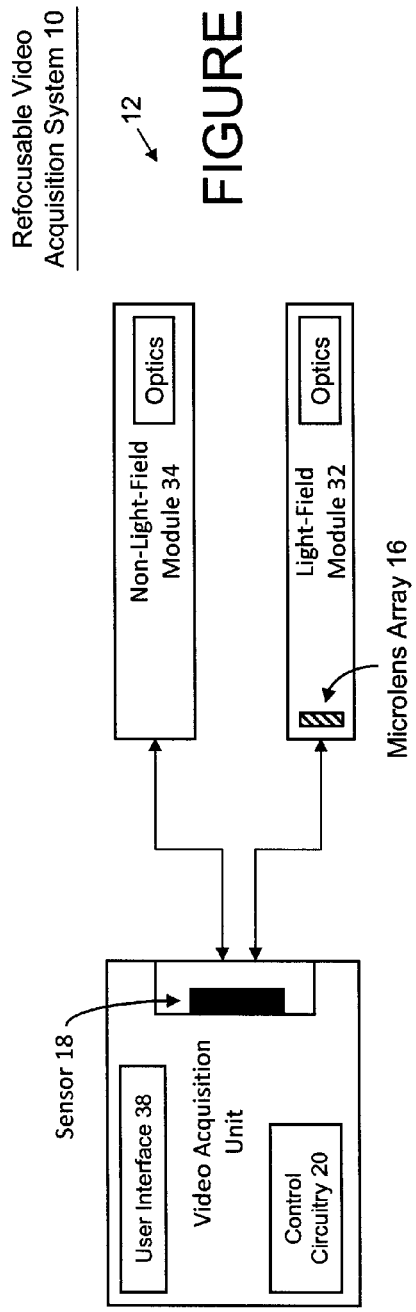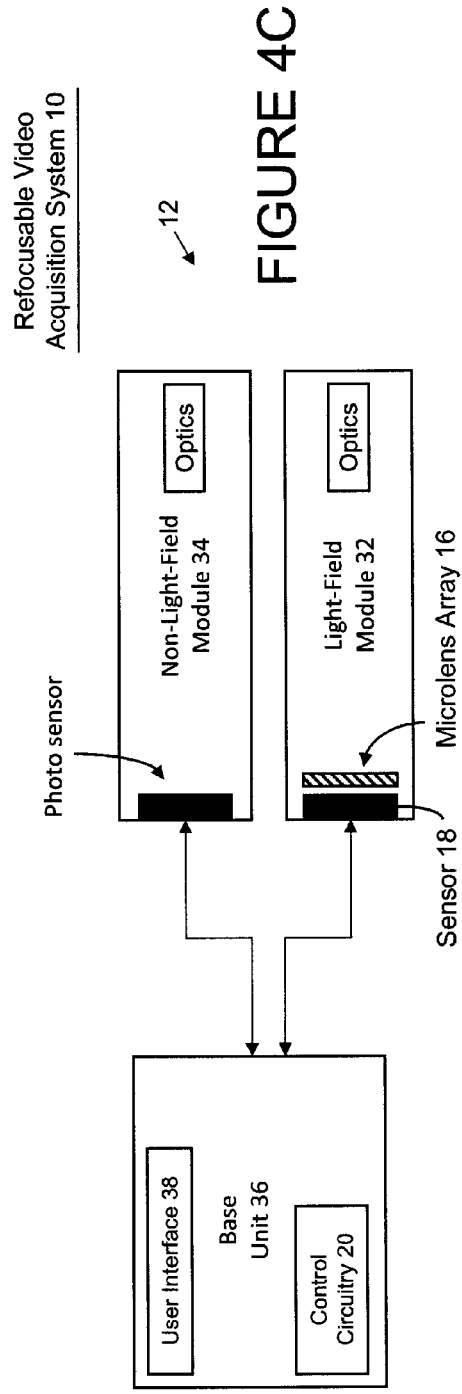

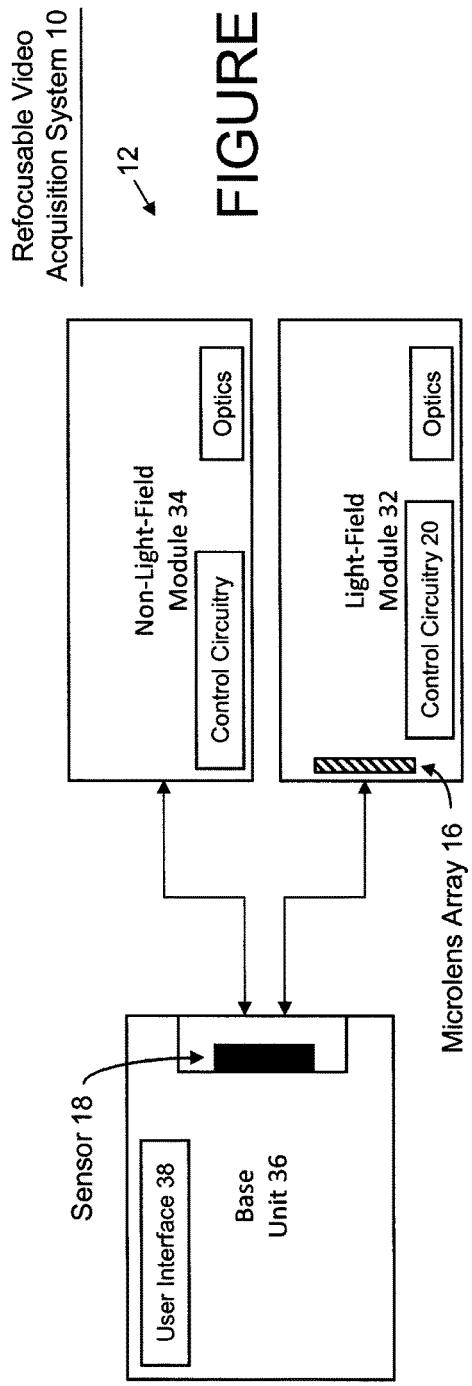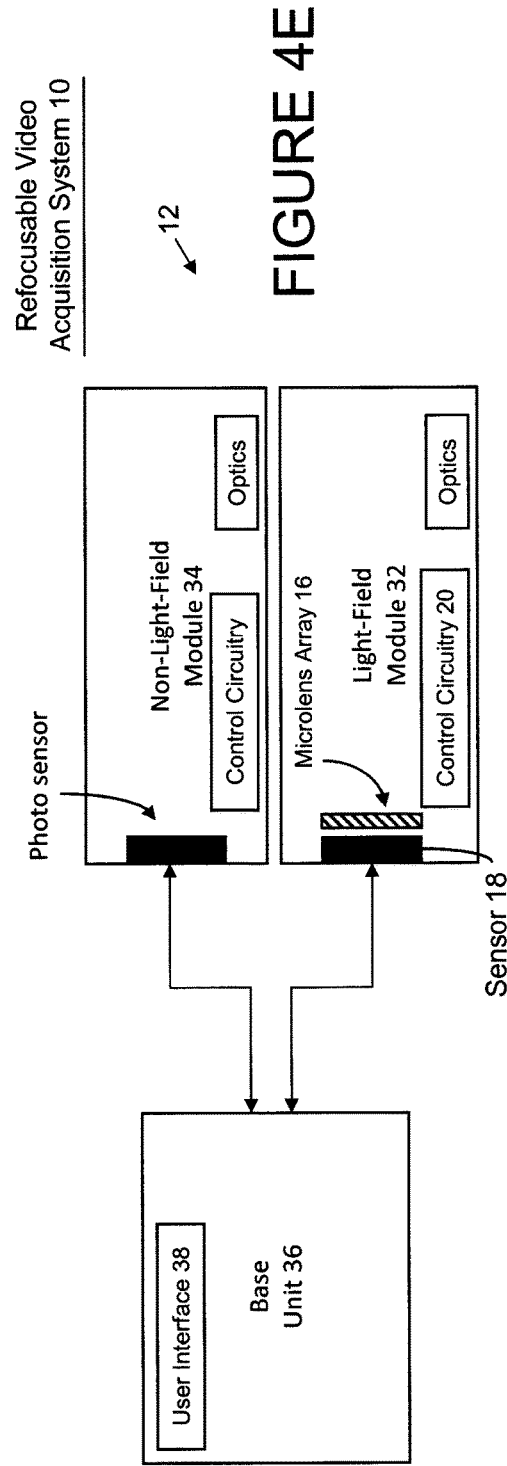

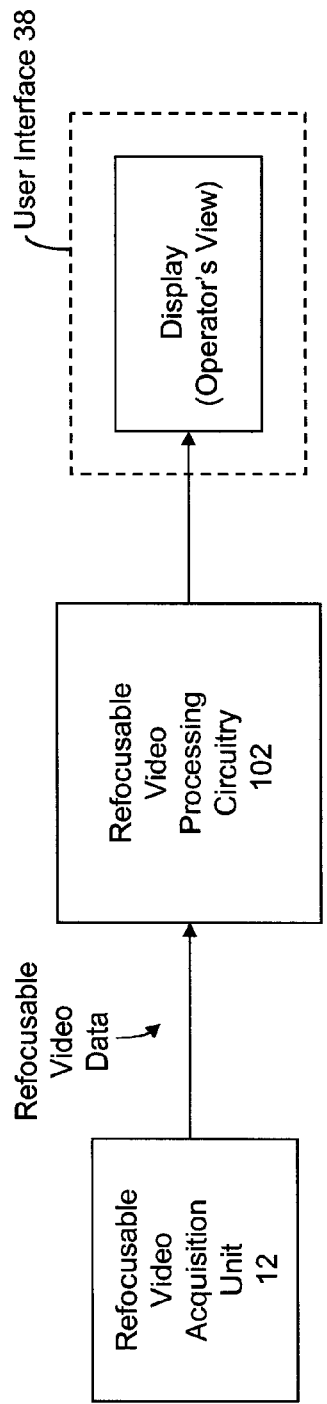
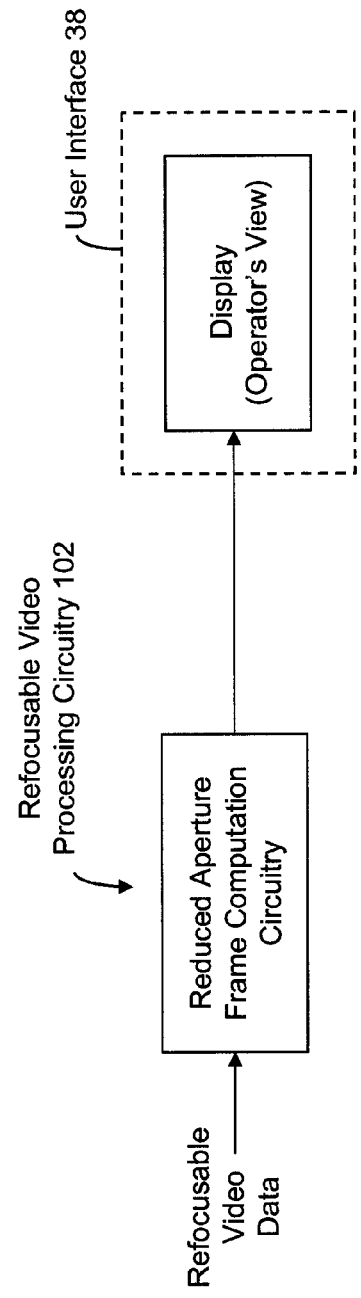
FIGURE 6A
FIGURE 6B

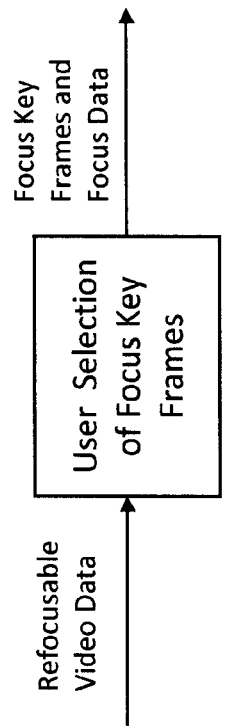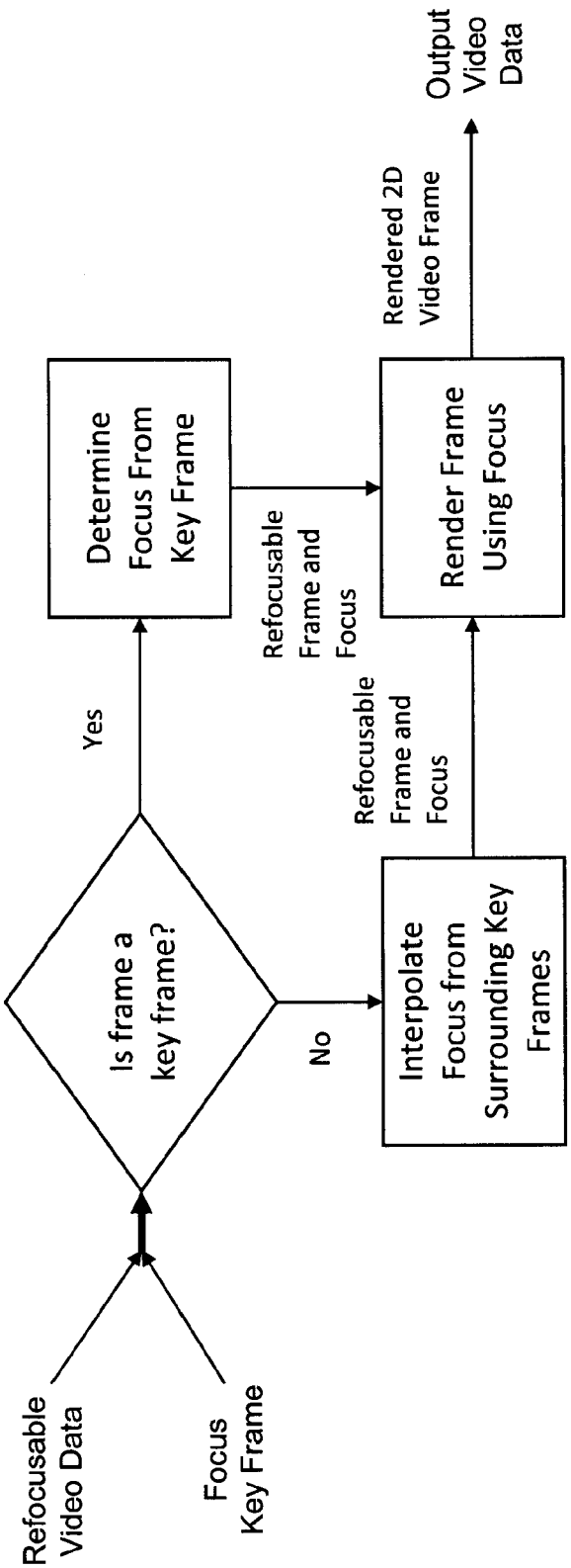
FIGURE 10

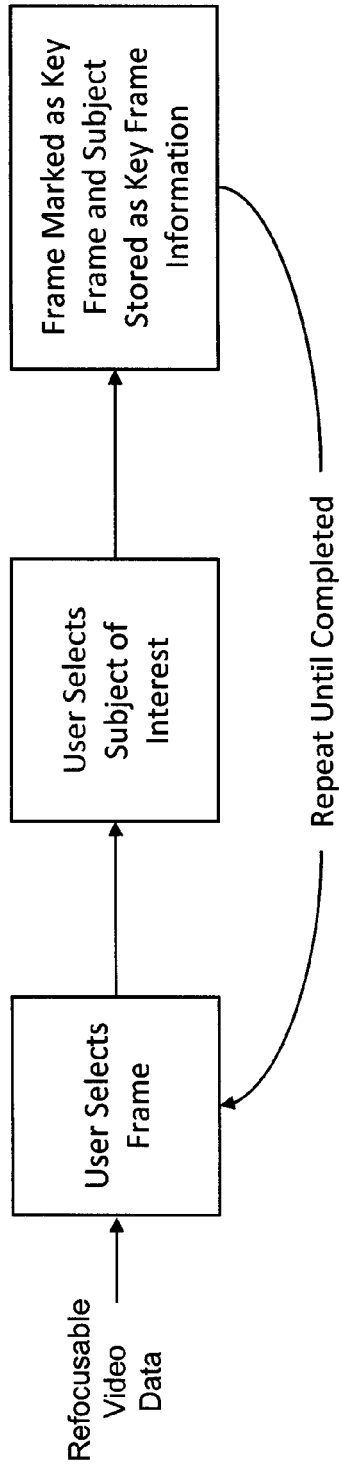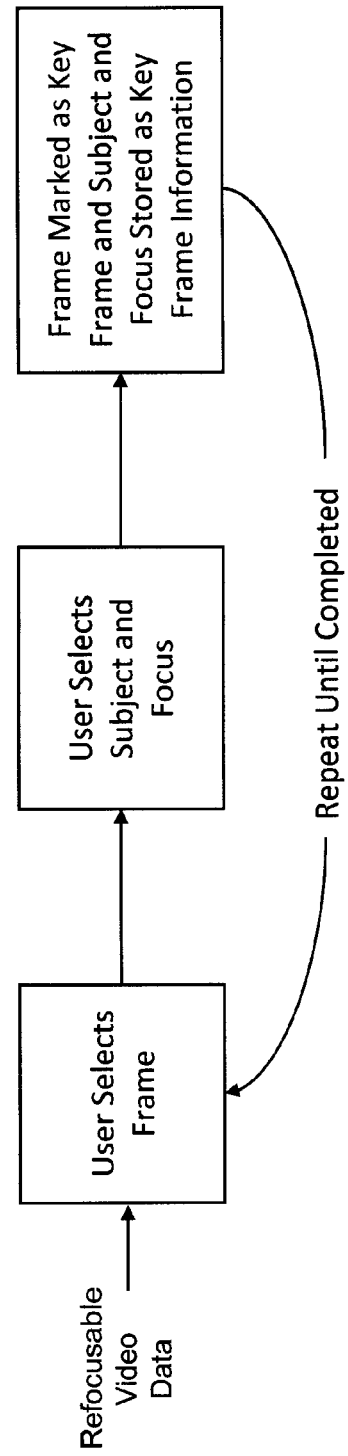

FIGURE 18
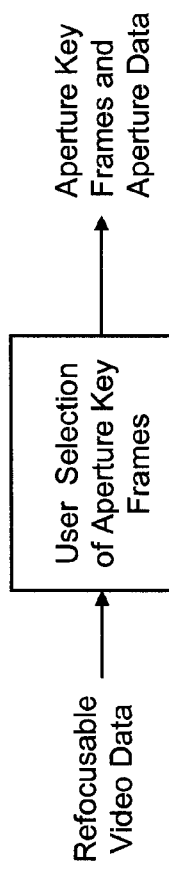
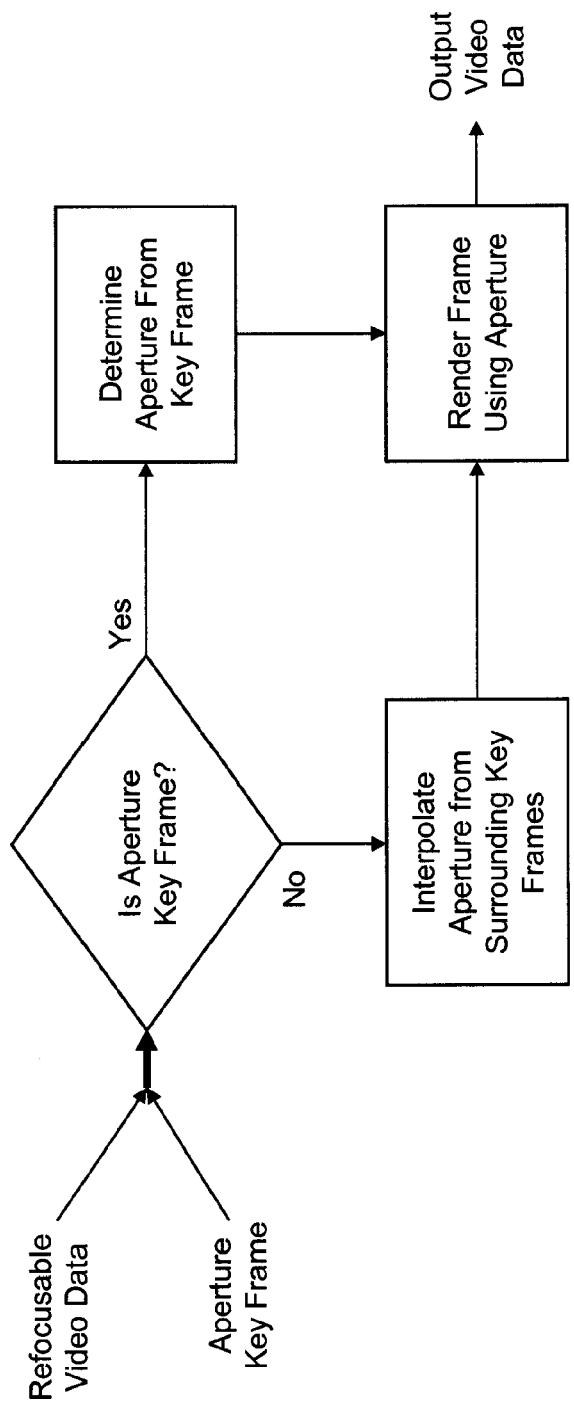

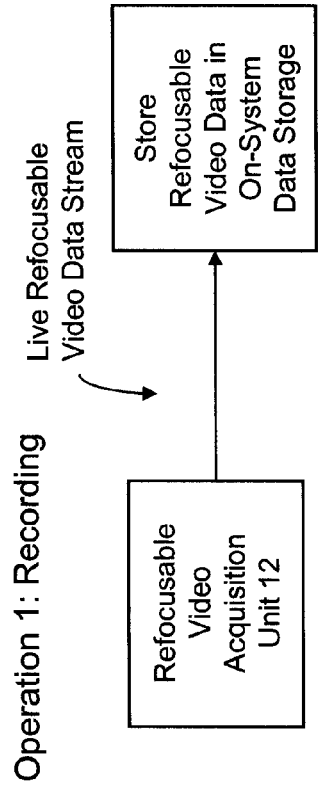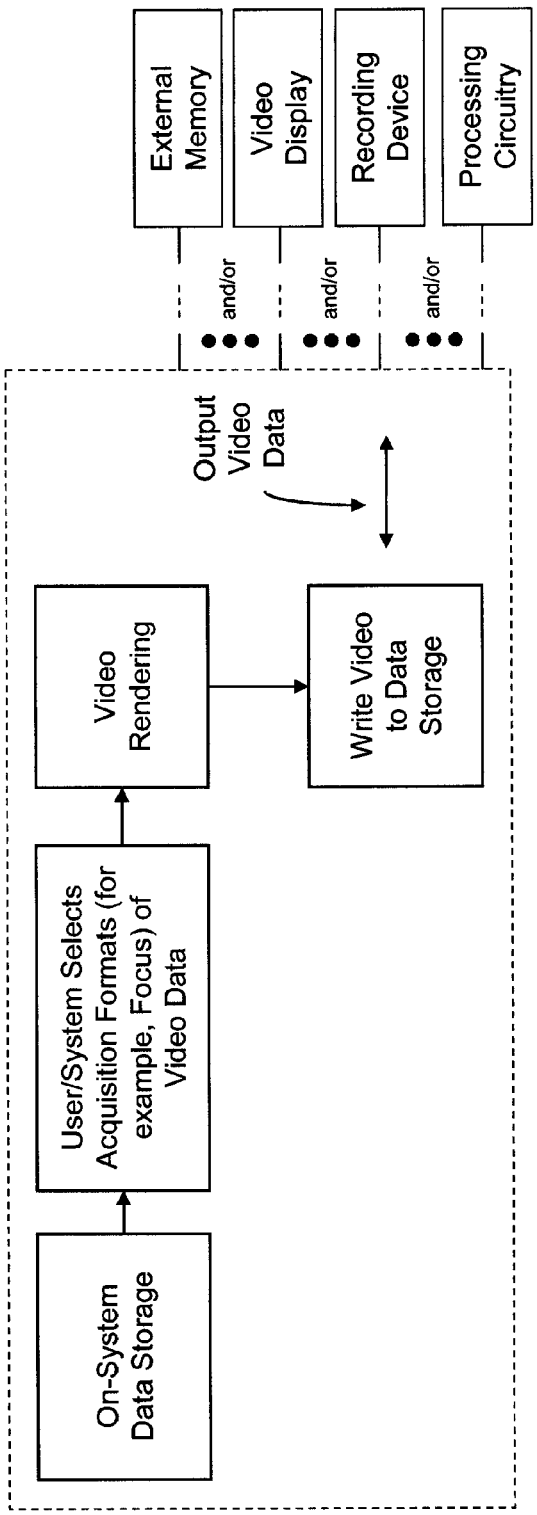
FIGURE 23

VIDEO REFOCUSING

CROSS-REFERENCE TO RELATED APPLICATIONS

This application is a continuation-in-part of U.S. Utility application Ser. No. 14/022,651, entitled "Interactive Refocusing of Electronic Images", filed Sep. 10, 2013, which is a divisional of U.S. Utility application Ser. No. 11/948,901, entitled "Interactive Refocusing of Electronic Images", filed Nov. 30, 2007 and issued as U.S. Pat. No. 8,559,705 on Oct. 15, 2013. U.S. Utility application Ser. No. 11/948,901 claims the benefit of U.S. Provisional Application Ser. No. 60/872,089, entitled "Interactive Refocusing of Electronic Images", filed Dec. 1, 2006.

This application is also a continuation of U.S. Utility application Ser. No. 14/273,349, entitled "Video Refocusing", filed May 8, 2014, which is a continuation of U.S. Utility application Ser. No. 14/032,720, entitled "Video Refocusing", filed Sep. 20, 2013 and issued as U.S. Pat. No. 8,760,566 on Jun. 24, 2014. U.S. Utility application Ser. No. 14/032,720 is a divisional of U.S. Utility application Ser. No. 12/622,655, entitled "System of and Method for Video Refocusing", filed Nov. 20, 2009 and issued as U.S. Pat. No. 8,570,426 on Oct. 29, 2013. U.S. Utility application Ser. No. 12/622,655 claims the benefit of U.S. Provisional Application Ser. No. 61/117,621, entitled "System of and Method for Video Refocusing", filed Nov. 25, 2008; U.S. Provisional Application Ser. No. 61/120,530, entitled "Light Field Camera and System, and Methods of Using and Manufacturing Same", filed Dec. 8, 2008; and U.S. Provisional Application Ser. No. 61/170,620, entitled "Light Field Camera Image, File and Configuration Data, and Method of Using, Storing and Communicating Same", filed Apr. 18, 2009.

The contents of all of these applications are incorporated by reference herein, in their entirety.

INTRODUCTION

In one aspect, the present inventions are directed to, among other things, systems for and methods of acquiring, generating, manipulating and/or editing (for example, focusing or refocusing) refocusable video data, information, images and/or frames. Notably, refocusable video data, information, images and/or frames are video data, information, images and/or frames, no matter how acquired or obtained, that may be focused and/or re-focused after acquisition or recording of the data, information, images and/or frames. For example, in one embodiment, refocusable video data, information, images and/or frames are light field data, information, images and/or frames acquired or obtained, for example, via a light field acquisition system or device.

Briefly, in the context of cinematography, post-production in this application may mean the work and/or effort expended to place one or more frames in a predetermined, desired and/or final form (for example, for viewing) after the acquisition or recording phase. This includes, for example, editing and special effects, of, for example, data which is representative of 2D video. Notably, 2D video is video data which is capable of or designed for viewing on two dimensional viewing devices. 2D video formats include, but are not limited to, a signal suitable for television viewing, film, or video files used for playback on a general purpose computing system.

There are many inventions described and illustrated herein. Some of the present inventions are described, illustrated and/or organized in the context of four basic sections or groups—which may be generally described as: (1) systems and techniques of focusing video based on key frames in post-production, (2) systems and techniques of focusing video based on tracking subjects, (3) an indicator to provide information (for example, to an operator during a "live" shoot) regarding the refocusable range, or the extent thereof, in the video scene; such indicator may allow the operator to determine, assess and/or understand the range of refocusing in the video scene, or the extent of refocusability thereof, before, during or after capture or acquisition of video of a scene, and (4) systems and techniques for automatically focusing video on the acquisition device using, in part, frames acquired temporally after the frame which is being focused. Briefly, setting the focus based on key frames in post-production includes, for example, selecting the focus depth for one or more key or predetermined frames in the video stream—after refocusable video has been captured or acquired with a refocusable video capture device. The focus depth for intermediate frames may be based on or determined using the focus depth of one or more of the key or predetermined frames. For example, the focus depth for intermediate frames may be interpolated from the focus depth of the key or predetermined frames.

The section pertaining to setting the focus based on tracking subjects may include selecting one or more focuses to track a particular or predetermined subject in, for example, a scene and during refocusable video editing. A subject is selected in one subject key frame, and the video editing system will keep that subject in focus during the video until a new focus or subject key frame changes the focus.

Further, the section relating to an indicator used during a live shoot that allows the operator to understand the sharply refocusable range in the scene may be characterized as when acquiring or recording refocusable video, the camera or focus operator/user is shown a live or near live display that indicates the range of subjects that can be brought into sharp focus. The operator/user may be shown a computed view of the scene with a low effective aperture size that results in a depth of field that accurately represents the refocusable range of the video stream. The user or operator may, in response to the indication of the range of subjects that can be brought into sharp focus, change the one or more setting or parameters of the camera or acquisition thereby.

As noted above, one section relates to systems and techniques to focus video data or frames (for example, automatically focus data or frames) on the acquisition device (or thereafter) using video data or frames acquired temporally after the frame(s) which is/are being focused or refocused. In one embodiment, the systems and techniques include storing data which is representative of a plurality of refocusable video frames, and using data of these frames or information derived from the data of these frames, the systems and techniques select one or more depths of focus for one or more video frames that were acquired and/or occurred earlier in time. The device includes a system for storing some refocusable video, systems and techniques for analyzing or reviewing refocusable frames for content, and systems and techniques for storing video (for example, 2D video) using the refocusable frames and selected focus.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed and/or illustrated separately herein.

Notably, although the inventions are often described in the context of a light field capture system or device, which acquire or obtain refocusable video data, information, images and/or frames, and/or processes or methods of acquiring, generating, manipulating and/or editing such refocusable video data, information, images and/or frames, it should be clear that the inventions are applicable to other systems, devices, processes and/or methods of acquiring, generating, manipulating and/or editing refocusable video data. The refocusable video data acquisition system may be systems/devices aimed at cinema professionals, including complete focus control after the video is captured, and/or systems/devices directed to non-professionals including, for example, such devices as digital SLR camera for high-end consumers or consumer video acquisition systems that perform automatic or semi-automatic focus adjustment controls and circuitry during the acquisition of the video.

For example, the present inventions may be implemented in conjunction with light field data acquisition devices (for example, cameras) and/or systems to generate, manipulate and/or edit Light Field Data (for example, adjust, select, define and/or redefine the focus and/or depth of field—after initial acquisition, capture and/or recording of the Light Field Data and/or information) of, for example, a scene. (See, for example, United States Patent Application Publication 2007/0252074, and the provisional applications to which it claims priority (namely, Ser. Nos. 60/615,179 and 60/647,492), and Ren Ng's PhD dissertation, "Digital Light Field Photography", Stanford University 2006, all of which are incorporated herein their entirety by reference; see also, the block diagram illustrations of exemplary light field acquisition devices in FIGS. 1A, 1B and 1D). Indeed, such light field data acquisition devices may be implemented in conjunction with post-processing circuitry which is disposed in/on the acquisition device (see FIGS. 1C and 1F) or external thereto (see FIGS. 1C and 1F).

Notably, the term "Light Field Data" means data representing the lighting in a scene including, for example, a set of values, where each value represents the light traveling along each geometric light ray (or bundle of rays approximating a geometric light ray) within a corresponding set of light rays. In a specific exemplary embodiment, Light Field Data represents the 2D image data read from the image sensor pixel array in a light field acquisition device (for example, a light field camera comprising a main lens, microlens array and a photo sensor as illustrated in FIGS. 1A-1F; see also, light field cameras illustrated in United States Patent Application Publication 2007/0252074, and/or the provisional application to which it claims priority, and/or Ren Ng's PhD dissertation, "Digital Light Field Photography", Stanford University 2006). In another exemplary embodiment, Light Field Data means a function $L(x,y,u,v)$ where L is the amount of light (e.g. radiance) traveling along a ray $(x,y,u,v)$ that passes through the optical aperture of the camera lens at 2D position $(u,v)$ and the sensor at 2D position $(x,y)$. In another exemplary embodiment, Light Field Data may mean the image data collected with a coded aperture system (See FIG. 1H). In yet another exemplary embodiment, Light Field Data may mean data encoded and/or recorded in the frequency spectrum of the light field. In yet another exemplary embodiment, Light Field Data may mean a collection of images focused at different depths. In yet another exemplary embodiment, Light Field Data may mean a collection of images from different viewpoints (See FIG. 1G). In yet another exemplary embodiment, Light Field Data may mean a collection of images focused at a different set of depths in a scene. Notably, the foregoing are intended only as examples of Light Field Data, and Light Field Data may in certain embodiments include any collection of images or lighting data that may be used to generate, derive, calculate, estimate and/or determine a full or partial representation or approximation of a light field function $L(x,y,u,v)$ as described above.

Further, the term "circuit" may mean, among other things, a single component (for example, electrical/electronic) or a multiplicity of components (whether in integrated circuit form, discrete form or otherwise), which are active and/or passive, and which are coupled together to provide or perform a desired function. The term "circuitry" may mean, among other things, a circuit (whether integrated, discrete or otherwise), a group of such circuits, one or more processors, one or more state machines, one or more processors implementing software, or a combination of one or more circuits (whether integrated, discrete or otherwise), one or more state machines, one or more processors, and/or one or more processors implementing software. Moreover, the term "optics" means one or more components and/or a system comprising a plurality of components used to affect the propagation of light, including but not limited to lens elements, windows, microlens arrays, apertures and mirrors.

SUMMARY OF CERTAIN ASPECTS OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principal aspect, certain of the present inventions are directed to a method of (i) operating a video acquisition device which acquires refocusable light field video data and/or (ii) generating video data of a scene using a video acquisition device which acquires refocusable light field video data. The method comprises: (a) acquiring first refocusable light field video data of a scene, (b) storing first refocusable video data which is representative of the first refocusable light field video data (for example, storing three or more seconds of first refocusable light field video data), (c) acquiring second refocusable light field video data of the scene after acquiring the first refocusable light field video data, (d) determining a first virtual focus parameter using the second refocusable light field video data, and (e) generating first video data using the stored first refocusable video data and the first virtual focus parameter, wherein the first video data includes a focus depth that is different from an optical focus depth of the first refocusable light field video data. The method may also include outputting the first video data (for example, to memory (whether integrated or discrete and/or internal or external memory), a video display, recording device and/or processing circuitry).

The generation of the first video data may occur substantially concurrently with acquiring the second refocusable light field video data. Further, storing first refocusable video data may include buffering up to a predetermined amount of first refocusable video data and/or storing or buffering up to a predetermined amount of most recently acquired first refocusable video data.

Notably, the first virtual focus parameter may include information which is representative of at least one focus depth which is different from the optical focus depth of the first refocusable light field video data. In one embodiment, the first virtual focus parameter includes information which is representative of maintaining a predetermined focus depth of an area of the scene. In another embodiment, the first virtual focus parameter includes information which is representative of focus tracking. Indeed, the focus tracking may include (i) identifying one or more subjects of interest in the scene and (ii) generating the first video data having a predetermined virtual focus depth relative to the one or more subjects wherein the predetermined virtual focus depth is different from the optical focus depth of the first refocusable light field video data.

In one embodiment, storing first refocusable video data includes storing an amount of first refocusable video data which corresponds to less than ten seconds of first refocusable light field video data, and wherein the less than ten seconds of first refocusable light field video data corresponds to the ten seconds of first refocusable light field video data acquired substantially immediately before determining the first virtual focus parameter.

The optical focus depth of the first refocusable light field video data may vary during acquisition thereof by the video acquisition device. Where the optical focus depth of the first refocusable light field video data varies during acquisition, the method may further include (a) configuring the video acquisition device to include a varying optical focus depth of the video acquisition device, wherein the varying optical focus depth of the video acquisition device allows generating the first video data having a predetermined focus depth relative to the one or more subjects, and (b) generating the first video data having the predetermined focus depth relative to the one or more subjects wherein the varying optical focus depth is different from the predetermined focus depth relative to the one or more subjects. Notably, the optical focus depth of the first refocusable light field video data may also be fixed during acquisition thereof.

The method of this aspect of the inventions may also include receiving a user input which is indicative of a subject or location in the scene (for example, after acquiring the first refocusable light field video data), wherein determining the first virtual focus parameter includes using the focus depth of the subject or location in the scene and the second refocusable light field video data. In one embodiment, the user input is indicative of a selected focus depth and, wherein determining the first virtual focus parameter includes using the selected focus depth and the second refocusable light field video data.

The method of this aspect of the inventions may further include (a) storing second refocusable video data which is representative of the second refocusable light field video data, (b) acquiring third refocusable light field video data of the scene after acquiring the second refocusable light field video data, (c) determining a second virtual focus parameter using at least a portion of the first, second and/or third refocusable light field video data, and (d) generating second video data using the second refocusable video data and the second virtual focus parameter, wherein the second video data includes a focus depth that is different from the optical focus depth of the second refocusable light field video data of the scene. The method may also include outputting the second video data, wherein the first and second video data are temporally contiguous.

Notably, in one embodiment, the first and second virtual focus parameters each include information which is representative of focus tracking, wherein the focus tracking includes: (i) identifying one or more subjects of interest in the scene, (ii) generating the first video data having a predetermined focus depth relative to the one or more subjects, and (iii) adjusting the focus depth of the second video data to maintain the predetermined focus relative to the one or more subjects for a predetermined period of time.

In a second principal aspect, certain of the present inventions are directed to a light field video acquisition device which acquires refocusable light field video data, the light field video acquisition device comprises optics, photosensor array to acquire first light field video data and second light field video data after acquisition of the first light field video data, and a microlens array, disposed between the optics and the photosensor array, the light rays being directed onto the photosensor array via the optics and the microlens array. The light field video acquisition device of this aspect of the inventions also includes first memory to store up to a predetermined amount of: (i) first refocusable video data which is representative of the first light field video data, (ii) second refocusable video data which is representative of the second light field video data, (iii) first summary data derived from the first light field video data, and (iv) second summary data derived from the second light field video data wherein the second summary data is derived after acquisition of the first light field video data. A second memory is provided to store video data.

The light field video acquisition device of this aspect of the inventions also includes processing circuitry, coupled to the first memory and the second memory, to determine a first virtual focus parameter (which may include information which is representative of focus tracking) using the second summary data, generate first video data using the first refocusable video data and the first virtual focus parameter, wherein the first video data includes a focus depth that is different from the optical focus depth of the acquired first light field video data, and output the first video data to the second memory.

The light field video acquisition device may include an interface, coupled to the processing circuitry, to receive input focus data, wherein the processing circuitry determines the first virtual focus parameter using the second summary data and the input focus data. The interface may be a user interface which is configured to receive a user input which is representative of the input focus data.

In another principal aspect, certain of the present inventions are directed to a method of (i) operating a video acquisition device which acquires refocusable light field video data and/or (ii) generating video data of a scene using a video acquisition device which acquires refocusable light field video data. The method comprises: (a) acquiring a series of temporally contiguous refocusable light field video data frames, wherein each refocusable light field video data frame includes an optical focus depth, (b) buffering a plurality of refocusable video data frames for up to a predetermined amount of time (for example, three or more seconds and/or less than ten seconds), wherein each refocusable video data frame corresponds to an associated refocusable light field data frame, (c) selecting a first refocusable video data frame from the plurality of buffered refocusable video data frames, (d) determining a first virtual focus parameter (which may include information which is representative of at least one focus depth) for the selected first refocusable video data frame using data which is derived from one or more refocusable video data frames which are associated with refocusable light field video data frames that are temporally acquired after acquiring the refocusable light field video data frame which is associated with the selected first refocusable video data frame, and (e) generating a first video data frame for the selected first refocusable video data frame using (i) data which is representative of the selected first refocusable video data frame and (ii) the first virtual focus parameter, wherein the first video data frame includes a focus depth that is different from the optical focus depth of the refocusable light field video data frame which is associated with the selected first refocusable video data frame. The method may also include outputting the first video data frame (for example, to memory (whether integrated or discrete and/or internal or external memory), a video display, recording device and/or processing circuitry).

In one embodiment, the method according to this aspect of the present inventions may further include: (a) deleting a buffered refocusable video data frame, (b) acquiring an additional refocusable light field video data frame, (c) buffering an additional refocusable video data frame, wherein the additional refocusable video data frame corresponds to the additional refocusable light field video data frame, (d) selecting a second refocusable video data frame from a plurality of the buffered refocusable video data frames, (e) determining a second virtual focus parameter for the second refocusable video data frame using data which is derived from one or more refocusable video data frames which are associated with refocusable light field video data frames that are temporally acquired after acquiring the refocusable light field video data frame which is associated with the selected second refocusable video data frame, and (f) generating a second video data frame for the selected second refocusable video data frame using (i) data which is representative of the selected second refocusable video data frame and (ii) the second virtual focus parameter, wherein the second video data frame includes a focus depth that is different from the optical focus depth of the additional refocusable light field video data frame which is associated with the selected first refocusable video data frame. Again, the method of this embodiment may also include outputting the second video data frame (for example, to memory (whether integrated or discrete and/or internal or external memory), a video display, recording device and/or processing circuitry).

In one embodiment, the selected first refocusable video data frame is the earliest acquired refocusable video data frame relative to the plurality of buffered refocusable video data frames.

In one embodiment, the first virtual focus parameter includes information which is representative of focus tracking. For example, the focus tracking may include: (i) identifying one or more subjects of interest in the scene; and (ii) generating a video data frame having a predetermined focus depth relative to the one or more subjects. In another embodiment, the first virtual focus parameter includes information which defines a predetermined focus relative to the one or more subjects for a predetermined period of time.

Again, there are many inventions, and aspects of the inventions, described and illustrated herein. This Summary is not exhaustive of the scope of the present inventions. Indeed, this Summary may not be reflective of or correlate to the inventions protected by the claims in this or in continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed and/or illustrated separately herein.

FIGS. 2A and 2B are block diagram representations of exemplary refocusable video acquisition units according to at least certain aspects of certain embodiments of the present inventions;

FIGS. 3A, 3C, 3D and 3F are block diagram representations of exemplary refocusable video acquisition systems having standalone refocusable video acquisition units (which may include on-system data storage) according to at least certain aspects of certain embodiments of the present inventions; with these embodiments, the refocusable video acquisition system is not integrated the refocusable video editing systems, but may couple to such systems as well as other external systems/devices (for example, external data storage, video display, recording device and/or data processing system);

FIGS. 3B, 3E and 3G are block diagram representations of exemplary refocusable video acquisition and editing systems having refocusable video acquisition systems integrated with the refocusable video editing systems, according to at least certain aspects of certain embodiments of the present inventions; notably, the refocusable video acquisition and editing systems, in certain embodiments, couple to external systems/devices (for example, external storage, video display, recording device and/or data storage);

FIGS. 4B-4E are block diagram representations of exemplary refocusable video acquisition system according to at least certain aspects of certain embodiments of the present inventions wherein the refocusable video acquisition system of these exemplary embodiments include replaceable, substitutable and/or interchangeable modules wherein at least one of the modules facilitates acquisition of refocusable video data, for example, light field video data; notably, the light field module may include a microlens array, photo sensor, control circuitry and/or optics; moreover, the modules may be mechanically, electrically and/or optically coupled to the base unit;

FIG. 6A is a block diagram representation of an exemplary system including a refocusable video acquisition unit, refocusable video processing circuitry and an exemplary user interface including an output device/mechanism (a display in this exemplary embodiment), according to at least certain aspects of certain embodiments of the present inventions, wherein using the ("live") video data acquired by the refocusable video acquisition unit, the refocusable video processing circuitry may generate, determine, calculate and/or provide information which is representative of those (i) ranges within the scene that may be focused or re-focused at one or more predetermined or given focal plane(s) and/or depths of field of refocusable video acquisition system and/or (ii) subjects within the scene that may be within a predetermined or given focus (after post-processing and based on a particular, given or predetermined set of parameters of the refocusable video acquisition unit); the refocusable video processing circuitry may provide such information to the user interface (which may include a display or speaker) thereby providing a guidance to the operator regarding the extent to which a processing system (for example, refocusable video processing system of the present inventions) is able to compute, provide and/or generate one or more images having a particular or given focus of the subject(s) at one or more different depths in the acquired footage;

FIG. 6B is a block diagram representation of an exemplary system including a refocusable video acquisition unit, refocusable video processing circuitry and an exemplary user interface including an output device/mechanism (a display in this exemplary embodiment), according to at least certain aspects of certain embodiments of the present inventions, wherein using the current ("live") video data acquired by the refocusable video acquisition unit having an adjusted aperture, for example, a small or reduced aperture relative to typical data acquisition, the refocusable video processing circuitry may generate, determine, calculate and/or provide information regarding a subject, object and/or range at which the refocusable video processing circuitry may refocus the video (for example, a maximum range where sharp focus can be computed—after post-processing by the refocusable video processing circuitry);

FIG. 10 illustrates a flow for the user or operator to select or designate a virtual focus parameter of one or more predetermined or key frames wherein such virtual focus parameter may be employed by the refocusable video editing system to generate and output video data having such focus depth; in one embodiment, when rendering or generating output video data, the virtual focus parameter may be defined or determined using key frames and interpolation between such key frames. The interpolation may be nearest neighbor interpolation, linear interpolation, non-linear interpolation, cubic interpolation, Bezier curve interpolation, and/or spline-based interpolation; indeed, the refocusable video editing system may employ any interpolation technique(s) now known or later developed.

FIGS. 14A and 14B illustrate exemplary embodiments of "Focus Subject Tracking" according to at least certain aspects of certain embodiments of the present inventions, wherein in response to user or operator inputs, the refocusable video editing system may adjust, control and/or manage focus on one or more subjects and adjust and track the virtual focus parameter based thereon; notably, the virtual focus parameter of the designated frames may be user defined such that the system provides a focus depth of the designated subject(s) for a predetermined set of frames wherein such subject(s) is/are always in user predetermined or defined focus (for example, the designated subject(s) in the refocusable video data is/are located in the focus plane);

FIG. 18 illustrates an exemplary embodiment of the flow of the aperture size and/or shape adjustment and/or modification of the refocusable video data (acquired by refocusable video acquisition system), according to at least certain aspects of certain embodiments of the present inventions; in these embodiments, the refocusable video editing system may modify and/or change the aperture size and/or shape parameters for video data associated with one or more frames of refocusable video data (acquired by refocusable video acquisition system 10) in accordance with such parameter(s); in the exemplary embodiment, refocusable video editing system, based on the aperture size and/or aperture shape parameter(s) of the key or predetermined frames, may interpolate between the key or predetermined frames to determine the aperture size for all times in the video;

FIG. 23 illustrates an a block diagram representation of an exemplary refocusable video acquisition and editing system having on-system buffer and edit architecture, according to at least certain aspects of certain embodiments of the present inventions, in which the system includes on-system data storage, systems and techniques to determine video rendering parameters (for example, focus), systems and techniques for rendering video, and systems for saving and/or displaying rendered video (for example, to external storage, to a video display, to a recording device, and/or to processing circuitry);

Figure 1A:
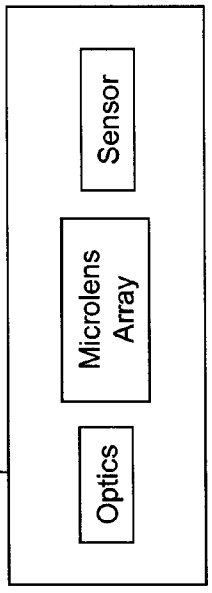
FIG. 1A is a block diagram representation of an exemplary light field data acquisition device.
Figure 1B:
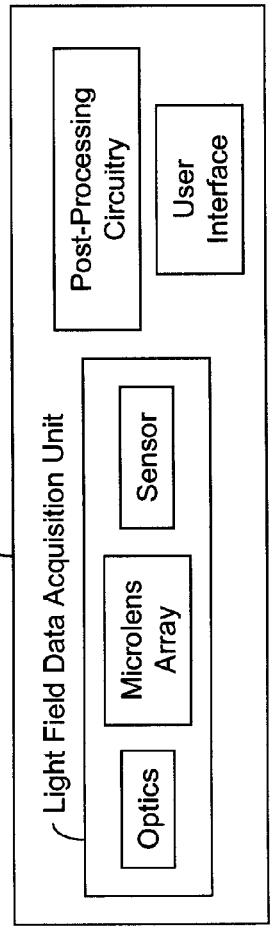
FIG. 1B is a block diagram representation of an exemplary light field data acquisition device including, among other things, post-processing circuitry integrated therein.
Figure 1C:
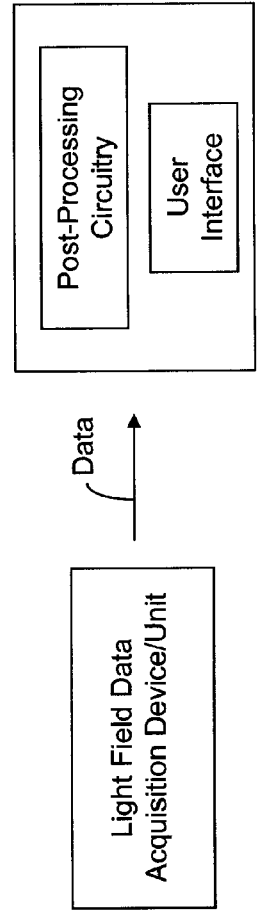
FIGS. 1C and 1F are block diagram representations of exemplary light field data acquisition systems including a light field data acquisition device and post-processing circuitry.
Figure 1D:
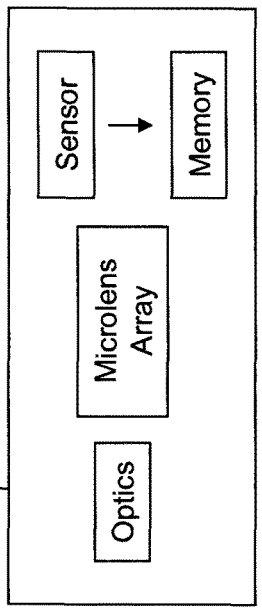
FIG. 1D is a block diagram representation of an exemplary light field data acquisition device including memory (integrated therein) to store Light Field Data.
Figure 1E:
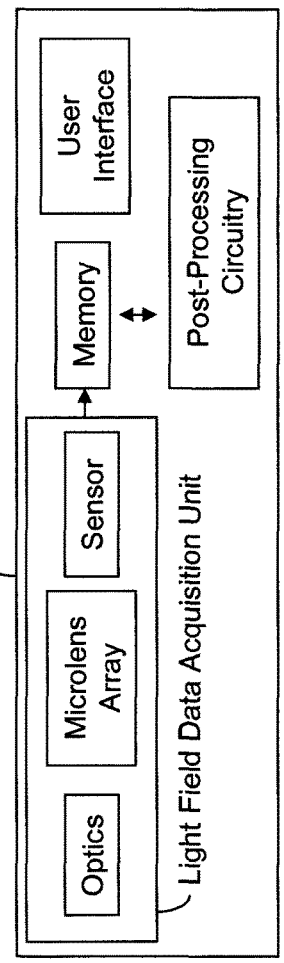
FIG. 1E is a block diagram representation of an exemplary light field data acquisition device including, among other things, post-processing circuitry and memory integrated therein.
Figure 1F:
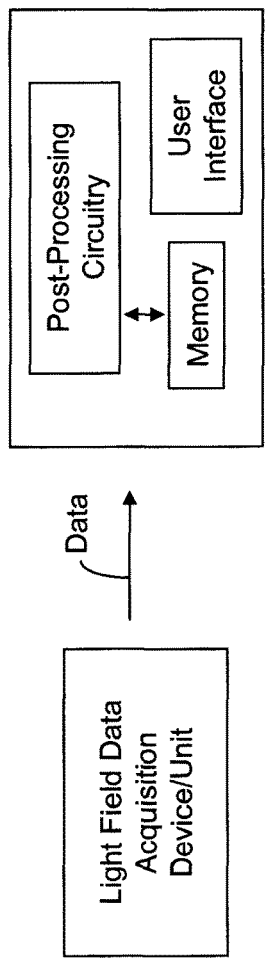
Figure 1G:
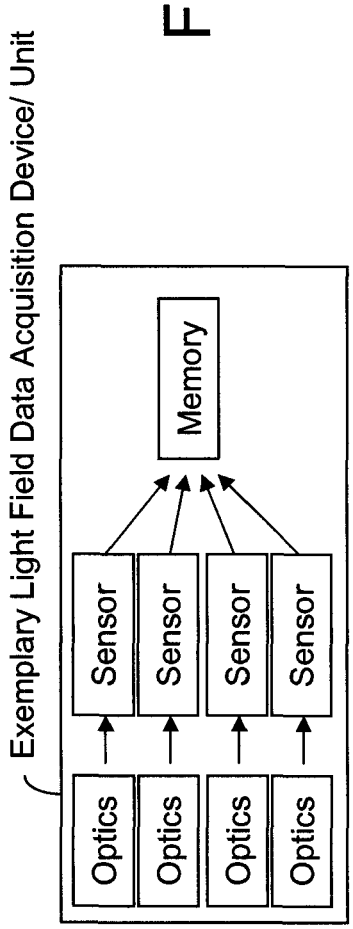
FIG. 1G is a block diagram representation of an exemplary light field data acquisition device including a plurality of optics and sensors to record, acquire, sample and/or capture light field data, including memory integrated therein.
Figure 1H:
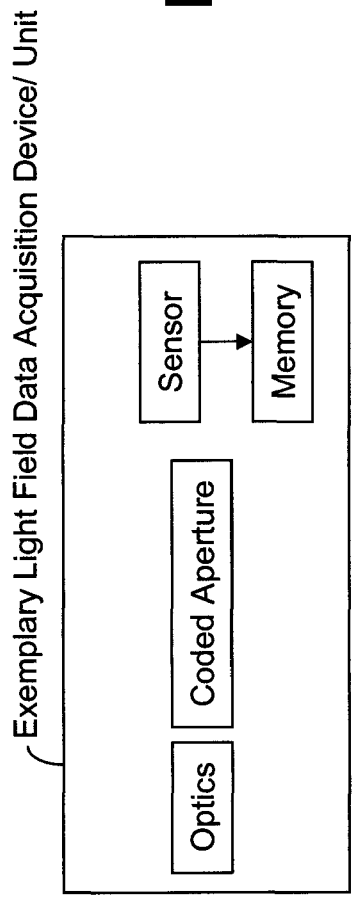
FIG. 1H is a block diagram of an exemplary light field data acquisition device including optics, a coded aperture, and sensor to record, acquire, sample and/or capture light field data, including memory integrated therein.
Figure 2C:
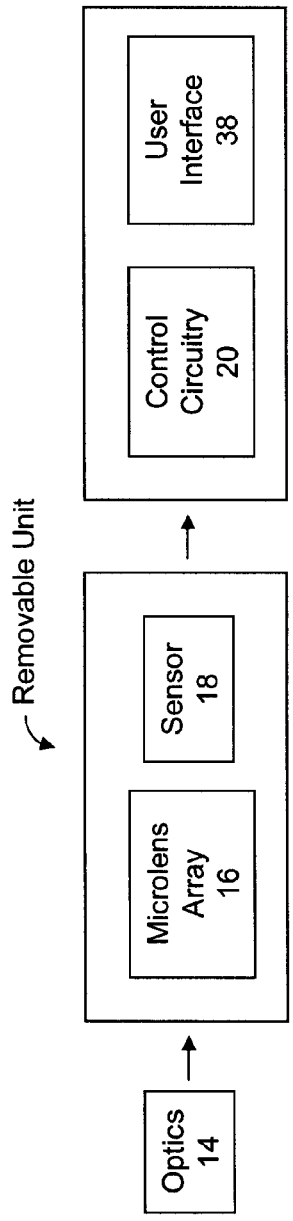
FIGS. 2C and 2E are block diagram representations of exemplary refocusable video acquisition units having removable components, including removable optics and light field or imaging recording units, according to at least certain aspects of certain embodiments of the present inventions, wherein in these embodiments, the acquisition unit includes a microlens array in the optical path; notably, in these exemplary embodiments the refocusable video acquisition unit may record, acquire, sample and/or capture light field or other (for example, 2D) video data.
Figure 2D:
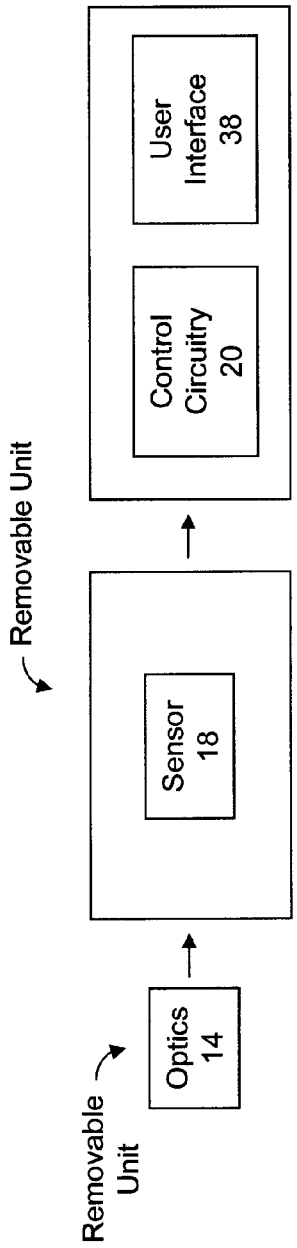
FIGS. 2D and 2F are block diagram representations of exemplary refocusable video acquisition unit having removable components, including removable optics and microlens array, according to at least certain aspects of certain embodiments of the present inventions, wherein in these embodiments, the acquisition unit does not include a microlens array in the optical path; notably, in this exemplary embodiment the video acquisition unit may record, acquire, sample and/or capture standard or conventional video data.
Figure 2E:
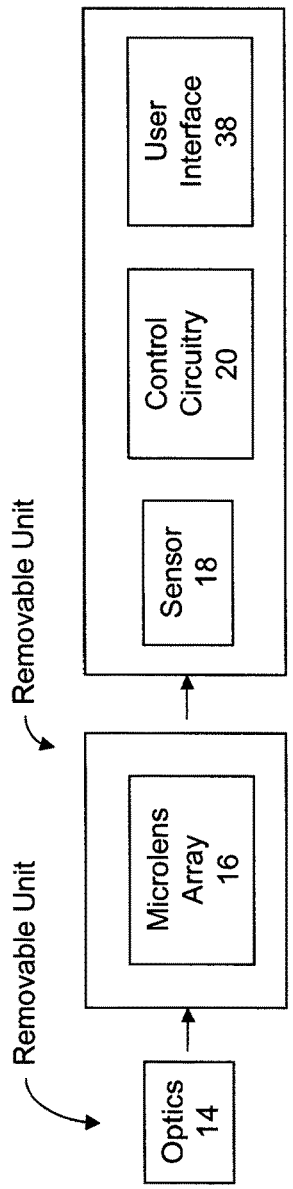
Figure 2F:
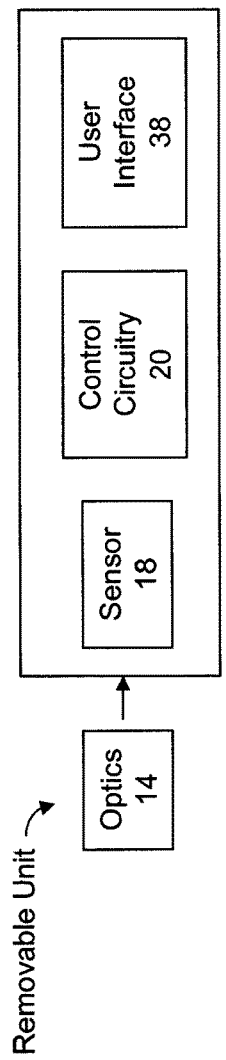

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to refocusable video acquisition devices/systems (hereinafter "device/system" and "devices/systems" are collectively "system" and "systems", respectively) having refocusable video acquisition units that acquire, sample, capture, record and/or obtain refocusable video data (for example, video light field data). In another aspect, the present inventions are directed to refocusable video editing systems having video processing circuitry that generates, manipulates and/or edits refocusable video data (for example, light field data) which may be acquired, sampled, recorded and/or obtained via refocusable video acquisition systems.

The refocusable video acquisition systems of the present inventions may employ a rate of acquisition, sampling, capture, recording of refocusable image data (for example, light field data) which is higher than "still" cameras and, is sufficiently high (for example, greater than 15 frames/sec, and preferably at least 24 frames/sec) to accommodate providing or generating video quality output. Notably, in addition to acquisition, sampling, capture, recording of refocusable image data, the refocusable video acquisition systems may include, among other things, on-system data storage to store refocusable video data. Indeed, the refocusable video editing systems may include, in addition to video processing circuitry, on-system data storage to store refocusable video data processed thereby and/or obtained from the refocusable video acquisition system.

The present inventions, in certain aspects, are also directed to methods or techniques for operating refocusable video acquisition systems and/or refocusable video editing systems. Such methods or techniques may be implemented on/in the refocusable video acquisition systems and/or refocusable video editing systems of the present inventions.

With reference to FIG. 2, in one exemplary embodiment, refocusable video acquisition system 10 includes refocusable video acquisition unit 12 having optics 14, sensor 16, microlens array 18 and control circuitry 20, to acquire, sample, record and/or obtain refocusable video data (for example, light field video data). Here, microlens array 16 is incorporated into the optical path to facilitate acquisition, capture, sampling of, recording and/or obtaining light field video via sensor 18. The control circuitry 20 manages or controls (automatically or in response to user inputs) the rate of acquisition, sampling, capturing, recording and/or obtaining of refocusable data (for example, light field data). As such, where refocusable video acquisition system 10 is acquiring or generating video, control circuitry 20 provides for or implements a sufficiently high rate of acquisition, sampling, capture, recording and/or obtaining of refocusable data (for example, greater than 15 frames/sec, and preferably at least 24 frames/sec) by sensor 18 to facilitate generation or production of video quality output data. The rate of acquisition by sensor 18 may be fixed or programmable (for example, via user/operator inputs).

Notably, where refocusable video acquisition system 10 is capable of acquiring "still" images and in those instances where refocusable video acquisition system 10 is programmed or configured to acquire or generate "still" images, control circuitry 20 may (in response, for example, to user/operator inputs) provide or implement lower rates of acquisition, sampling, capture, recording and/or obtaining of refocusable data (for example, less than 3 frames/sec) by sensor 18. Again, the rate of acquisition of refocusable image data by sensor 18 may be fixed or programmable.

The refocusable video acquisition system 10 may store the refocusable video data stream (for example, output by sensor 18) and/or the refocusable video data (for example, a representation of the refocusable video data stream) in external system data storage 22 and/or in on-system data storage 24. (See, for example, FIGS. 3A-3F). In this regard, refocusable video acquisition system 10 may store the "raw" refocusable video data stream (as output from sensor 18) and/or a representation thereof (for example, a compressed refocusable video data stream, multiple video data stream (for example, a plurality (3-10) of video data stream of the same scene, each data stream being refocused at different focal planes) and/or combinations thereof). All permutation and combinations of data storage formats of the refocusable video data stream and/or a representation thereof are intended to fall within the scope of the present inventions. Notably, refocusable video data stream and/or representations thereof may be collectively referred to as "refocusable video data").

In one exemplary embodiment, refocusable video acquisition system 10 may employ the optics, microlens array and/or sensor of one or more of the light field data acquisition units of FIGS. 1A-1F. The light field data acquisition discussions set forth in United States Patent Application Publication 2007/0252074, the provisional applications to which it claims priority (namely, Ser. Nos. 60/615,179 and 60/647,492), and Ren Ng's PhD dissertation, "Digital Light Field Photography") are incorporated herein by reference. In other exemplary embodiments, refocusable video acquisition system 10 employs certain aspects of such light field acquisition devices (for example, the optics and microlens array) in conjunction with other components, circuitry and/or elements (for example, a high speed photo sensor).

Figure 3C:
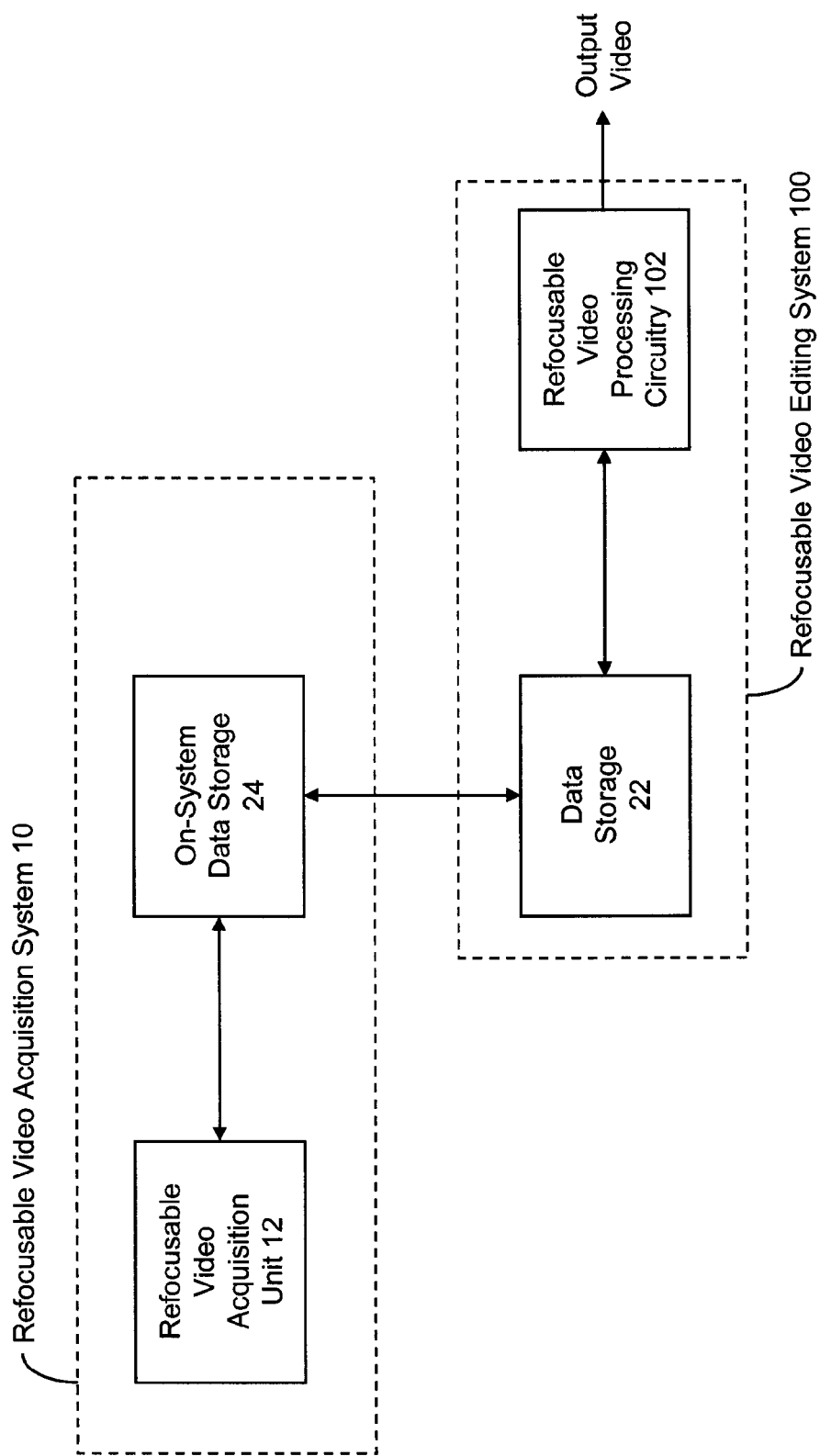

Notably, refocusable video acquisition system 10 of the present inventions may be a stand-alone system/device (see, FIGS. 3A, 3C, 3D and 3F) or may be integrated with a refocusable video editing system (see, FIGS. 3B, 3E and 3G). That is, refocusable video acquisition system 10 may be separate from a refocusable video editing system (for example, refocusable video editing system 100 according to the present inventions) which receives acquires and/or obtains refocusable video data, information, images and/or frames therefrom and performs data processing thereon, and, in other exemplary embodiments, refocusable video acquisition system 10 may be integrated (or substantially integrated) with a refocusable video editing system (see, for example, FIGS. 3A, 3C, 3D and 3F and refocusable video editing system 100 according to the present inventions).

The refocusable video acquisition unit 12 may include fixed or permanent components (for example, the optics, sensor, microlens array) or removable components (for example, a removable microlens array). In those embodiments where the components of the refocusable video acquisition unit are fixed or permanent, the optics, sensor and/or microlens array may be responsively or automatically adjusted (for example, in a relative manner) to change, for example, the focal plane, field of view or depth of field of refocusable video acquisition unit 12. In those embodiments, where refocusable video acquisition system 10 includes one or more removable components, such components may be controllably, temporarily and/or selectively incorporated into or removed from refocusable video acquisition unit 12. For example, with reference to FIGS. 2C-2F, refocusable video acquisition unit 12 may include removable microlens array and/or unit containing a microlens array and sensor 16 wherein, in one position (see, FIGS. 2C and 2E), microlens array 16 is located or disposed in the optical path to facilitate acquisition, sampling and/or recording of refocusable video data (for example, light field video data), and, in another position (see, FIGS. 2D and 2F), the microlens array is removed from the optical path of refocusable video acquisition unit 12 (and thereby removed or effectively removed from refocusable video acquisition unit 12). In this way, in addition to sampling, acquiring, sensing, capturing and/or recording data which is representative of the light field (i.e., when the microlens array is in the optical path), refocusable video acquisition system 10 may also acquire, capture and/or record standard or conventional video data when the microlens array is not located or disposed within the optical path of system 10.

In another exemplary embodiment, the refocusable video acquisition system may include a microlens relay adapter to couple or be positioned in the optical path, between the imaging sensor and optics of the refocusable video acquisition system, to project the image or scene on the photo sensor. For example, with reference to FIG. 4A, microlens relay adapter 26, in this embodiment, includes relay optics 28 and microlens array 16. The relay optics 28 may be positioned, disposed, located and/or situated between microlens array 16 and imaging sensor 18 of the video acquisition device, such that relay optics 28 images (or facilitates imaging) the focal plane of microlens array 16 onto imaging sensor 18. In one embodiment, relay optics 28 may include one or more lens elements, windows, apertures and mirrors. As such, in one exemplary embodiment, relay optics 28 may provide a selected, predetermined or programmable (for example, user or operator programmable) magnification (for example, unit magnification).

Notably, it may be advantageous to design or provide the relay optics with an f-number that is lower than the f-number of the microlens array, and with a diameter that is as large as or exceeds the width, height and diagonal length of the microlens array. Such a design may reduce, minimize and/or eliminate vignetting of light rays diverging from the periphery of the microlens array at extremal angles away from the optical axis.

Figure 4A:
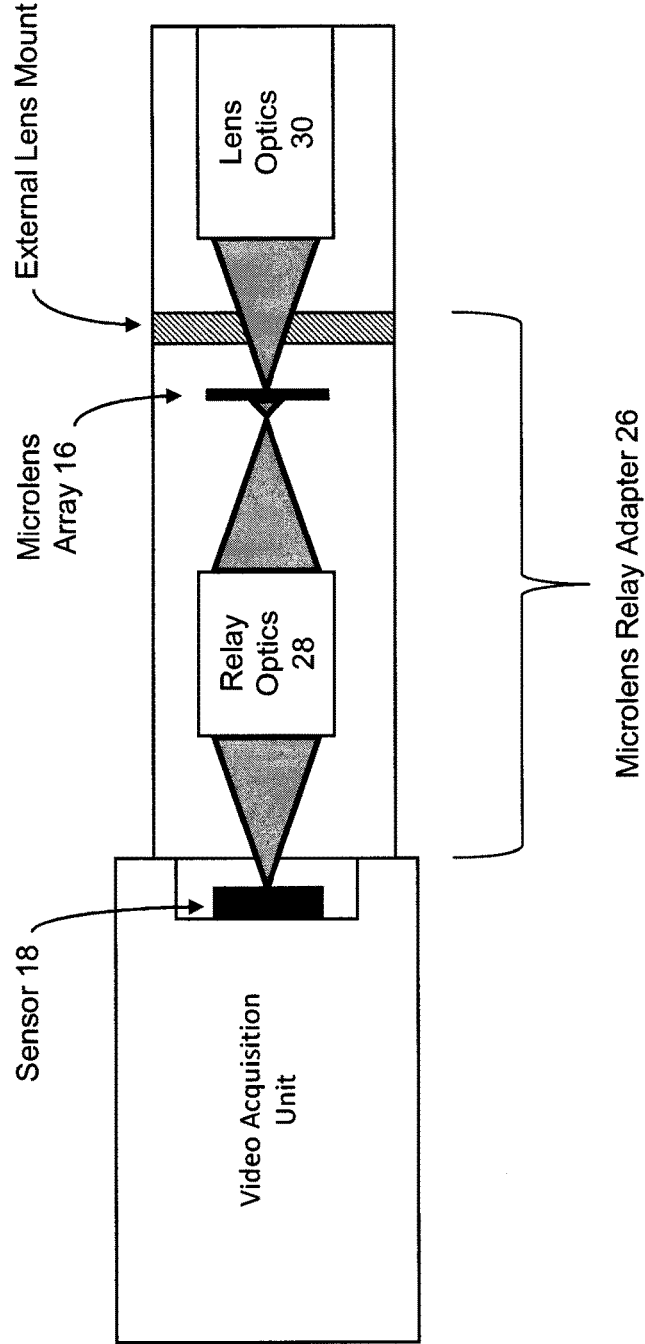
FIG. 4A is a block diagram representation of an exemplary refocusable video acquisition system according to at least certain aspects of certain embodiments of the present inventions wherein the refocusable video acquisition system of this exemplary embodiment includes a video acquisition unit, lens optics, and a microlens relay adapter having a microlens array disposed there between; notably, in this exemplary embodiment, the microlens relay adapter includes an external lens mount to facilitate mechanically coupling the lens optics of the system.

With continued reference to FIG. 4A, in one exemplary embodiment, the exterior end of microlens relay adapter 26 may include a mechanical interface providing an interchangeable lens mount. In this way, multiple/different external photographic lenses (generally illustrated as "lens optics 30") may be mechanically mounted to refocusable video acquisition system 10 in a manner similar to conventional camera architectures.

In yet another exemplary embodiment, refocusable video acquisition system 10 includes a plurality of replaceable, substitutable and/or interchangeable acquisition modules wherein at least one of the modules facilitates acquisition of refocusable video data, for example, light field video data. For example, with reference to FIG. 4B, in one embodiment, refocusable video acquisition system 10 includes light field (i) module 32 having a microlens array and/or optics to facilitate acquisition, sampling, capturing and/or recording of light field video data, and (ii) non-light field type module 34 having elements, for example, optics (i.e., without a microlens array and related/associated optics), to facilitate acquisition, sampling, capturing and/or recording of non-light field video data (for example, standard 2D video data). Accordingly, in this embodiment, when light field module 32 is mechanically or optically coupled to refocusable video acquisition system 10, refocusable video acquisition system 10 acquires, samples, captures, records and/or obtains light field video data which may, thereafter be provide to a refocusable video editing system which generates, manipulates and/or edits refocusable video data. When, however, non-light field module 34 is mechanically or optically coupled to base unit 36, the video acquisition system 10 acquires, samples, captures, records and/or obtains non-light field video data (for example, conventional or standard video data).

With reference to FIG. 4C, in another embodiment, light field module 32 includes a light field sensor, microlens array and optics to acquire, sample, capture, record and/or obtain light field video data, and a second module may contain a non-light-field sensor and/or optics (i.e., without a microlens array and related/associated optics), to capture non-light field video data (for example, standard 2D video data). Thus, in this embodiment, an appropriate or suitable photo sensor is disposed or provided within modules 32 and 34. As such, when light field module 32 is mechanically, electrically and/or optically coupled to base unit 36, video acquisition system 10 acquires, samples, captures, records and/or obtains light field video data. Indeed, when light field module 32 of this embodiment is coupled to base unit 36, such video acquisition system is a functioning as a refocusable video acquisition system. When, however, non-light field module 34 is mechanically, electrically and/or optically coupled to base unit 36, the video acquisition system does not function or operate as a refocusable video acquisition system but rather may acquire, sample, capture, record and/or obtain conventional or standard video data.

Notably, in this embodiment, base unit 36 may be a platform to receive one of the modules. The base unit 36 may include, for example, user interface 38 (for example, a display and a user input device/mechanism) as well as control circuitry 20 to facilitate acquisition or capture of video data, including refocusable video data.

With continued reference to FIGS. 4B and 4C, control circuitry 20 may be configured to detect or determine (automatically and/or in response to user inputs) the type of module attached or coupled to the acquisition or base unit. In response thereto, control circuitry 20 may configure the operation of refocusable video acquisition system 10 accordingly. That is, when light field module 32 is mechanically, electrically and/or optically coupled to the video acquisition unit or base unit, control circuitry 20 configures system 10 to acquire, sample, capture, record and/or obtain light field video data. Similarly, when non-light field module 34 is mechanically, electrically and/or optically coupled to the video acquisition unit or base unit, control circuitry 20 configures system 10 to function or operate as a refocusable video acquisition system but rather may acquire, sample, capture, record and/or obtain conventional or standard video data.

Notably, control circuitry 20 may detect or determine the type of module based on any technique, circuitry and/or architecture (for example, physical/mechanical architecture) now known or later developed. For example, control circuitry 20 may automatically detect or determine a mechanical, optical and/or electrical "signature" or "key" of the module. In this regard, each module may have a different "signature" or "key" when coupled to the video acquisition unit—for example, the module may include a non-volatile memory to store data which is representative of type of module; in this way, when the module is coupled to the acquisition unit, control circuitry 20 may detect or determine the module type based on the data stored in the memory.

Notably, in another set of embodiments, control circuitry 20 is disposed in light field module 32. (See, FIGS. 4D and 4E). In these embodiments, control circuitry 20 coordinates, controls, configures and/or manages (automatically or in response to user inputs) the rate of acquisition, sampling, capture, recording and/or obtaining of refocusable video data (for example, light field data) when light field module 32 is mechanically, electrically and/or optically coupled to base unit 36. Moreover, as discussed in detail below, control circuitry 20 may coordinate, control, configure and/or manage (automatically or in response to user inputs) other aspects or parameters of the acquisition, sampling, capture, recording and/or obtaining of refocusable video data including, for example, the focal plane, field of view or depth of field of refocusable video acquisition unit 12 during acquisition, sampling, capture, recording and/or obtaining of refocusable video data.

Live "is Shot Refocusable?"

As noted above, the refocusable video acquisition unit may include a user interface to allow a user/operator to monitor, control and/or the program refocusable video acquisition unit and/or refocusable video acquisition system. For example, with reference to FIG. 2B, in one embodiment, user interface 38 may include an output device/mechanism (for example, display and/or speaker) and/or user input device/mechanism (for example, buttons, switches, touch screen, pointing device (for example, mouse or trackball) and/or microphone) to allow a user/operator to monitor, control and/or the program operating parameters of refocusable video acquisition unit 12 (for example, (i) the rates of acquisition, sampling, capture and/or recording of refocusable data by sensor 18 and/or (ii) the focal plane, field of view or depth of field of refocusable video acquisition unit 12). (See, FIG. 5).

Figure 7A:
FIG. 7A is an image of a group of monks in different focal planes wherein the image focused on depth of closest eye in image; notably, this illustration is referenced in FIGS. 7B and 7C.
Figure 7B:
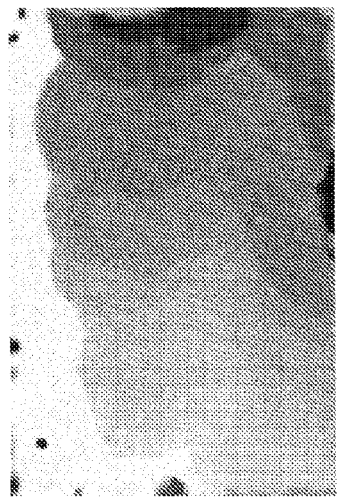
FIG. 7B is an image of a live computed depth map, generated for the scene presented in FIG. 7A, where the color or shades of the image indicates the focal depth at which that portion of the image is "in-focus" (computed focus depth mask for image of FIG. 7A); in the illustration, darker colors or shades represent areas nearer to acquisition unit and brighter areas represent areas further from the acquisition unit.
Figure 7C:
FIG. 7C is an image of a computed, live, "in-focus" determination, using the image of FIG. 7A (computed in-focus or out-of-focus mask for the image of FIG. 7A); notably, in the illustration, white represents areas determined to be "in-focus" and black represents areas determined to be "out-of-focus"; intermediate colors, shades or values indicate intermediate proximity to "in-focus"

In one embodiment, an indicator (visual or audible) may be disposed on, in or near the refocusable video acquisition system to provide information to the operator or user about the extent to which the processing system (for example, refocusable video processing circuitry of the present inventions) is able to generate, compute and/or provide one or more predetermined focused images (for example, sharply focused) of one or more subjects at one or more different focal plane(s), field of view(s) and/or depths of field of refocusable video acquisition system (for example, a system having a refocusable video acquisition unit 12 of FIG. 2B) in the acquired, to be acquired, and/or shot footage. For example, with reference to FIGS. 2B, 5 and 6, refocusable video acquisition system 10 may include user interface 38 having a display providing a view to the operator that provides information regarding the extent to which a processing system (for example, refocusable video processing system of the present inventions) is able to generate, compute and/or provide one or more images having a particular or given focus of the subject(s) at one or more different depths in the acquired footage. An exemplary indicator is illustrated in FIG. 7C wherein, relative to FIG. 7A, white portions represent areas determined to be "in-focus" and black portions represent areas determined to "out-of-focus"; portions have intermediate colors, shades or values indicate intermediate proximity to "in-focus".

Notably, user interface 38 and/or the refocusable video processing circuitry may be integrated, disposed and/or located on/in refocusable video acquisition system 10 or unit 12.

In this embodiment, the refocusable video processing circuitry may generate, determine, calculate and/or provide information which is representative of those ranges within the scene that may be focused or re-focused at one or more predetermined or given focal plane(s) and/or depths of field of refocusable video acquisition system (after post-processing and based on a particular, given or predetermined set of parameters of the refocusable video acquisition unit). In addition thereto, or in lieu thereof, the refocusable video processing circuitry may generate, determine, calculate and/or provide information which is representative of those subjects within the scene that may be within a predetermined or given focus (after post-processing and based on a particular, given or predetermined set of parameters of the refocusable video acquisition unit). The refocusable video processing circuitry may provide such information to the user interface (which may include a display or speaker) thereby providing information or guidance to the operator regarding the extent to which a processing system (for example, refocusable video processing system of the present inventions) is able to generate, compute, and/or provide one or more images having a predetermined, particular or given focus of the subject(s) at one or more different depths in the acquired footage.

Notably, the refocusable video processing circuitry may be implemented via a plurality of discrete or integrated logic, and/or one or more state machines, special or general purpose processors (suitably programmed) and/or field programmable gate arrays (or combinations thereof). Indeed, all circuitry (for example, discrete or integrated logic, state machine(s), special or general purpose processor(s) (suitably programmed) and/or field programmable gate array(s) (or combinations thereof)) to generate, determine, calculate and/or provide information which is representative of (i) those ranges within the scene that may be focused at one or more predetermined or given focal plane(s) and/or depths of the field of refocusable video acquisition system (after post-processing and based on a given or predetermined set of parameters of the refocusable video acquisition unit) and/or (ii) those subjects within the scene that may be within a predetermined or given focus (after post-processing and based on a given or predetermined set of parameters of the refocusable video acquisition unit), consistent with inventions described and/or illustrated herein, are intended to fall within the scope of the present inventions.

The following exemplary embodiments illustrate various methods for presenting such information. However, it should be understood that the present inventions are intended to cover or encompass all representations or views that provide the operator with information which is representative of the extent of the focusing the refocusable video processing circuitry may provide in connection with refocusable video data which is to be acquired or has been acquired by the refocusable video acquisition unit based on a given or predetermined set of parameters.

Live Computed Aperture Adjustment

In one exemplary embodiment, using the current ("live") video data acquired by the refocusable video acquisition unit, the refocusable video processing circuitry may generate, determine, calculate and/or provide information regarding a subject, object and/or range at which the refocusable video processing circuitry may refocus the video (for example, a maximum range where sharp focus can be determined and/or computed—after post-processing by the refocusable video processing circuitry). The refocusable video processing circuitry may generate, determine, calculate and/or provide information regarding a subject, object and/or range at which the refocusable video processing circuitry may refocus the video using data acquired by the refocusable video acquisition unit having an adjusted aperture, for example, a small or reduced aperture relative to typical data acquisition. In this embodiment, the refocusable video processing circuitry may generate information which is representative of a current or "live", computed view using an adjusted aperture (for example, a small or reduced aperture). Such information may be presented to the user or operator of the scene being acquired or shot by a refocusable video acquisition unit—for example, a current or live view that contains a depth of field which is larger than the optical depth of field. The size of the computed aperture may be selected such that the objects may appear less "sharp" in the operator's view (for example, of the user interface) as the subject, object and/or range reaches, for example, a predetermined, particular and/or given focus that may be computed, generated and/or provided the refocusable video processing circuitry (for example, a maximum range where sharp focus can be computed—after post-processing by the refocusable video processing circuitry). This exemplary embodiment is shown, in block diagram form, in FIG. 6B.

Figure 8A:
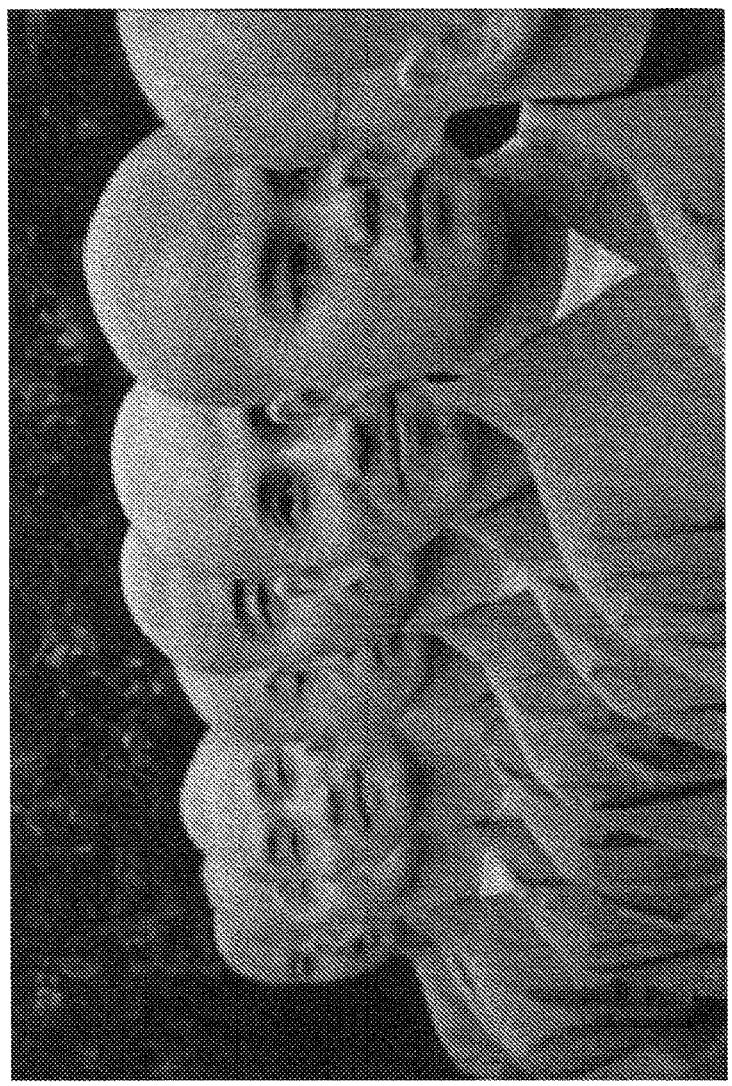
FIG. 8A is an image of a computed (small aperture) view with a small aperture, using the image presented in FIG. 7A.

In one exemplary embodiment, refocusable video processing circuitry 102 may generate, compute and/or output video data or still image data which facilitates providing such a view (for example, on a display of the user interface 38) by synthesizing a view with an aperture that is approximately 1/N of the diameter of the optical aperture, where N is the number of pixels under a microlens disk of the microlens array of the refocusable video acquisition unit 12 in the raw light field image acquired or obtained thereby. (See, for example, FIG. 8A).

Figure 8B:
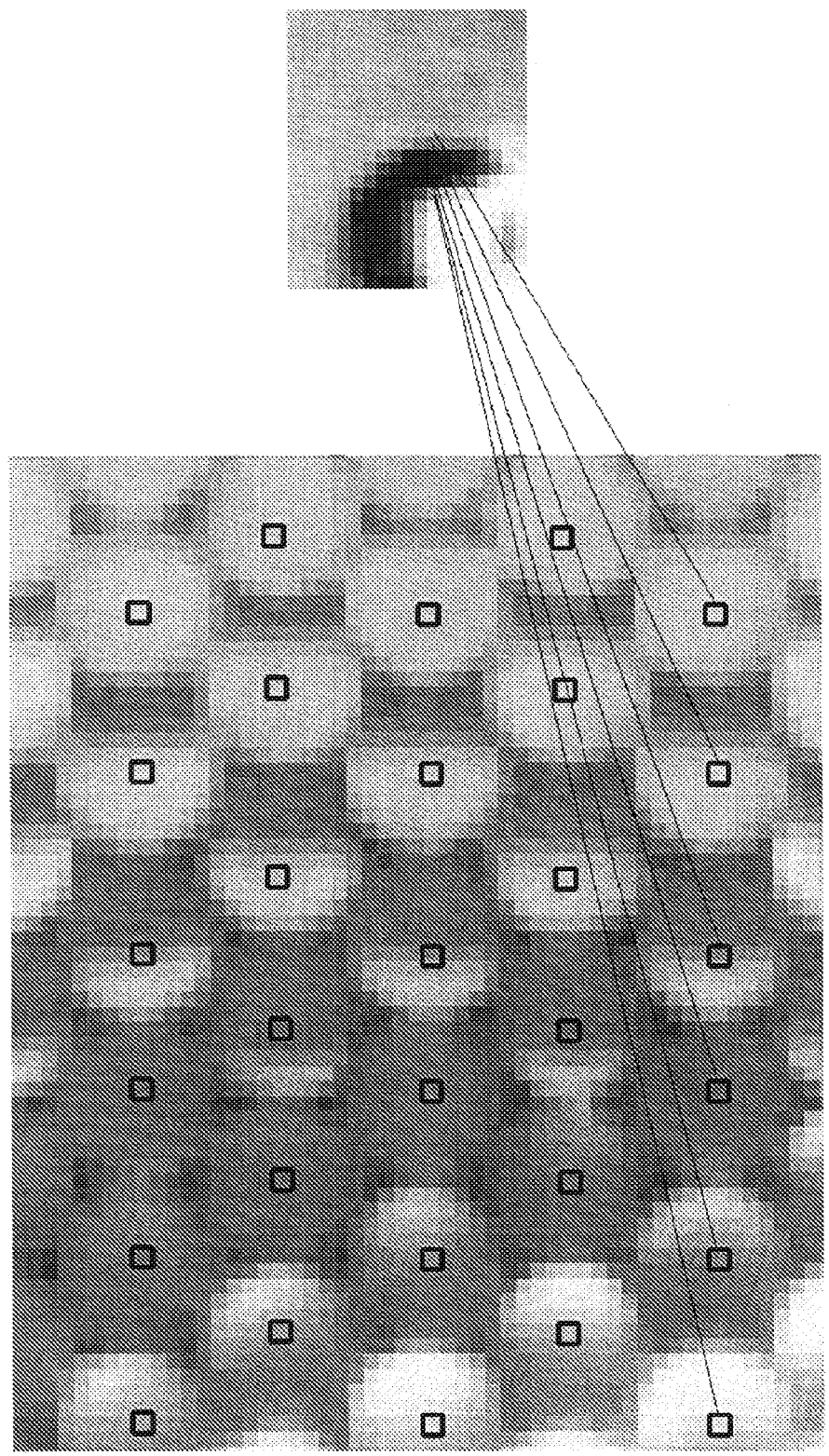
FIG. 8B is an illustration indicating how a single pixel from or under each microlens may be selected to create an image of a scene with a large depth of field, for example, for "live" view; notably, the image on the left is a zoomed and magnified section of a light field image with pixel near center of each projected microlens disk highlighted. The black box near the center of each disk is a representation of how an algorithm may select a single pixel near the center, and the lines and image on the right show conceptually how the individual pixels from the disk centers (in this exemplary embodiment) may be assembled into a final image that may be employed, for example, in connection with "live" view.

Notably, any method for computing an extended depth of field image, whether now known or later developed, may be used and is intended to fall within the scope of the present inventions. For example, in one exemplary embodiment, the center-most pixel in the micro image that forms under each microlens (referred to in the sentences below as a "microlens image") of the microlens array may be combined with all other such pixels in an array in order to compute the small-aperture view with extended depth of field appearance (See, for example, FIG. 8B). In another embodiment, the center-most pixel value is substituted with a value interpolated from a set of pixels in a neighborhood closest to the center of the microlens image. In one exemplary embodiment, this set of pixels comprises the four pixels closest to the center of the microlens image, and the interpolation function is used is bilinear interpolation according to the distance of the four pixel centers from the geometric center of the microlens image.

Live Depth Map Display

In addition thereto, or in lieu thereof, in another exemplary embodiment, the refocusable video processing circuitry may generate, compute and/or provide information which is representative of a "live", computed focus depth "map" of the scene (which may be based on the operating or acquisition parameters of the refocusable video acquisition unit). The map of the focus depth calculated, determined and/or generated by the refocusable video processing circuitry may be displayed to the user/operator in real time or near real-time. The view may be shown in various manners on the display of the user interface—for example, as an overlay on the video stream of the video data, or as an inset video stream. (See, for example, FIG. 7B and FIG. 7C).

In one embodiment, the appearance of the depth map at different regions of the field of view may indicate the focus deviation in that region from the optical focus point. The appearance may, for example, vary in color (for example, different colors or a scale of a given color (for example, gray scale)) and/or brightness according to the deviation from the focus point. In another embodiment, the map of the focus depth may include absolute or relative values such that the user/operator may determine the capability or potential of adjusting or changing the focus of a particular subject, region or range in the scene. Any manner or technique to provide such information to the user/operator, whether now known or later developed, is intended to fall within the scope of the present invention.

The focus depth map may be determined or estimated using any method now known or later developed. For example, the map may be computed and utilized as described in the following exemplary embodiments:

From the current light field frame captured by the system, generate, compute and/or determine a set of images refocused at a set of depths that includes depths closer and further than the depths that may be focused at the desired or predetermined level of sharpness.

For each region in the image, generate, compute and/or determine the image that contains predetermined details (for example, the sharpest details) in that portion of the image. One method for doing so applies a focus metric, such as an edge detection image processing algorithm to the images, and determines the image in which the focus metric is highest in the region of interest.

Each region is conceptually tagged with the focus depth of the image containing the predetermined details (for example, the sharpest details). If the focus depth corresponds to a depth outside the range of a predetermined depth that allows a predetermined focus at the desired or a predetermined level of sharpness, the region is conceptually tagged with an "out of range" marker.

In embodiments where the appearance is set according to the focus depth, the focus depth label is used. In another exemplary embodiment regions marked with an "out of focus" indicator are presented with a blinking appearance in the view in order to draw the user's attention to that problem area.

"Out of Refocusable Range Icon"

In addition thereto, or in lieu thereof, in one exemplary embodiment, the refocusable video processing circuitry may generate, compute and/or provide information which is representative of an "out of refocusable range" information (for example, an icon that may be provided to a display on the user interface). In this regard, in one embodiment, an icon representative of an "out of refocusable range" (for example, as determined by refocusable video processing circuitry using "live" or current video data) may be displayed on the user interface by control circuitry when the scene contains subjects or items outside the range of depths that the refocusable video processing circuitry may refocus (for example, refocus sharply). Notably, any method now known or later developed may be used to determine or estimate whether the scene contains such subjects. One exemplary method is as follows:

From the current light field frame captured by the system, generate, compute and/or determine a set of images refocused at a set of depths that includes depths closer and further than the depths that may be focused at the desired level of sharpness.

For each region in the image, compute and/or identify the image that contains the sharpest details in that portion of the image. One method for doing so applies a focus metric, such as an edge detection image processing algorithm to the images, and determines the image in which the focus metric is highest in the region of interest. As such, in one embodiment, the refocusable video processing circuitry implements an edge detection technique to identify the image that contains the sharpest details in that portion of the image.

If any region of the image is sharpest in an image corresponding to a depth outside the range of depths that can be refocused sharply, the refocusable video processing circuitry generates "out of refocusable range" information which may be displayed on the user interfaces as an "out of refocusable range icon.

Another exemplary method, using sub-aperture images, is as follows:

From the current light field frame captured by the system, determine a set of sub-aperture images to be generated and/or computed, where each sub-aperture image is a view of the light field from a small portion of the aperture. In one embodiment, these sub-aperture images can be identified by target U,V coordinates in the X,Y,U,V light field coordinate system. In this embodiment, each sub-aperture image 2 dimensional sampling of the light field where U and V are held constant or near constant. In an exemplary embodiment, the set of sub-aperture images to be generated and/or computed is determined by a regular sampling of the U,V coordinate space (for example, sampling on a square or hexagonal grid).

Figure 25:
FIG. 25 is a sub-aperture representation generated by applying a Laplacian operator to a sub-aperture image; in some embodiments, this type of sub-aperture representation may be used in lieu of sub-aperture images for focus analysis.

From the current light field frame captured by the system, generate and/or compute the determined set of sub-aperture images or representations, where each sub-aperture image or representation is a view of the light field or specific light field characteristics from a small portion of the aperture. In some embodiments, a sub-aperture image or representation is an image created by sampling the current light field frame. In one embodiment, a sub-aperture image may be generated for a U,V value by sampling each microlens and returning the single pixel value with U,V coordinates closest to the target U,V coordinates. In another embodiment, the pixels under each microlens are sampled and return a pixel value from bilinear interpolation of the four pixels with nearest U,V coordinates to the target U,V coordinates. (See FIG. 24A, FIG. 24B, FIG. 24C and FIG. 24D). Indeed, any interpolation technique(s) now known or later developed may be used, including but not limited to: nearest neighbor interpolation, linear interpolation, non-linear interpolation, cubic interpolation, Bezier curve interpolation, and/or spline-based interpolation. In some embodiments, a sub-aperture image or representation may be obtained by applying a function to another sub-aperture image or representation. In one specific exemplary embodiment, a sub-aperture image or representation may be generated by applying an N by M or N by N (for example, 3 by 3, 5 by 5, or 7 by 7) Laplacian operator to a previously generated sub-aperture image or representation (see FIG. 25). In another specific exemplary embodiment, a sub-aperture image or representation may be generated by applying a derivative operator (for example, sum modified Laplacian or gradient magnitude) to a previously generated sub-aperture image or representation. In other embodiments, a sub-aperture image or representation may be generated by applying an edge detection algorithm (for example, Canny edge detection) to a previously generated sub-aperture image or representation.

For each region of the image, compute and/or determine similarity, consistency and/or difference scores. In one embodiment, for a series of focus depths, each sub-aperture image or representation is shifted relative to the other sub-aperture images or representation and then compared for regional image similarity and/or consistency. In one exemplary embodiment, the sub-aperture images or representations are shifted relative to each other according to the following formula:

$$Dx = U * \text{Focus\_Depth}$$

$$Dy = V * \text{Focus\_Depth}$$

Figure 24A:
FIGS. 24A, 24B, 24C, and 24D are a set of four sub-aperture images generated from the same light field; wherein each sub-aperture image was generated by sampling the light field using a different set of fixed U and V coordinates including sub-aperture image for target U,V coordinates of −0.25, 0 (FIG. 24A), sub-aperture image for target U,V coordinates of 0.25, 0 (FIG. 24B), sub-aperture image for target U,V coordinates of 0, −0.25 (FIG. 24C), and sub-aperture image for target U,V coordinates of 0.25, 0 (FIG. 24D)
Figure 24B:
Figure 24C:
Figure 24D:
Figure 24E:
FIG. 24E illustrates in a more conceptual manner how the sub-aperture images presented in FIGS. 24A, 24B, 24C and 24D may be used to determine the proper focus depth for objects in the scene by shifting and comparison; the illustration shows the four sub-aperture images composited and shifted relative to each other, in a manner consistent with changing the focus of the image; in the composite, the four images of the glove in the foreground align, indicated that the glove is "in-focus" and the person is "out-of-focus"; that is, the four images of the person in the background are not aligned, and, in this embodiment, result in multiple "ghost" images, indicating the person is "out-of-focus"

In one embodiment, the shifted sub-aperture images or representations are compared for regional similarity or consistency by applying a localized cross-correlation across all sub-aperture images for each image region (See FIG. 24E). In an exemplary embodiment, for each location, an N by N (for example, 11 by 11) pixel cross-correlation window is used, centered at the target location. In this embodiment, sampling of the sub-aperture images can be nearest neighbor, bilinear, or any other sampling image sampling method now known or later developed. In another embodiment, the shifted sub-aperture images or representations are compared for regional similarity, consistency and/or differences by applying localized statistical metrics across all sub-aperture images for each image region. In a specific exemplary embodiment, each shifted sub-aperture image or representation is sampled at each location, and the set of sample values at each location are statistically analyzed to determine a score representing the similarity, consistency and/or difference of the sample values at that location. In one embodiment, the metric is the statistical variance of the values. In another embodiment, it is the standard deviation of the values. In another embodiment, the metric is the square root of the standard deviation of the sample values. Indeed, any statistical metric now known or later developed by be used to calculate, generate or determine a similarity, consistency and/or difference score for a location. In some embodiments, the similarity, consistency and/or differences may be locally or spatially combined or aggregated. In a specific exemplary embodiment, the similarity, consistency and/or difference scores are summed together over an N by N (for example, 9 by 9) region to create an aggregate value.

For each region of the image, compute and/or determine the depth or depths of sharpest focus based using the similarity, consistency and/or difference scores. In some embodiments, the similarity, consistency and/or difference scores may be used directly to determine a localized depth of sharpest focus by choosing the focus depth corresponding most "in-focus" scores (for example, by choosing the largest value for scores representing consistency or similarity (for example, cross correlation scores) or the smallest values for scores representing differences (for example, variance or standard deviation scores). In other embodiments, the similarity, consistency and/or difference scores may be aggregated, combined and/or processed to determine the focus depth that is most "in-focus". In one specific exemplary embodiment, the similarity, consistency and/or difference scores are combined over an N by N region (for example, 5 by 5) and then selecting the most "in-focus" depth based on the aggregate score. In another exemplary embodiment, similarity, consistency and/or difference scores are aggregated until a minimum total score or confidence level is reached for the region (for example, aggregation is performed until the total score is 10 times the maximum score for any single location), and then selecting the most "in-focus" depth based on the aggregate score.

If any region of the image is sharpest in an image corresponding to a depth outside the range of depths that can be refocused sharply, the refocusable video processing circuitry generates "out of refocusable range" information which may be displayed on the user interfaces as an "out of refocusable range icon.

Notably, in addition to or in lieu of the visual indicator, the refocusable video data acquisition system may include an audible indicator (for example, a microphone and/or speaker) to provide information to the operator or user about the extent to which the refocusable video processing circuitry is able to generate and/or compute predetermined (for example, sharply) focused images of the subjects at different depths in the acquired footage. In addition, the operator or user may identify, for example, the subject, via verbal input/commands. As such, the discussion above pertaining to the visual indicator is fully applicable to an audible indicator wherein the information is provided to the operator or user via sound. For the sake of brevity, that discussion will not be repeated.

Storing/Saving

In those embodiments where the refocusable video data is video light field data, such data may be characterized or interpreted as a 5D function, with each pixel assigned a 5-tuple (t,x,y,u,v) representing a ray in 3D-space at a particular time. In the 5-tuple: t is the time (video frame), (x,y) are the spatial coordinates of the ray corresponding to which microlens the pixel is under, and (u,v) are the directional coordinates of the ray corresponding to its position within the image that appears under each microlens.

The refocusable video acquisition system 10 and/or refocusable video editing system 100 may store refocusable video data (for example, video light field data) or data that is generated or derived therefrom, may be stored or saved in any format, including those exemplary embodiments described below. It should be noted, that the refocusable video data (for example, video light field data) or data that is generated or derived therefrom may be saved in any format, whether now known or later developed, that is consistent with the inventions set forth herein, including, for example:

Full raw light field video stream (uncompressed data)
   All pixels (for example, the individual sensor elements of a sensor array) in the (t,x,y,u,v) space are stored as they are read off the sensor.

Compressed video light field
   The refocusable video acquisition system 10 and/or refocusable video editing system 100 may implement any compression method now known or later developed to compress the 5D (t,x,y,u,v) data set. The following is intended as an illustrative, but not limiting, set of exemplary embodiments of the compression component of the following invention:

The 5D data-set may be broken into contiguous blocks in time of a set of light field video frames. These blocks are interpreted as a 5D function, and compressed with a 5D wavelet compression technique.

Each frame is interpreted as a 4D light field in (x,y,u,v), and it is compressed using a 4D wavelet compression scheme.

Each frame of the video is interpreted as a 2D image, ignoring its 4D light field structure, and compressed using a 2D image compression technique, such as 2D wavelets, or JPEG.

The video is interpreted as a regular (t,x,y) video stream, ignoring the directional (u,v) structure of the light field. It is compressed using regular video compression techniques, including 3D wavelets, motion JPEG, H.264, MPEG-4, etc.

Complete refocus stack (4D compression), comprising a set of images focused at various focus depths for each time frame In these exemplary embodiments, refocusable video acquisition system 10 and/or refocusable video editing system 100 may process each acquired or captured frame of the light field data to generate, compute and/or output a set of images focused at various depths, and these images form the refocus stack that is saved for the current frame. The refocusable video acquisition system 10 and/or the refocusable video editing system 100 may employ any refocusing technique now known or later developed.

Track top N potential subjects (N×compressed video stream)

In this exemplary embodiment, refocusable video acquisition system 10 and/or refocusable video editing system 100 may process each acquired or captured frame of the light field to generate, compute and/or output a set of N images focused on the N most important subjects, and these N images are stored for that frame.

In particular, in one exemplary embodiment, for each frame, refocusable video editing system 100 generates and/or computes a set of images at a range or a plurality of focus depths. The refocusable video acquisition system 10 and/or refocusable video editing system 100 may analyze these images to identify predetermined regions (for example, sharp regions), utilizing, for example, one or more of the techniques described herein. Each image receives a "score" corresponding to the total size of the predetermined regions (for example, sharp regions). The N images with the highest score are chosen for the frame being considered.

In an exemplary embodiment, N is 2; in another embodiment, N is 1≥N≥5.

In another exemplary embodiment, the score assigned to each image is higher if its sharp regions correspond to a human face. A face detection algorithm is applied to determine or compute which portions of each image, if any, correspond to a human face.

Software autofocus (one compressed video stream)

In these exemplary embodiments, refocusable video acquisition system 10 and/or refocusable video editing system 100 may process the light field for each frame of the video in order to generate, compute and/or provide a one image that is saved for that frame, where the image is automatically focused on a subject of interest.

In those situations where full focus selection is available in post-production (for example, in the case of a professional type system), the refocusable video acquisition system 10, in one embodiment, may save/store the full or entire light field video stream, in either compressed or uncompressed forms, or a sufficient amount of the information which is representative of the light field video data stream or pertaining to the light field video data stream as necessary to implement such post-processing thereon (by, for example, refocusable video editing system 100).

In the preceding exemplary embodiments, various computations are described. These computations may be implemented with processing circuitry disposed (in part or in whole) in/on the refocusable video acquisition system 10 or in/on an external processing system (for example, refocusable video editing system 100). The integrated circuitry may include one or more microprocessors, Application-Specific Integrated Circuits (ASICs), digital signal processors (DSPs), and/or programmable gate arrays (for example, field-programmable gate arrays (FPGAs)). Indeed, the processing circuitry may be any type or form of circuitry whether now known or later developed. For example, the processing circuitry may include a single component or a multiplicity of components (microprocessors, ASICs and DSPs), either active and/or passive, which are coupled together to implement, provide and/or perform a desired operation/function/application.

Further, as mentioned above, in operation, the processing circuitry may perform or execute one or more applications, routines, programs and/or data structures that implement particular methods, tasks or operations described and illustrated herein. The functionality of the applications, routines or programs may be combined or distributed. Further, the applications, routines or programs may be implemented by the sensor data processing circuitry using any programming language whether now known or later developed, including, for example, assembly, FORTRAN, C, C++, and BASIC, whether compiled or uncompiled code; all of which are intended to fall within the scope of the present invention.

Editing of Refocusable Video Data

This section describes exemplary embodiments relating to a refocusable video editing system 100 and techniques employed therein or thereby in connection with refocusable video data and/or the operation or control of refocusable video acquisition system 10. The exemplary embodiments pertaining to refocusable video editing system and technique employed thereby are at times described in the context where refocusable video data includes light field video data. However, it is intended that these exemplary embodiments, although set forth in the context of light field video data, are applicable to and may utilize any refocusable video data, whether now known or later developed, where that video data enables computation of images focused at different depths for various frames of the video.

Briefly, with reference to FIGS. 3A-3G, refocusable video editing system 100 includes refocusable video processing circuitry 102 to process, evaluate and/or analyze refocusable video data and to generate, compute and/or output video data, for example, as discussed herein. In one embodiment, such data may be final video output and/or data which facilitates control and/or operation of refocusable video acquisition system 10 (for example, refocusable video processing circuitry 102 may generate, compute and/or provide information which is representative of an "out of refocusable range" information (for example, an icon that may be provided to a display on the user interface). As noted above, the "out of refocusable range" "icon" may be displayed on the user interface so that the user or operator may control the operation of refocusable video acquisition system 10.

Figure 3H:
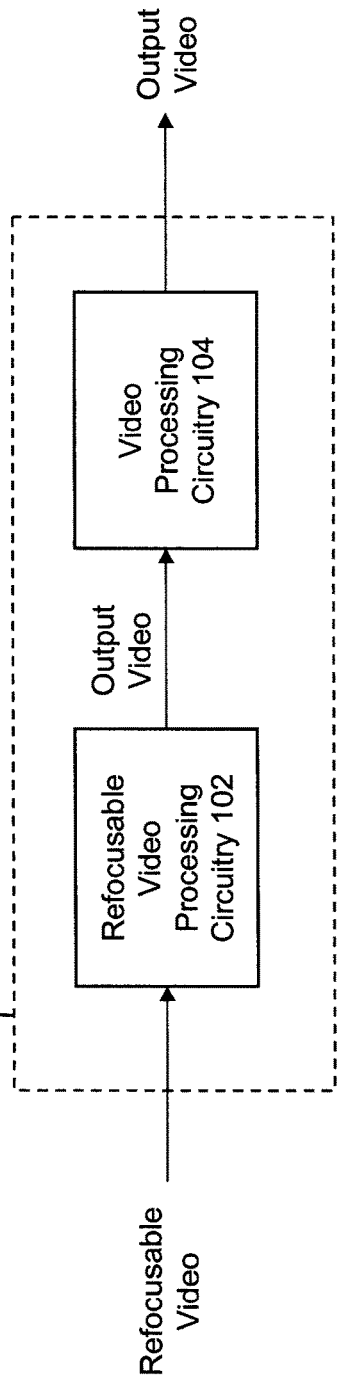
FIG. 3H is a block diagram of an exemplary refocusable video editing system 100 containing refocusable video processing circuitry 102 and video processing circuitry 104, according to at least certain aspects of certain embodiments of the present inventions; notably, refocusable video, in certain embodiments, is processed first by refocusable video processing circuitry and output video generated is then processed by video processing circuitry (for example, to apply "special effects" to the output video)

Notably, refocusable video editing system 100 may implement or couple to circuitry that implements conventional video processing (for example, incorporation of "special effects", color adjustments, and/or "sharpening" the video frames). For example, with reference to FIGS. 3H-3K, refocusable video editing system 100 may include and/or couple to video processing circuitry 104 and/or external video processing system 106. In this embodiment, the video processing implemented in conjunction with and/or appropriate to conventional video or video data may be implemented or applied before and/or after processing of refocusable video data by refocusable video processing circuitry, for example, processing which converts the refocusable video data to output video data and/or generating or rendering output video data using refocusable video data. In one embodiment, with reference to FIG. 3H, refocusable video editing system 100 may include refocusable video processing circuitry 102 and video processing circuitry 104. In this embodiment, refocusable video processing circuitry receives as input refocusable video data and renders "intermediate" output video (for example, 2D video). Thereafter the intermediate video may be processed by video processing circuitry 104 (for example, to apply "special effects" or to "sharpen" the frames) to generate final output video which may be stored and/or displayed.

In one embodiment of refocusable video editing system 100, the user/operator may be presented with a user interface including a timeline, displays or views representing conventional video effects, displays or views representing conventional video data, and/or displays or views representing refocus video data. In this embodiment, the user may have editing control of a plurality of features, including, for example, the focus depth of refocusable video streams, the inclusion of visual effects, the timing of all elements (for example, video, refocusable video and/or effects) and/or transitions between elements. In this embodiment, the user/operator may have the option of rendering to final video. While the system is rendering portions of the final output video that include refocusable video data, refocusable video editing system 100 may render refocusable video data to intermediate output video data temporally prior to combining the refocusable video data with other elements (for example, when fading from one clip to another).

Figure 3I:
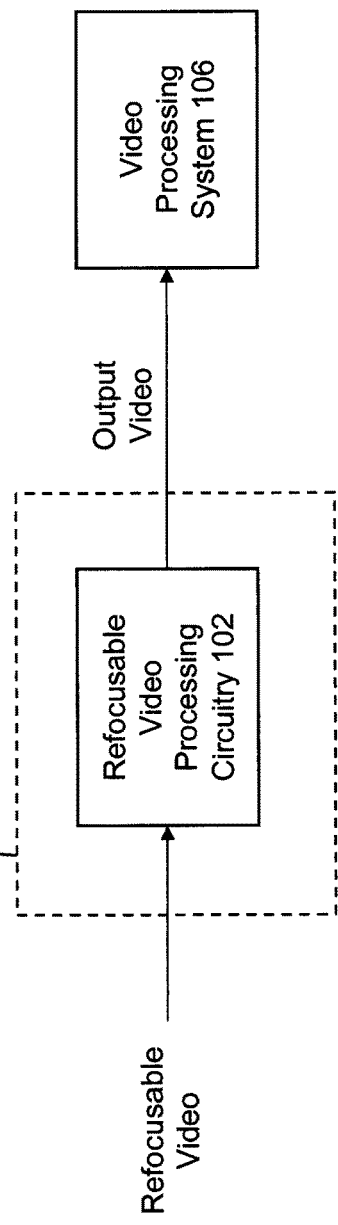
FIG. 3I is a block diagram of an exemplary refocusable video editing system 100 containing refocusable video processing circuitry 102 and an external video processing system, according to at least certain aspects of certain embodiments of the present inventions; notably, refocusable video, in certain embodiments, is processed first by refocusable video processing circuitry and output video generated is then processed separately by external video processing system (for example, to apply "special effects" to the output video)

In another embodiment, with reference to FIG. 3I, refocusable video system 100, which includes refocusable video processing circuitry 102, may couple to video processing system 106. In some embodiments, with continued reference to FIG. 3I, the circuitry of video processing system 106 overlaps, in whole or in part, with the circuitry of refocusable video processing circuitry 102. Such circuitry (for example, microprocessor circuitry) may implement conventional techniques (for example, via conventional program(s)) that may be initialized and executed by refocusable video editing system 100.

Figure 3J:
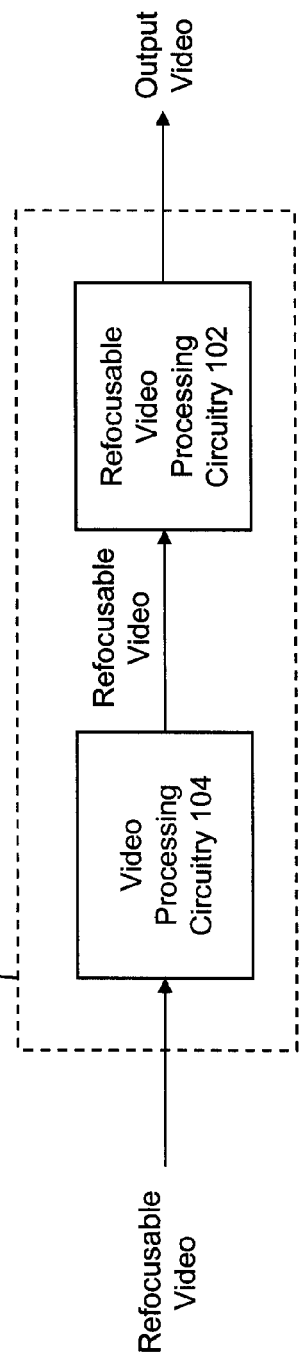
FIG. 3J is a block diagram of an exemplary refocusable video editing system 100 containing refocusable video processing circuitry 102 and video processing circuitry 104, according to at least certain aspects of certain embodiments of the present inventions; notably, refocusable video, in certain embodiments, is processed first by video processing circuitry (for example, to apply exposure adjustment) and refocusable video is then further processed by refocusable video processing circuitry to generate output video.
Figure 3K:
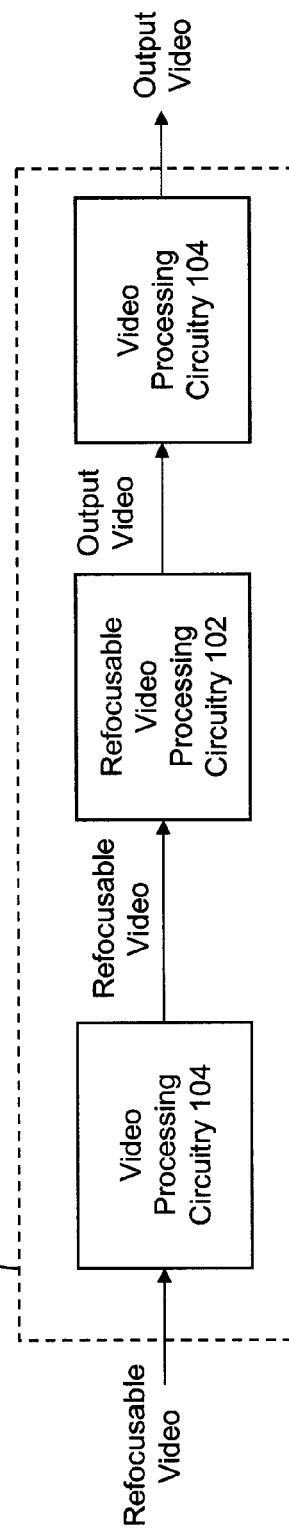
FIG. 3K is a block diagram of an exemplary refocusable video editing system 100 containing refocusable video processing circuitry 102 and video processing circuitry 104, according to at least certain aspects of certain embodiments of the present inventions; notably, refocusable video, in certain embodiments, is processed first by video processing circuitry (for example, to apply exposure adjustment) and refocusable video is then further processed by refocusable video processing circuitry to generate output video, and output video is further processed by video processing circuitry (for example, to apply "special effects" to the video.

In yet another embodiment, with reference to FIG. 3J, refocusable video editing system 100 may include video processing circuitry 104 and refocusable video processing circuitry 102. In this embodiment, video processing circuitry may process refocusable video data (for example, to adjust the exposure or to de-mosaic raw light field sensor data) and, thereafter, refocusable video processing circuitry 102 may further process the refocusable video data to produce output video.

Notably, the system may implement conventional video processing and/or the refocusable video processing in one or more stages. Such stages may not be contiguous in that the system may implement certain conventional video processing before and after certain refocusable video processing. All combinations and permutations are intended to fall within the scope of the present inventions. For example, in one embodiment, with reference to FIG. 3K, refocusable video editing system 100 may include refocusable video processing and two separate stages/operations using conventional video processing. In this embodiment, refocusable video data or frames may be processed by video processing circuitry (for example, to apply exposure correction or to de-mosaic raw light field sensor data), the resulting refocusable video data may be further processed by refocusable video processing circuitry 102 to, for example, generate intermediate output video, and the intermediate output video may be further processed by video processing circuitry 104 (for example, to apply "special effects" or to "sharpen" the frames) to generate or render final output video.

The conventional video processing may include many effects and/or features. In one embodiment, conventional video processing may include changing color effects (for example, editing contrast/brightness, color cast, saturation, color levels, color replacements, and/or color inversion). In another embodiment, conventional video processing may include compositing of the video data with other video and/or image data (for example, text overlays, "picture in picture", and/or alpha blending of other images and/or video). In another embodiment, conventional video processing includes the addition of transition effects between a plurality of video segments (for example, cross-fade, fade to black, and/or transitions involving affine transforms). In another embodiment, conventional video processing includes filtering (for example, to sharpen, blur, convolve, add a "film grain" and/or reduce "noise"). In another embodiment, conventional video processing may include "special effects" (for example, CGI animation, explosions, and or "green screen" effects).

Figure 5:
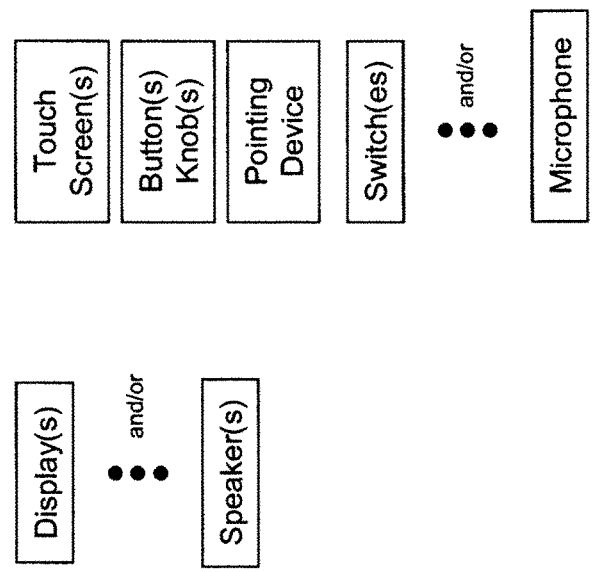
FIG. 5 is a block diagram representation of an exemplary user interface of, for example, refocusable video acquisition unit, according to certain aspects of the present invention; notably, in one embodiment, the user interface may include an output device/mechanism (for example, display and/or speaker) and/or user input device/mechanism (for example, buttons, switches, touch screens, pointing device (for example, mouse or trackball) and/or microphone) to allow a user/operator to monitor, control and/or program operating parameters of the refocusable video acquisition unit (for example, (i) the rates of acquisition, sampling, capture and/or recording of refocusable data by the photo sensor and/or (ii) the focal plane, field of view or depth of field of the refocusable video acquisition unit)

Notably, refocusable video editing system 100 may also include data storage 22 as well as a user interface (for example, similar to or like that illustrated in FIG. 5). The user interface may include, for example, one or more displays, speakers, microphones, pointing devices, switches, buttons, knobs, touch screens, and/or keyboards.

With that in mind, the first subsection describes embodiments of the refocusable video editing system having one or more features, operations and/or controls; thereafter, a more detailed description of certain embodiments including techniques that may be implemented, for example, by an operator or user. The refocusable video editing system 100 may include one or more, or all of the features, operations and/or controls or may implement one or more, or all of the techniques described herein. As such, refocusable video editing system 100 is neither limited to any single aspect nor embodiment, nor to any combinations and/or permutations of such aspects and/or embodiments. Moreover, each of the features, operations and/or controls of and techniques implemented by refocusable video editing system 100 may be employed alone or in combination with one or more of the other aspects of the present inventions and/or embodiments thereof. For the sake of brevity, many of those permutations and combinations will not be discussed and/or illustrated in combination herein.

Refocusable Video Editing System Layout

An exemplary refocusable video editing system 100 for refocusable video may include, provide, implement, employ, generate and/or output (to, for example, a display of the user interface of system 100) one or more, or all of the following components, features and/or information:

Video Timeline—The video timeline displays video input streams that are available for a final output video.

Set of Key Frames—Within a refocusable video stream, key frames of various types may be set or defined within the video data stream (which includes a plurality of frames). The Key Frame may include a virtual focus parameter. The virtual focus parameter of a key frame may include information which is representative of, determine and/or define:

Focus (depth or subject selection)—Select subject(s) or focus depth.

Aperture—Select aperture.

Exposure

Focus Visual Effects

Inter-frame Interpolation—The system or user may set or define, between key frames, the values (exposure, focus, aperture, and/or etc.) of the video frames which are temporally disposed between the key frames based on one or more interpolation techniques. Notably, any interpolation technique(s) now known or later developed may be used, including but not limited to: nearest neighbor interpolation, linear interpolation, non-linear interpolation, cubic interpolation, Bezier curve interpolation, and/or spline-based interpolation.

Figure 9:
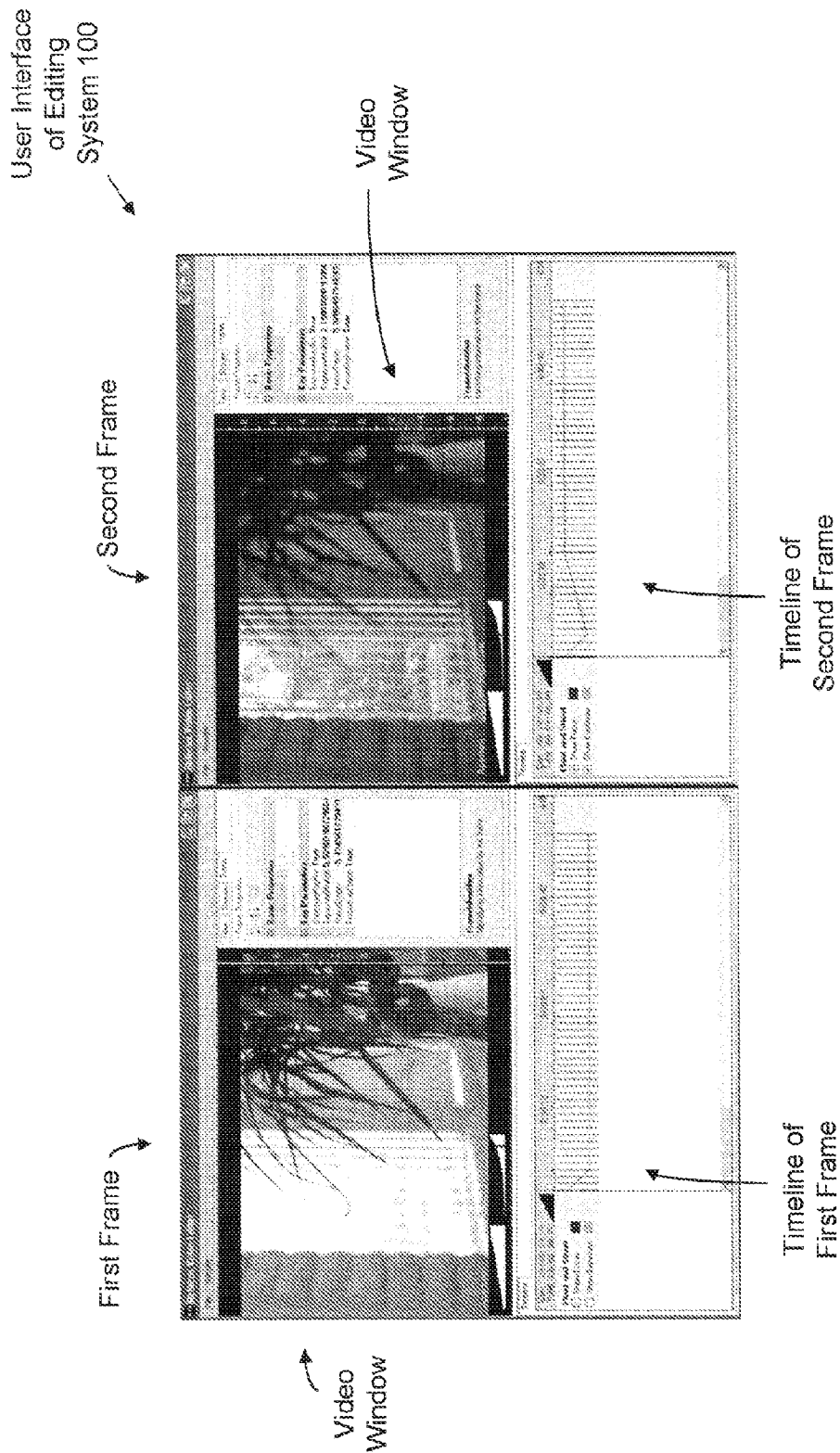
FIG. 9 illustrates "screen-shots" of the display of the user interface of the refocusable video editing system associated with two frames and a corresponding timeline for such frames as generated, output and/or provided by the refocusable video editing system, wherein the two frames may be predetermined and/or key frames as set or defined within the refocusable video editing system according to at least certain aspects of certain embodiments of the present inventions, wherein in a first frame for which the parameters of focus and/or exposure are set or defined in connection with the tree (right side of image) and a second frame for which the parameters of focus and/or exposure are set or defined in connection with the background outside (left side of image—outside the window); in this embodiment, the temporal position of each frame within the video data stream or output is indicated on a timeline below video window.

With reference to FIG. 9, displayed are two views of the display of the user interface of an exemplary refocusable video editing system 100 which is employing refocusable video editing techniques. FIG. 9 depicts two screen shots of the same video stream, taken at different times, displaying two different key frames.

The information displayed in the two views shown in FIG. 9 presents an example of how the user or operator may define or set key frames and thereafter select, define and/or set certain appearance settings, including focus, exposure, and aperture. The following sections present exemplary embodiments over how these appearance key frames may be created and edited. Notably, the user or operator may eliminate, de-select and/or delete existing key frames.

Selection of Focus

In certain embodiments, the user or operator may select the focus based on the depth via instructions to refocusable video editing system 100. The instructions may be communicated to the system 100, for example, via setting the virtual focus parameter of the key frame(s) or subject tracking. For example, the user or operator, via the user interface, may select, determine and/or define a virtual focus parameter in connection with or based on one or more subject(s), and, in response, thereto, processing circuitry in refocusable video editing system 100 may adjust the exposure parameter of the video stream (for example, automatically) based on such subject(s) of interest (for example, change in or movement of the subject(s) of interest).

Notably, a virtual focus parameter may be any data or information directly or indirectly representing a virtual focus. This data or information may be used, when computing an output video frame from a refocusable video data frame, to determine the virtual focus (for example, a focus depth or a tilted plane of focus) at which the output video frame is computed, generated and/or rendered. In one embodiment, the virtual focus parameter may be data or information that specifies a virtual focus depth or a virtual plane of focus. In another embodiment, the virtual focus parameter may be a spatial coordinate (for example, an X,Y position in the frame). The spatial coordinate may correlate to or represent the location of a subject to render in a predetermined focus (for example, in sharp focus). In another embodiment, the virtual focus parameter may be data representing a subject or object (for example, the location and color signature of the subject in the previous frame) that is being tracked (for example, see Focus Tracking herein). In another embodiment, the virtual focus parameter may be data representing two subjects (for example, see multiple subject/object tracking and/or Two Subject Tracking with Tilt-Shift herein). Indeed, a virtual focus parameter may be any data or information directly or indirectly representing a virtual focus whether now known or later developed.

Virtual Focus Key Frames

The virtual focus key frames match a time in a video stream to a focus depth in the scene. In this embodiment, the user or operator may select the parameter of the focus depth for one or more particular times in the refocusable video data stream. In response, refocusable video editing system 100 may interpolate the focus depth between key frames. The selection of key frames and use of such frames to generate, produce, render and/or output focused video output data is shown in FIG. 10.

Notably, in FIG. 10, the user or operator may select a focus of one or more key frames and processing circuitry, using the key frames, may be used to determine the focus depth while generating, producing, rendering and/or outputting the video data. When generating, producing, rendering and/or outputting the video data, the focus is determined using key frames and interpolation between key frames. The interpolation between key frames may be linear or non-linear. Indeed, any interpolation technique(s) now known or later developed may be used, including but not limited to: nearest neighbor interpolation, linear interpolation, non-linear interpolation, cubic interpolation, Bezier curve interpolation, and/or spline-based interpolation.

Gestures for Adding Focus Key Frames

In certain embodiments of the present inventions, the operator or user may incorporate, insert, edit, remove, and/or add key frames through the user interface gestures (or inputs) of system 100. In this regard, the operator or user may choose a mode of operation of refocusable video editing system 100, for example, through a tool selection or state selection via the user interface, such that a gesture/input or series of gestures/inputs incorporate(s), insert(s), edit(s), remove(s), and/or add(s) one or more key frames according to the effect (for example, visual) that the operator is incorporating, implementing and/or providing in the video output. For example, in response to user inputs, refocusable video editing system 100 may incorporate, insert, edit, remove, and/or add one or more key frames in the following manner:

The operator provides a gesture/input to indicate a change in focus depth. For example, the gesture/input may be pointing and clicking on the display of the current frame on the subject or object that the operator would like to be brought into focus; processing circuitry may calculate, determine and/or derive the focus depth of that subject or object, and thereafter calculate, adjust and/or generate the video data/frame having the new (virtual) focus depth, which correlates to or is the depth of the indicated subject or object. As another example, the gesture may be clicking and dragging on a slider that represents the currently displayed focus depth. After the gesture, the system implements the new focus depth by calculating, adjusting, generating, producing and/or outputting the video data/frame of the image using the new focus position corresponding to the subject depth where the operator has pointed. For example, let the old focus depth be A, and the new focus depth be B.

Figure 11A:
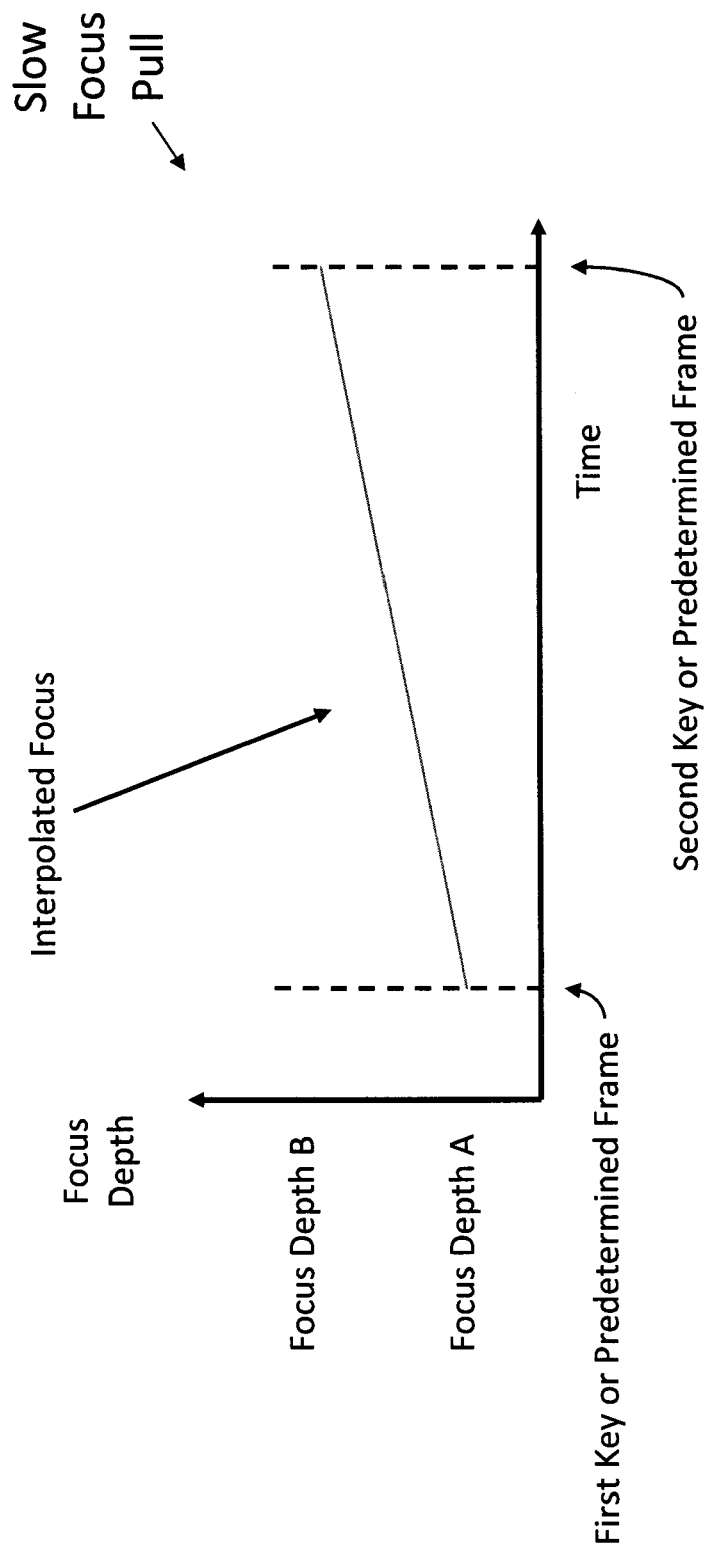
FIGS. 11A-11C illustrate exemplary embodiments of "Slow Focus Pull" according to at least certain aspects of certain embodiments of the present inventions, wherein the user or operator defines, designates and/or inserts key frames having different focus depths and the refocusable video editing system implements a visual effect within the frames of the video data stream that provides an extended transition in the focus depth from the time of the first defined (which was set to a virtual focus parameter of A), designated or set key frame to the second defined, designated or set key frame (which was set to a virtual focus parameter of B)
Figure 11B:
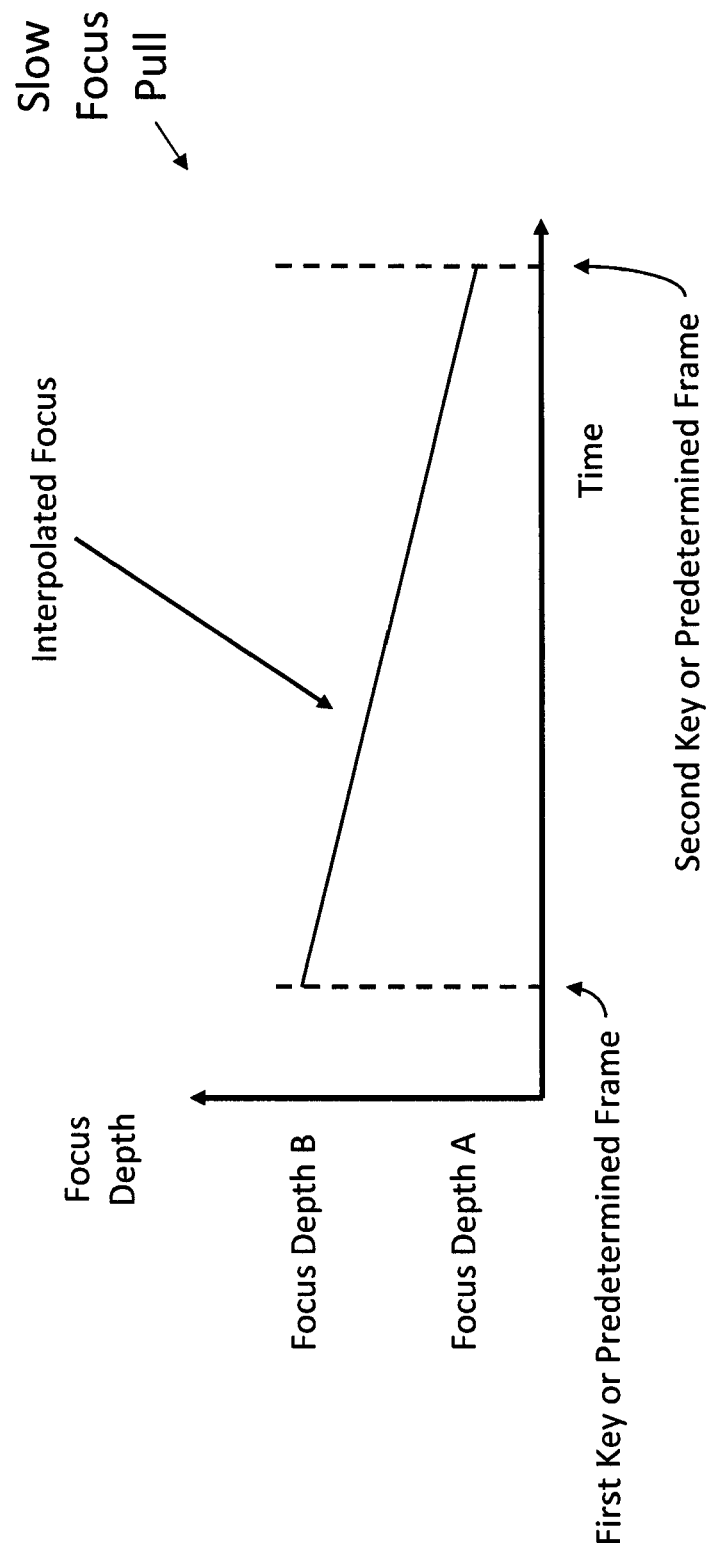
Figure 11C:
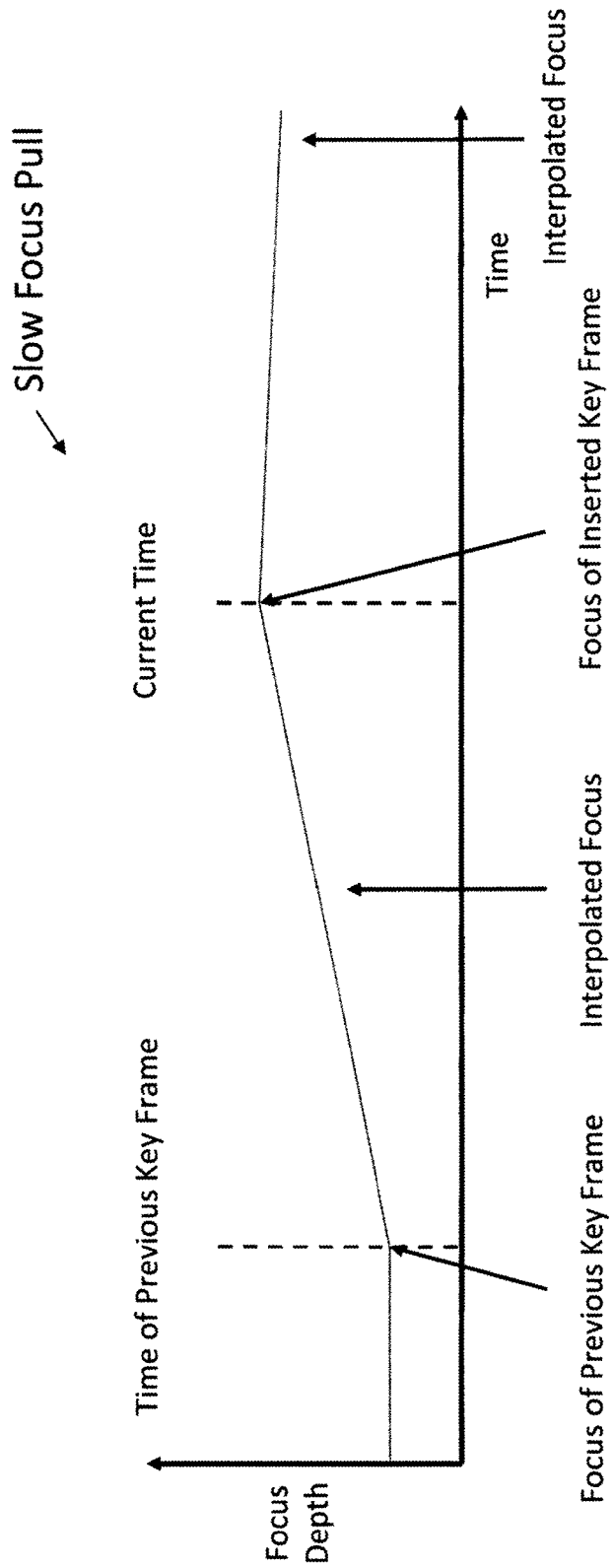

"Slow focus pull"—In one exemplary embodiment of the current inventions, the user or operator, via the user interface of refocusable video editing system 100, defines, designates and/or inserts a key frame at the current time with a focus depth of B. The refocusable video editing system 100 implements a visual effect within the frames of the video data stream that provides an extended transition in the focus depth from the time of the previously (first) defined, designated or set key frame to the newly (second) defined, designated or set (that is, newly added) key frame (which was set to a virtual focus parameter of B). The slow focus pull is graphically illustrated in FIGS. 11A-11C. Notably, the user or operator may implement or include one or more "slow focus pull" techniques in a given video data stream.

Figure 12A:
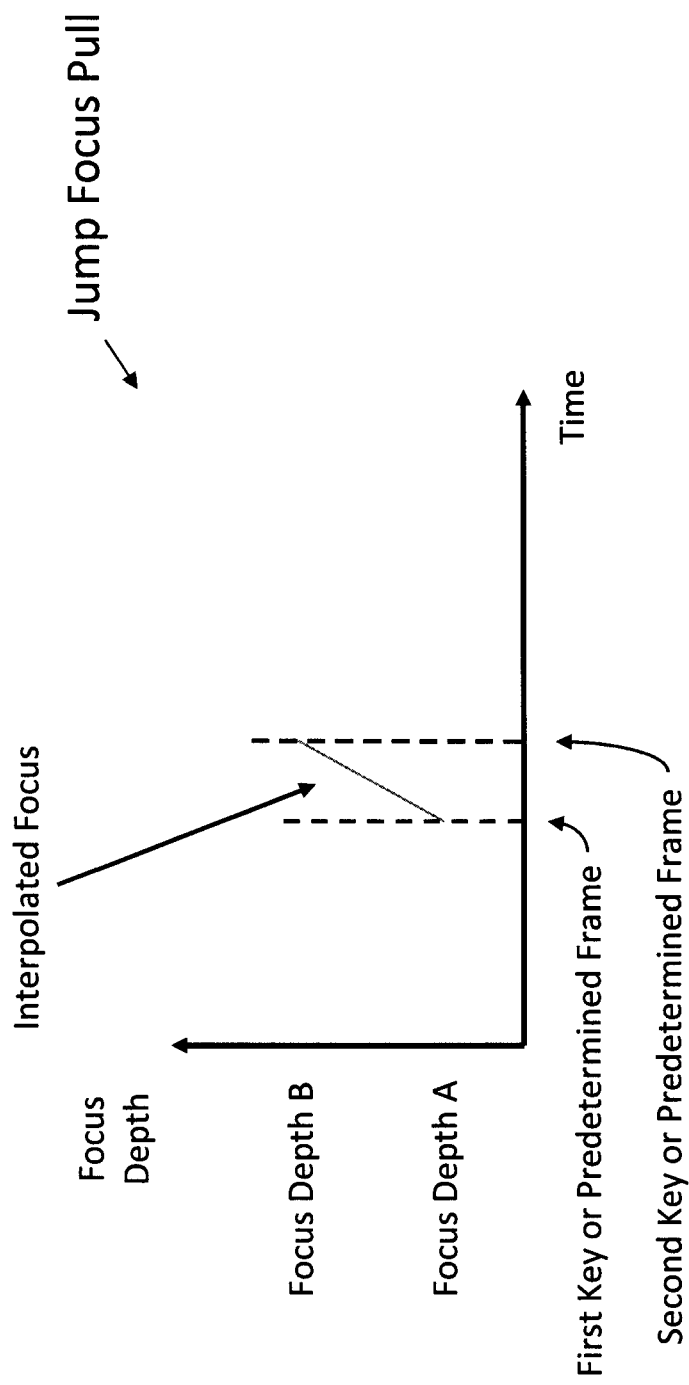
FIGS. 12A-12C illustrate exemplary embodiments of "Jump Focus Pull" according to at least certain aspects of certain embodiments of the present inventions, wherein the user or operator defines, designates and/or inserts a first key frame which includes a focus depth parameter of A (which may be defined, designated and/or set by the user), at a time corresponding to a number of frames before the second key frame which includes a focus depth parameter of B (again, which may be defined, designated and/or set by the user), and the refocusable video editing system implements a visual effect that includes a relatively rapid or quick transition (for example, within 3-5 frames) from the first focus depth to the second focus depth.
Figure 12B:
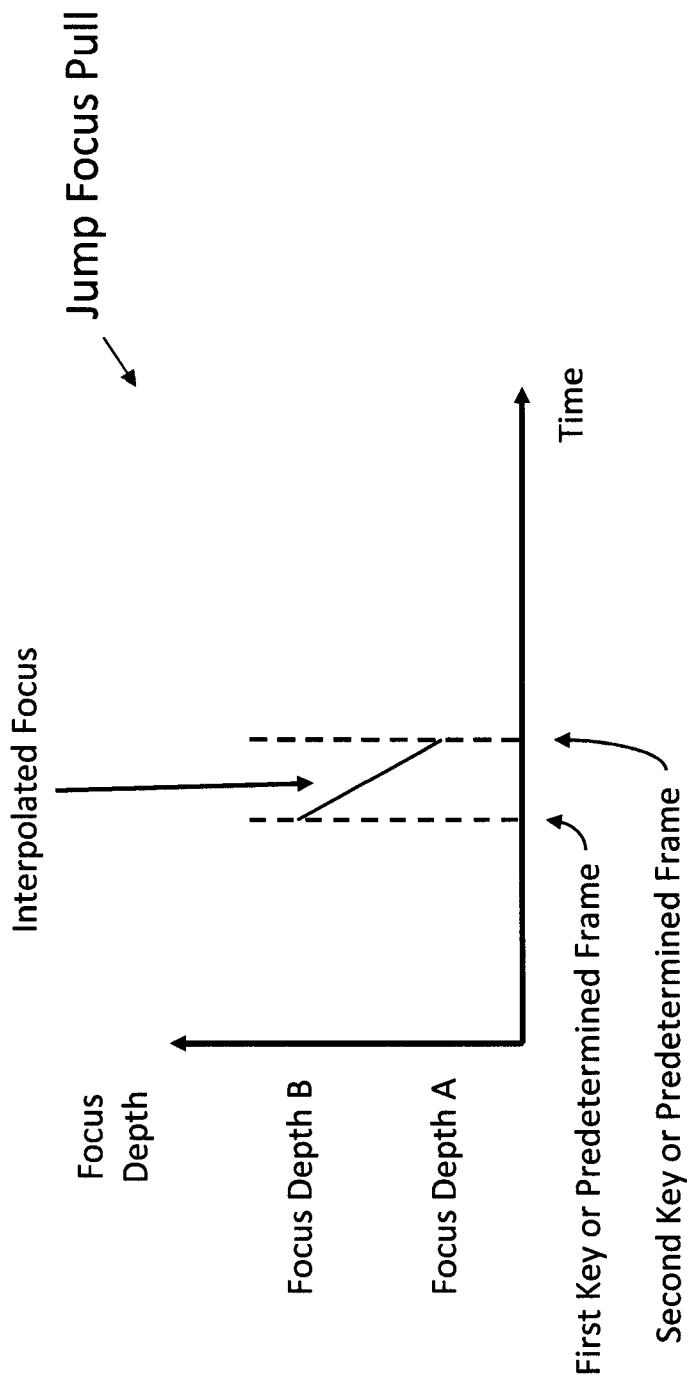
Figure 12C:
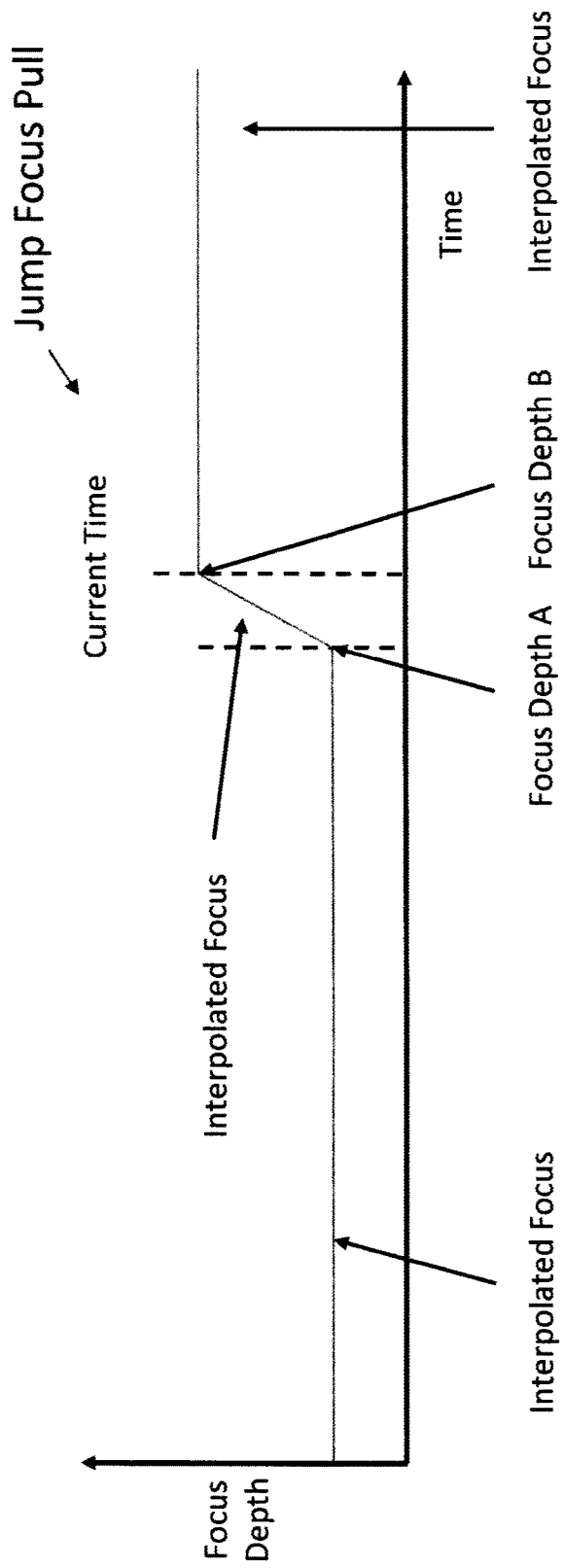

"Jump focus pull"—In another exemplary embodiment, user or operator defines, designates and/or inserts, via the user interface of refocusable video editing system 100, two key frames. The first key frame includes a focus depth parameter of A (which may be defined, designated and/or set by the user), at a time corresponding to a number of frames before the second key frame. The second key frame includes a focus depth parameter of B (again, which may be defined, designated and/or set by the user), which may be relatively close to the focus depth parameter of the currently displayed frame. As such, in this embodiment, refocusable video editing system 100 implements a visual effect that includes a relatively rapid or quick transition (for example, within 3-5 frames) from the previous or first focus depth to the subsequent or second focus depth. This embodiment is graphically illustrated in FIG. 12A-12C. Notably, the user or operator may implement or include one or more "jump focus pull" techniques in a given video data stream.

Figure 13A:
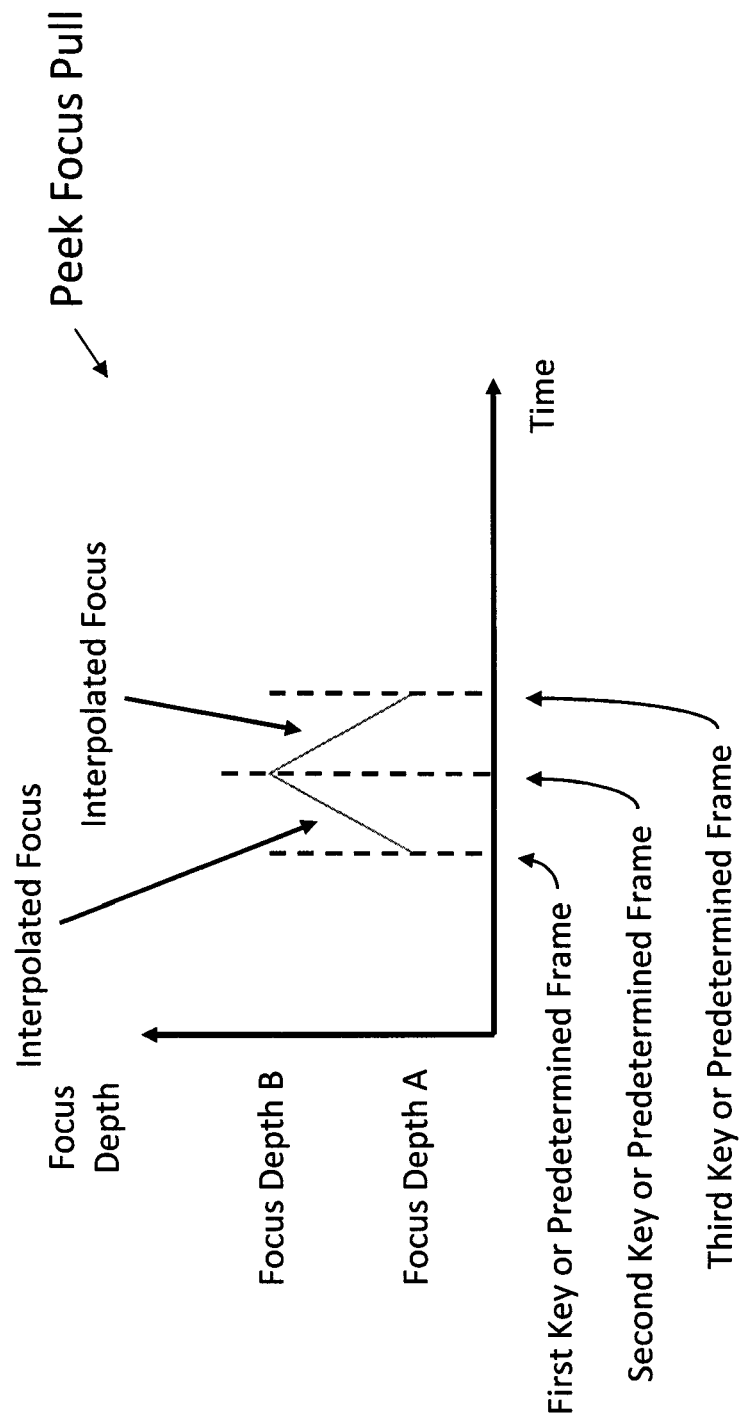
FIGS. 13A-13C illustrate exemplary embodiments of "Peek Focus Pull" according to at least certain aspects of certain embodiments of the present inventions, wherein the user may define, designate and/or insert three key frames as well as define and/or designate the focus depth of each key frame such that the first and third key frames may be set to a focus depth parameter of A, and the second key frame is set of a focus depth parameter of B, and the refocusable video editing system implements a visual effect that includes a temporary transition from the original focus depth, to the new focus depth and back to the original focus depth.
Figure 13B:
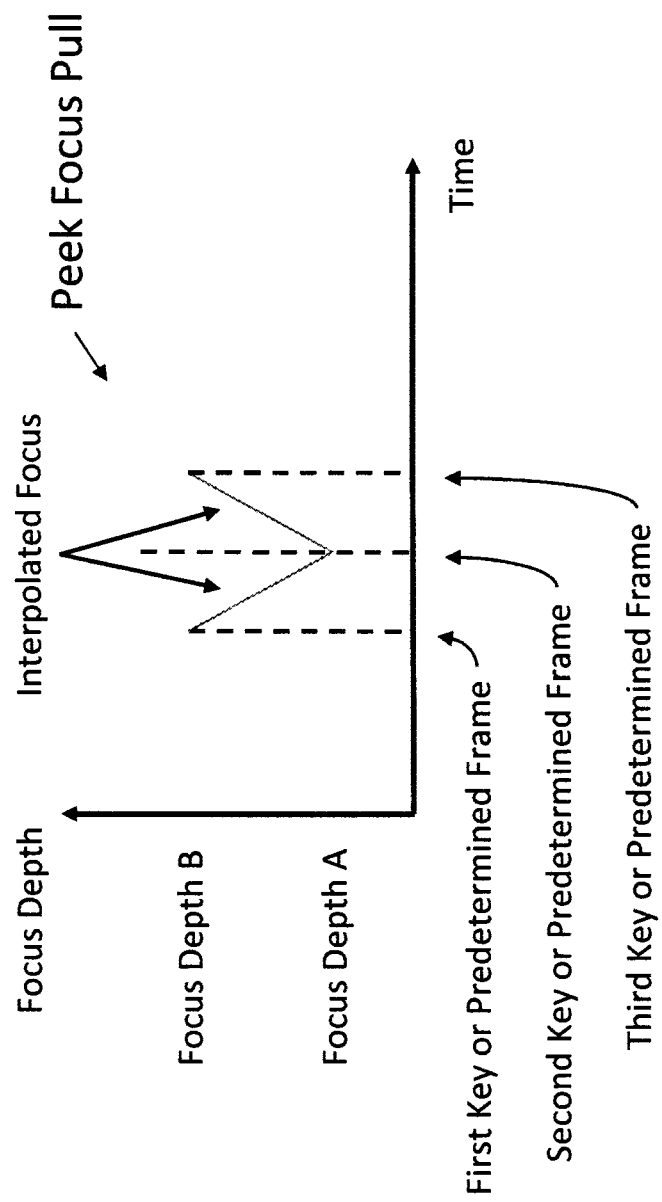
Figure 13C:
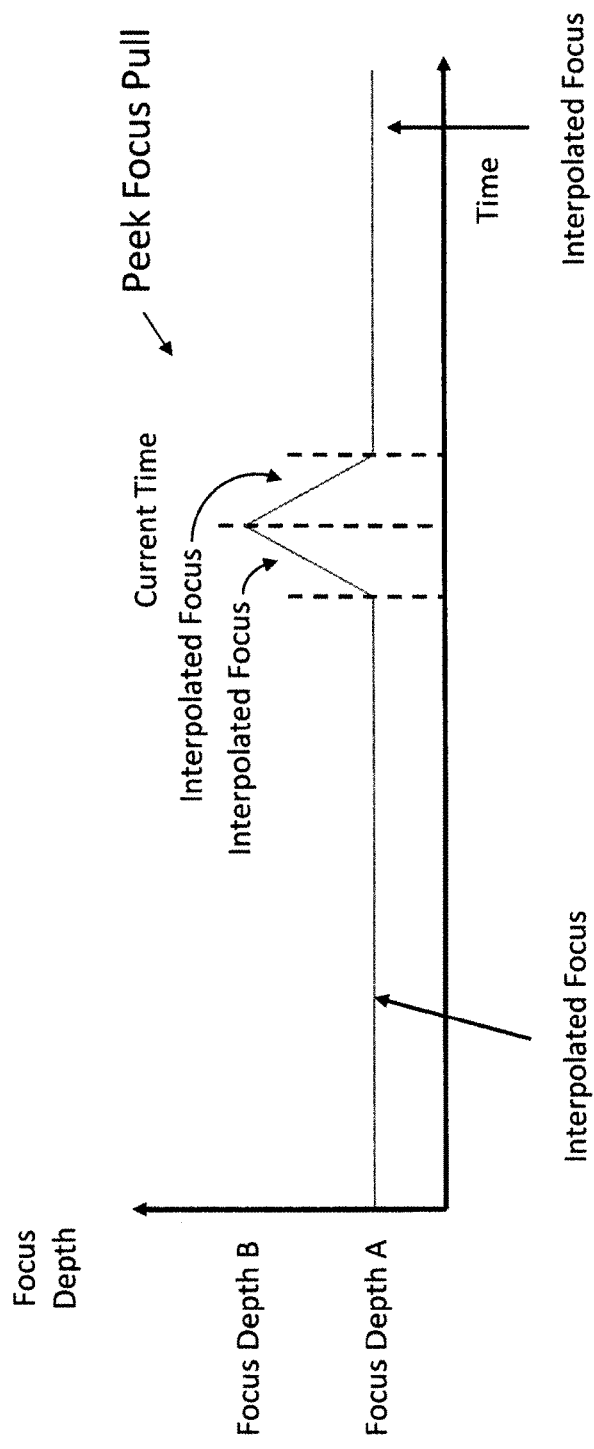

"Peek focus pull"—In yet another exemplary embodiment, the user may define, designate and/or insert three key frames as well as define and/or designate the focus depth of each key frame, via the user interface of refocusable video editing system 100. The first and third key frames may be set to a focus depth parameter of A, wherein there are a number of frames before and after the second key frame. As such, in this embodiment, refocusable video editing system 100 implements a visual effect that includes a temporary transition from a first focus depth (A) to the second focus depth (B) and back to the initial, first or original focus depth (A). This embodiment is graphically illustrated in FIG. 13A-13C. Notably, the user or operator may implement or include one or more "peek focus pull" techniques in a given video data stream.

In another exemplary embodiment, a multi-step gesture/input may be implemented or used to, for example, provide control over the duration of a focus pull or a portion thereof. For example, the gesture may correspond to a click, drag and release of the mouse. That is, the click on the current frame chooses the new focus depth corresponding to the indicated subject. Let the old focus depth be A, and the new focus depth be B. The drag transitions the video backwards in time according to how far it has been dragged. The release sets the start time of the focus pull. Two key-frames are designated, defined inserted and/or added: the first is at the time corresponding to the release, at focus depth A; the second is at the time corresponding to the click, at focus depth B. Thus, in this embodiment, the user may define, determine and/or designate the duration of a focus pull, or a portion thereof.

Notably, the user interface of refocusable video editing system 100 may include any input device (for example, pointing device such as a mouse or trackball—see, for example, the user interface of FIG. 5). In this regard, the pointing device is employed to allow or facilitate the user or operator to define, designate, incorporate, insert, edit, remove, and/or add one or more key frames through user-interface gestures. Indeed, where an embodiment (or example thereof) is described or explained in the context of a mouse or trackball user interface, any user interface to input data or commands may be employed.

Moreover, those skilled in the art will understand through these examples that any number of desired focus transitions can be created, edited, and/or removed near the currently displayed depth through a single or series of coordinated gestures/inputs. That is, the present inventions are neither limited to any single aspect nor embodiment of the desired focus transitions through one or more coordinated gestures/inputs, nor to any combinations and/or permutations of such aspects and/or embodiments thereof. Moreover, each of the aspects of the present inventions, and/or embodiments thereof, may be employed alone or in combination with one or more of the other aspects of the present inventions and/or embodiments thereof.

Focus Tracking

In one exemplary embodiment, in response to user or operator inputs, refocusable video editing system 100 may focus on one or more subjects/objects (hereinafter collectively "subject/object" and "subjects/objects" are collectively "subject" and "subjects" respectively) and adjust and track the virtual focus parameter based thereon. As such, in this embodiment, the user or operator designates, defines and/or identifies one or more subjects for tracking a scene and refocusable video editing system 100 adjusts the virtual focus parameter of the designated frames to provide a focus depth such that the subject(s) is/are always in user predetermined or defined focus (for example, the subject(s) in the refocusable video data is/are located in the focus plane). The video editing system 100 implements techniques to track (from a focus perspective) the subject(s) in the video data stream and automatically select(s) the focus depth such that the subject(s) is/are in a predetermined, selected and/or defined focus (for example, always in focus) for a given or predetermined period of contiguous frames or time.

In one exemplary embodiment, the operator or user of a refocusable video editing system may define, determine and/or select (i) the subject tracking focus key frames by selecting a frame of interest at a particular time, (ii) the subject(s) of interest in the frame(s), and/or (iii) the focal plane or focus for the subject or each of the subject(s) (on an individual subject or collective basis). Exemplary implementations of subject tracking focus embodiment processes are shown in FIGS. 14A and 14B.

Figure 15:
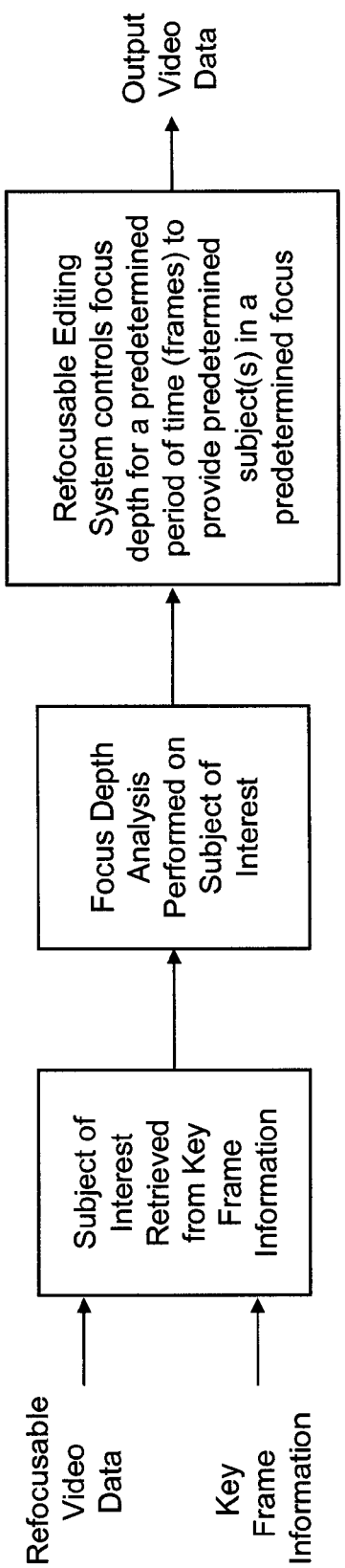
FIG. 15 illustrates an exemplary embodiment of "Focus Subject Tracking" according to at least certain aspects of certain embodiments of the present inventions, wherein in response to user or operator inputs, the refocusable video editing system may adjust, control and/or manage the focus on one or more subjects; notably, the virtual focus parameter of the designated frames may be user defined such that the system provides a focus depth of the designated subject(s) for a predetermined set of frames wherein such subject(s) is/are always in user predetermined or defined focus (for example, the designated subject(s) in the refocusable video data is/are located in the focus plane)

These selection methods are exemplary; refocusable video editing system 100 may employ other subject key frame selection process to define, determine and/or select the subject tracking focus embodiment. In one embodiment, after the user or operator defines, determines and/or selects subject tracking key frames, refocusable video editing system 100 employs the subject focus key frames to control, select, adjust and/or manage a focus depth of the refocusable video data (from refocusable video acquisition system 10) with which to generate, produce, render and/or output video data that includes a predetermined focus depth. In one exemplary embodiment, refocusable video editing system 100 obtains or retrieves the location of the subject of interest from the subject focus key frame. In this exemplary embodiment, refocusable video editing system 100 assesses, determines and/or performs depth analysis on the location of the subject of interest in the refocusable video data (acquired by refocusable video acquisition system 10) to find the focus depth of a predetermined focus (for example, the sharpest focus). As stated above, refocusable video editing system 100 modifies, changes, generates, produces, renders and/or outputs video data (using the refocusable video data acquired by refocusable video acquisition system 10) wherein the focus depth of such video data is controlled, selected, adjusted and/or managed for a predetermined period of time (frames) to provide predetermined subject(s) in a predetermined focus. An exemplary embodiment of the flow of the focus subject tracking is illustrated in FIG. 15.

Notably, exemplary methods for implementing depth analysis on image data are described in U.S. patent application Ser. No. 11/948,901 and U.S. Pat. No. 5,076,687. In one embodiment, selects and/or employs this focus depth as the focus depth for generating, producing, rendering and/or outputting the 2D frame.

Figure 16:
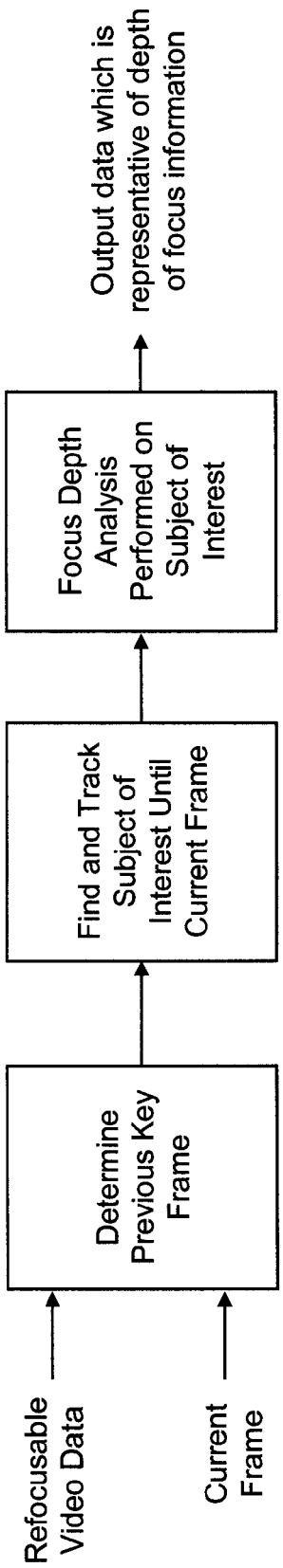
FIG. 16 illustrates an exemplary embodiment of the focus depth analysis for a predetermined amount of time of the video data or predetermined number of frames (for example, between key frames), according to at least certain aspects of certain embodiments of the present inventions.

In one embodiment, refocusable video editing system 100 may interpolate the "correct" or predetermined depth of subject focus between subject tracking key frames from the previous subject focus key frame by tracking the subject of interest and performing depth analysis on the tracked subject (for example, analyzing or determining the depth on the tracked subject). In one exemplary embodiment, for frames that are not subject focus key frames, the previous subject tracking key frame in the refocusable video data may be located, and the subject of interest may be tracked and/or identified through the intermediate frames until the frame of interest. In this exemplary embodiment, the focus depth may be determined by applying depth analysis on the location of the tracked subject of interest. The flow of this embodiment is displayed in FIG. 16.

Where multiple subjects are tracked, subject tracking and subject focus analysis may be performed independently for each subject as described above. In an exemplary embodiment, the independent focus depths of predetermined focus for each subject (for example, the depth at which each subject is in a predetermined focus, for example, a sharpest focus) may be "combined" to determine the final focus of the frame (for example, by selecting a virtual focal depth for the output image that is approximately the average of the predetermined focal depths for the individual subjects).

In one exemplary embodiment, the subject tracking system may work in the following manner:

For the subject key frame, an output frame may be generated using a small computed aperture.

For the subject(s) of interest chosen, regional pixel analysis may be performed on the output frame for the region(s) of the frame corresponding to the subject(s) of interest. In some embodiments, the regional pixel analysis may analyze the frame region(s) for image content, which may include the average color of the region, shapes and colors of portions of the region(s) as determined by an image segmentation algorithm, edge information based on color derivatives in the region(s), and/or statistical metrics of the contrast, brightness, and/or color variation in the region(s).

For each subsequent frame, the region(s) containing the subject(s) of interest is/are determined in the following manner:

An output frame may be generated using a small computed aperture.

For each of the subject(s) of interest, a set of possible regions for the subject in the current frame may be computed using the corresponding regions(s) of interest from the previous frame(s). In one embodiment, the set of possible regions in the current frame the permutations of translations of the region(s) of interest in the previous frame within N pixels (for example, 20 pixels), rotation within M degrees (for example, 5 degrees), and growing or shrinking the region within P percent (for example, 5 percent).

For each subject of interest and possible region for the subject in the current frame, regional pixel analysis may be performed on the output frame for the possible region of the frame corresponding to the subject(s) of interest. In some embodiments, the regional pixel analysis may analyze the frame region(s) for image content, which may include the average color of the region, shapes and colors of portions of the region(s) as determined by an image segmentation algorithm, edge information based on color derivatives in the region(s) (for example, by creating a derivative image), and/or statistical metrics of the contrast, brightness, and/or color variation in the region(s).

For each subject of interest, the selected region of interest for the subsequent frame may the possible region of interest with the regional pixel analysis that most closely matches the regional pixel analysis of the selected region of the previous frame. In some embodiments, the most closely matching region may be the region with the most similar average color. In some embodiments, the most closely matching region may be the region where the cross-correlation score of a derivative image of the possible region and the derivative image of the region of interest from the previous frame is the highest.

Indeed, the subject tracking may be performed by any object tracking system now known or later developed, including but not limited to: a blob tracking algorithm, kernel-based tracking, contour tracking, or feature matching. Notably, in certain specific embodiments, the various tracking algorithms implemented by refocusable video editing system 100 may be provided with output video frames with a reduced generated or computed aperture size.

Auto-Exposure or Predetermined Exposure Adjustment/Correction

Figure 17A:
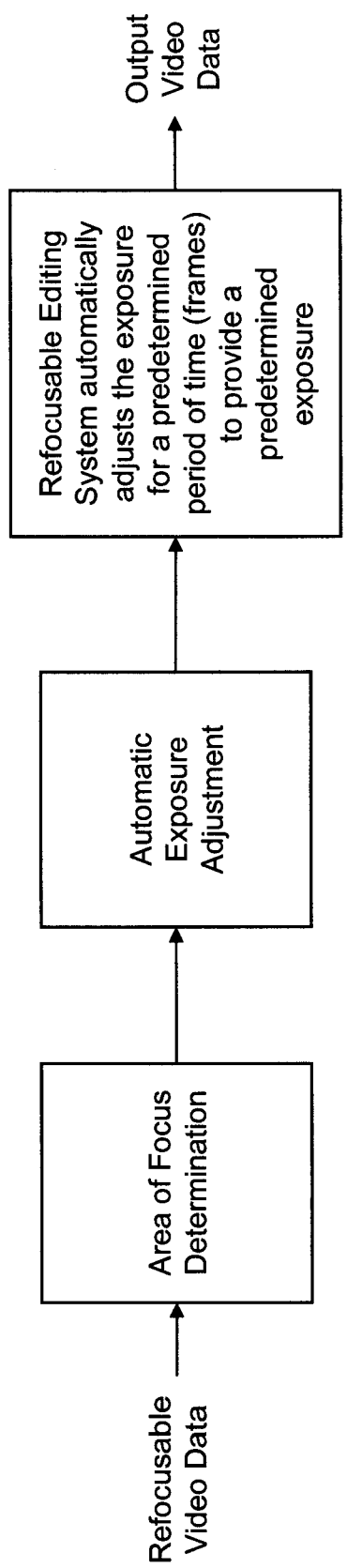
FIGS. 17A and 17B illustrate exemplary embodiments of exposure correction and/or adjustment based on subject or area analysis of refocusable video data, according to at least certain aspects of certain embodiments of the present inventions; in these exemplary embodiments, the refocusable video editing system may control, manage, adjust and/or change the exposure parameter of a predetermined amount of refocusable video data (acquired by refocusable video acquisition system) so that, for example, the subject(s) of focus or area(s) of focus are exposed correctly and/or exposed in a predetermined manner.
Figure 17B:
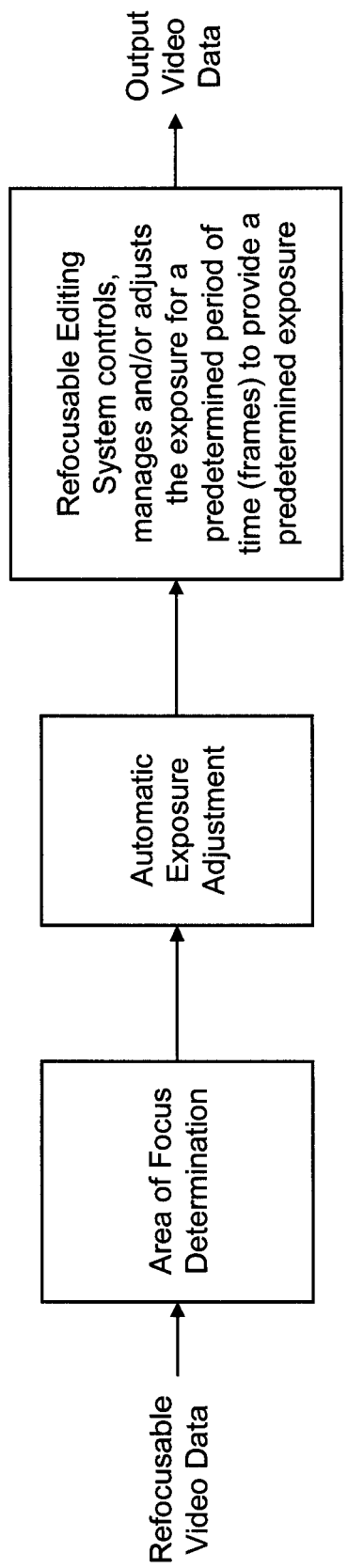

In many lighting situations, the exposure values for one subject or scene portion may not be suitable, optimum or appropriate for another subject or scene portion. (See, for example, FIG. 9). With that in mind, in one exemplary embodiment, refocusable video editing system 100 may control, manage, adjust and/or change the exposure parameter of a predetermined amount of refocusable video data (acquired by refocusable video acquisition system 10) so that, for example, the subject(s) of focus or area(s) of focus are exposed correctly and/or exposed in a predetermined manner. The exposure may be based or depend on the subject and/or area that is/are "in focus" or designated to be in a predetermined focus within the scene. Two exemplary embodiments of the flow thereof are displayed in FIGS. 17A and 17B.

In an exemplary embodiment of auto-exposure correction, refocusable video editing system 100 may analyze one or more frames of refocusable video data (acquired by refocusable video acquisition system 10) to automatically determine the subject or area of focus (for example, by finding the areas of sharpest detail). Based on the automatically determined subjects or areas of focus, the system may control, manage, adjust and/or change the exposure parameter of the frame (for example, to maximize image contrast on the subject of focus) and/or subsequent frames which include such subject or area. The refocusable video editing system 100 may employ any automatic exposure technique(s) now known or later developed including techniques based on minimum information loss or analysis of histograms.

Notably, processing circuitry may generate, calculate and/or determine a virtual exposure parameter associated with selected refocusable video data or frames. The processing circuitry may implement the virtual exposure parameter by generating, computing and/or outputting video data or frames using (i) the refocusable video data temporally corresponding to the output video data or frames and (ii) the virtual exposure parameter.

Selection of Aperture

The refocusable video editing system 100 may generate output video (using refocusable video data (acquired by refocusable video acquisition system 10) having a virtual aperture wherein the virtual aperture of the generated or computed images (i.e., output video) may be varied in, for example, manually, automatic and/or in a predetermined manner.

Aperture Parameter Key Frames

In one exemplary embodiment, refocusable video editing system 100 analyzes, determines and/or employs an aperture size (for example, which may be user defined or input) of key or predetermined frames. In this embodiment, the user or operator may determine key frames and set, define and/or determine aperture size and/or aperture shape parameter(s) associated with such key or predetermined frames. The refocusable video editing system 100 may modify and/or change the aperture size and/or shape parameters of the video data associated with one or more frames of refocusable video data (acquired by refocusable video acquisition system 10) in accordance with such parameter(s). That is, processing circuitry may generate, calculate and/or determine a virtual aperture size and/or virtual aperture shape parameter(s) associated with such key frames for the refocusable video data associated with the key frames. Thereafter, processing circuitry may implement the virtual aperture size and/or virtual aperture shape parameter(s) in a manner discussed herein in connection with key frames. That is, processing circuitry may generate, compute and/or output video data or frames using (i) the refocusable video data temporally corresponding to the output video data or frames and (ii) corresponding virtual aperture size and/or virtual aperture shape.

Moreover, refocusable video editing system 100, based on the aperture size and/or aperture shape parameter(s) of the key frames, may interpolate between the key frames to determine the aperture size and/or aperture shape parameters for all times in the video. Briefly, with reference to FIG. 18, a flow of a selection of aperture key frames, using the key frames while generating, outputting and/or rendering the 2D video as output video data. Aperture key frames may be selected by the user or operator. When rendering, refocusable video editing system 100 may determine the aperture to use based on the parameters of the key frames and interpolation between key frames. The processing circuitry may implement the virtual aperture size and inter-frame interpolation in a manner discussed herein in connection with key frames. In this regard, processing circuitry may generate, compute and/or output video data or frames using (i) the refocusable video data temporally corresponding to the output video data or frames and (ii) the corresponding virtual aperture size and (iii) inter-frame interpolation, which may modify, modulate and/or change the virtual aperture size for a given output video data or frames.

Notably, any interpolation technique now known or later developed may be used, including but not limited to: nearest neighbor interpolation, linear interpolation, non-linear interpolation, cubic interpolation, Bezier curve interpolation, and spline-based interpolation.

Aperture Selection to Include Subjects of Interest

In yet another exemplary embodiment of the present inventions, refocusable video editing system 100 set, employ and/or adjust the (virtual) aperture of the refocusable video data to include one or more subjects of interest contained or imaged in such refocusable video data. The refocusable video editing system 100 may automatically select an aperture (and, in another embodiment, a focal depth) that maintains and provides the subject(s) of interest in a given, selected and/or predetermined focus by modifying the refocusable video data (acquired by the refocusable acquisition system 10) such that that all subjects are included within the resulting depth of field). In this regard, refocusable video editing system 100 may change or varying the virtual aperture size and virtual focal depth of the refocusable video data to provide the subjects to be included within the resulting depth of field. That is, processing circuitry may generate, calculate and/or determine a virtual aperture size and virtual focal depth for the refocusable video data that provides the subjects to be included within the resulting depth of field. The processing circuitry may generate, compute and/or output video data or frames using the refocusable video data and such virtual aperture size and virtual focal depth.

In addition thereto, in one embodiment, the user or operator may initially establish or select an aperture and the system may, thereafter, maintain the subject(s) of interest in a given, selected or predetermined focus. In some embodiments, the user or operator may establish or select a minimum focus score, as determined by a focus analysis metric, for each of the subject(s) of interest. In these embodiments, the system may choose the maximum aperture (and hence, the most limited depth of field) that maintains the minimum focus score for the subject(s) of interest. In these embodiments, scores for any focus metric now known or later developed may be used.

In one embodiment, the user or operator may identify or indicate subject(s) of interest, via the user interface of refocusable video editing system 100, by outlining such subject(s) as described above (for example, two or more regions corresponding to subjects of interest). In another exemplary embodiment, refocusable video editing system 100 may automatically determine subject(s) of interest using analysis techniques as described herein.

Visual Effects

In another set of exemplary embodiments, refocusable video editing system 100, using the refocusable video data and in response to user inputs, implements and/or renders visual effects into output video. Here, the input data is refocusable video data, and the output is output video that contains such visual effects. Exemplary embodiments of the visual effects are provided immediately below, however, it should be noted that such exemplary embodiments are not intended to limit the scope of the present invention.

Two Subject Tracking with Tilt-Shift

Figure 19:
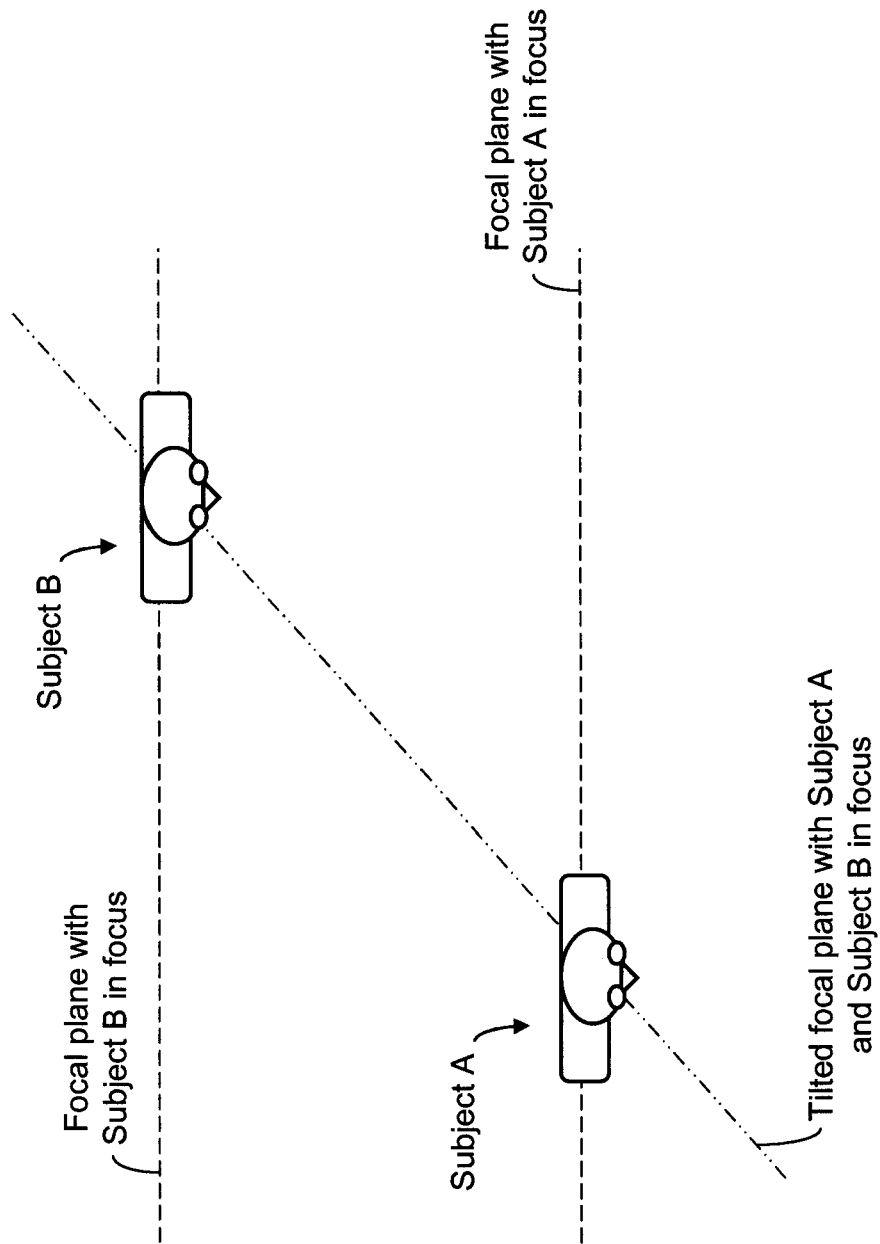
FIG. 19 illustrates a scene (viewing from overhead) having two subjects in different focal planes; both subjects may be displayed "in-focus" wherein one of the focal planes is skewed or "tilted" (or off-axis) relative to the other focal plane (for example, the focal plane of the optics of the refocusable video acquisition unit during acquisition, sampling and/or capture of the refocusable video data) wherein the refocusable video editing system may simulate a tilt-shift lens in generating output video using the refocusable video data.
Figure 20:
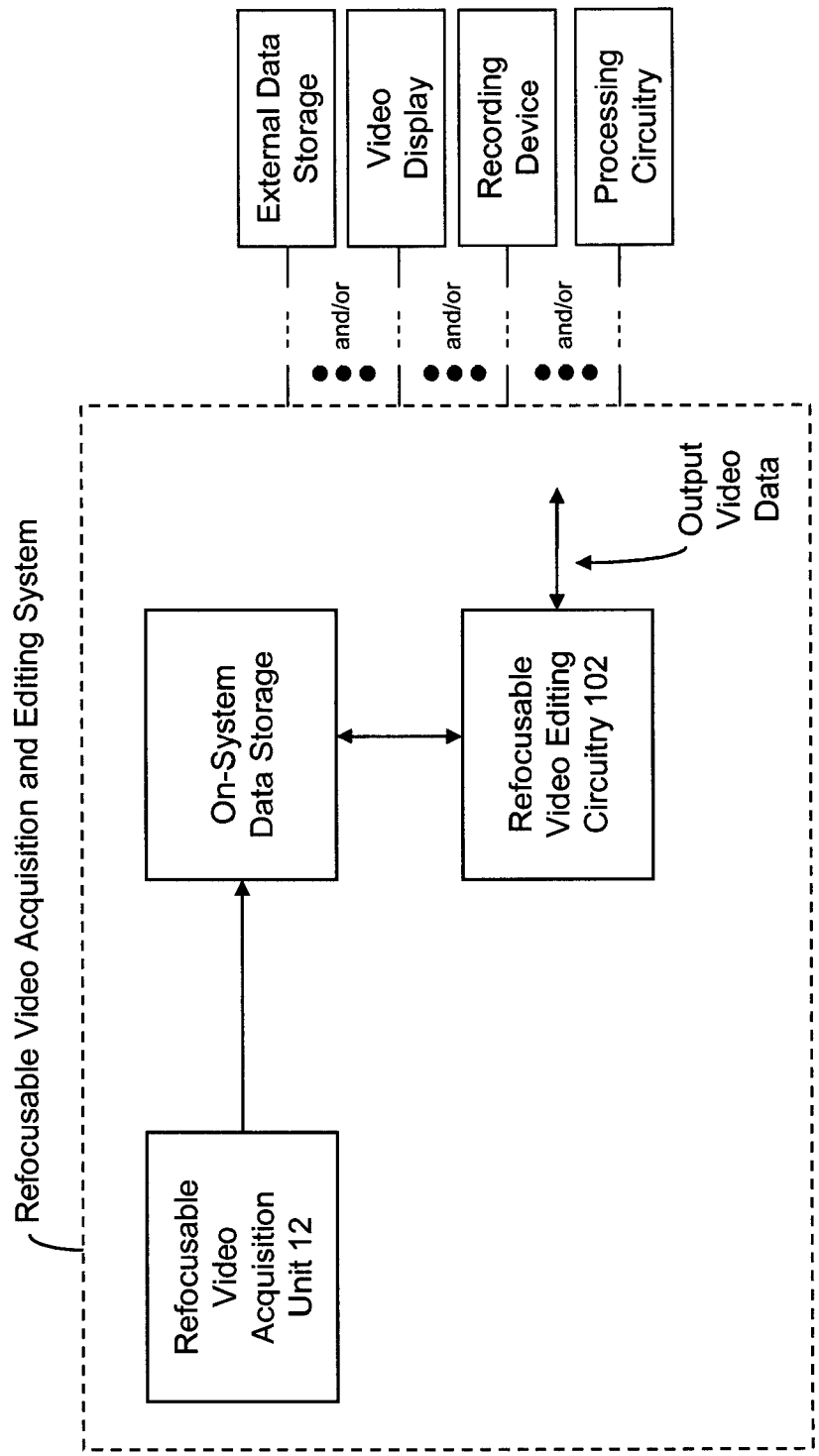
FIG. 20 is a block diagram representation of an exemplary refocusable video acquisition and editing system having refocusable video acquisition systems integrated with the refocusable video editing circuitry, according to at least certain aspects of certain embodiments of the present inventions; notably, the refocusable video acquisition and editing system, in certain embodiments, couple to external systems/devices (for example, external storage, data processing circuitry, video display, recording device and/or data storage)

In an exemplary embodiment, refocusable video editing system 100 may generate output video data having at least one focal plane that is skewed (or off-axis) relative to a second focal plane (for example, the focal plane of the optics of the refocusable video acquisition unit 12 during acquisition, sampling and/or capture of the refocusable video data. For example, with reference to FIG. 19, in one embodiment, the user or operator may select two or more subjects of focus wherein a first subject is in a first focal plane which is parallel to the focal plane of refocusable video acquisition unit 12 and a second subject is in a second focal plane which is different from the first focal plane and also parallel to the focal plane of refocusable video acquisition unit 12. Here, processing circuitry calculates, determines and/or derives virtual focus characteristic(s) or parameter(s) including the location of the focal plane(s), aperture(s) and/or focus effect(s) (that is, where to focus and/or the amount of focus) to provide a focal plane that is skewed (or off-axis) relative to a second focal plane (for example, the focal plane of the optics of the refocusable video acquisition unit during acquisition, sampling and/or capture of the refocusable video data). The refocusable video editing system 100, for example, may simulate a tilt-shift lens in computing output video using the refocusable video data. In this way, refocusable video editing system 100 may generate output video having the subjects in a predetermined focus (for example, both subject in sharp focus), regardless of their differences in focal depth. In the case of three subjects, the system and technique may choose a desired focal plane that "passes through" the three subjects.

Notably, in one exemplary embodiment, the user or operator may create and configure such "tilt-shift focus" key frames in the video, and thereafter system and technique may interpolate between the various key frames (for example, by automatically tracking subjects between key frames to maintain selected subjects in a predetermined focus, for example, a sharpest focus).

In one exemplary embodiment, refocusable video editing system 100 may decompose the plane equation for key frames into a composition of a rotation and a translation; the refocusable video editing system 100 may interpolate the rotations in quaternion space, and interpolates the translation in Euclidean space. The refocusable video editing system 100, and technique implemented thereby, may employ any interpolation technique now known or later developed, including but not limited to the following: nearest neighbor interpolation, linear interpolation, non-linear interpolation, cubic interpolation, Bezier curve interpolation, and spline-based interpolation.

Subject Isolation

In another exemplary embodiment, refocusable video editing system 100, in response to user or operator inputs, may visually isolate one or more subjects to, for example, to direct a viewer's gaze onto the subject region. In this embodiment, the user or operator may specify one or more regions of the image where one or more subjects are to be visually isolated, using a focus effect. The processing circuitry in system 100 may thereafter generate, compute and/or output video data wherein the predetermined or identified subject(s) are in a first focus (for example, in focus), and the regions surrounding the subject(s) are in a second focus (for example, blurred). This embodiment may simulate an optical aberration in connection with the refocusable video acquisition system 10.

In one embodiment, the user or operator may define and/or set key frames that identify these regions, and processing circuitry in refocusable video editing system 100 may generate, compute and/or output video data by interpolating between such key frames. In another exemplary embodiment, the key frames comprise a 3-tuple (x,y,r), where (x,y) is the center of the region, and r is a radius of the desired focus region. The processing circuitry in refocusable video editing system 100, and technique implemented thereby may interpolate between the 3-tuples at each key frame to determine the values at any point in the video. Notably, any interpolation technique now known or later developed may be used, including but not limited to the following: nearest neighbor interpolation, linear interpolation, non-linear interpolation, cubic interpolation, Bezier curve interpolation, and spline-based interpolation.

In another exemplary embodiment, refocusable video editing system 100 may isolate the subject by generating and/or computing video data that would have been produced by a lens (of the optics of refocusable video acquisition system 10) with an aberration, wherein such lens is optically focused on the subject region, and other areas are blurred to optical lens aberration. In this regard, processing circuitry generates, calculates and/or determines a virtual focus for the refocusable video data that provides the predetermined aberration. The processing circuitry may then generate, compute and/or output video data or frames using the refocusable video data and such virtual focus.

In yet another exemplary embodiment, the aberration corresponds to the aberration from a lens where the optical axis is tilted to approximately point at the subject of interest, and the optical focus approximately intersects the subject of interest. In a specific exemplary embodiment, the lens may be a single lens element, such as a planoconvex or double convex lens. In one exemplary embodiment, the lens may be a doublet lens. In this embodiment, processing circuitry generates, calculates and/or determines a virtual focus for the refocusable video data that provides the predetermined aberration as described immediately above. Thereafter, processing circuitry may generate, compute and/or output video data or frames using the refocusable video data and such virtual focus.

Notably, those skilled in the art will understand through these examples that any number of desired lenses or systems of lenses may be modeled. That is, the present inventions are neither limited to any single set of lenses or system of lenses nor embodiment of simulated lens aberrations. Moreover, each of the aspects of the present inventions, and/or embodiments thereof, may be employed alone or in combination with one or more of the other aspects of the present inventions and/or embodiments thereof.

In yet another exemplary embodiment, the user or operator may select, define, identify or indicate, via the user interface of refocusable video editing system 100, a subject to be tracked, for example, as described herein. The system and technique may thereafter compute output video data having frames where the subject is maintained or kept in focus (or in a certain predetermined or first focus), and surrounding regions are maintained or kept is a second or different focus (for example, blurred out), for example with the optical aberration effect as described above.

Split-Screen Focus

In another exemplary embodiment, refocusable video editing system 100, in response to user or operator inputs which define a plurality of key frames wherein each key frame includes a plurality of N regions and focus depth of each region may be controlled or defined separately. The refocusable video editing system 100, and technique implemented therein, may interpolate the focus in each of the N regions independently in successive or preceding frames of the refocusable video data. As before, any interpolation technique now known or later developed may be used, including but not limited to: nearest neighbor interpolation, linear interpolation, non-linear interpolation, cubic interpolation, Bezier curve interpolation, and spline-based interpolation.

Notably, any method or system now known or later developed for determining focus and/or generating, producing or creating output video data may be performed in any of the N regions. Indeed, each region may use the same, similar, or different systems for determining and/or generating, producing or creating output video data.

Figure 26:
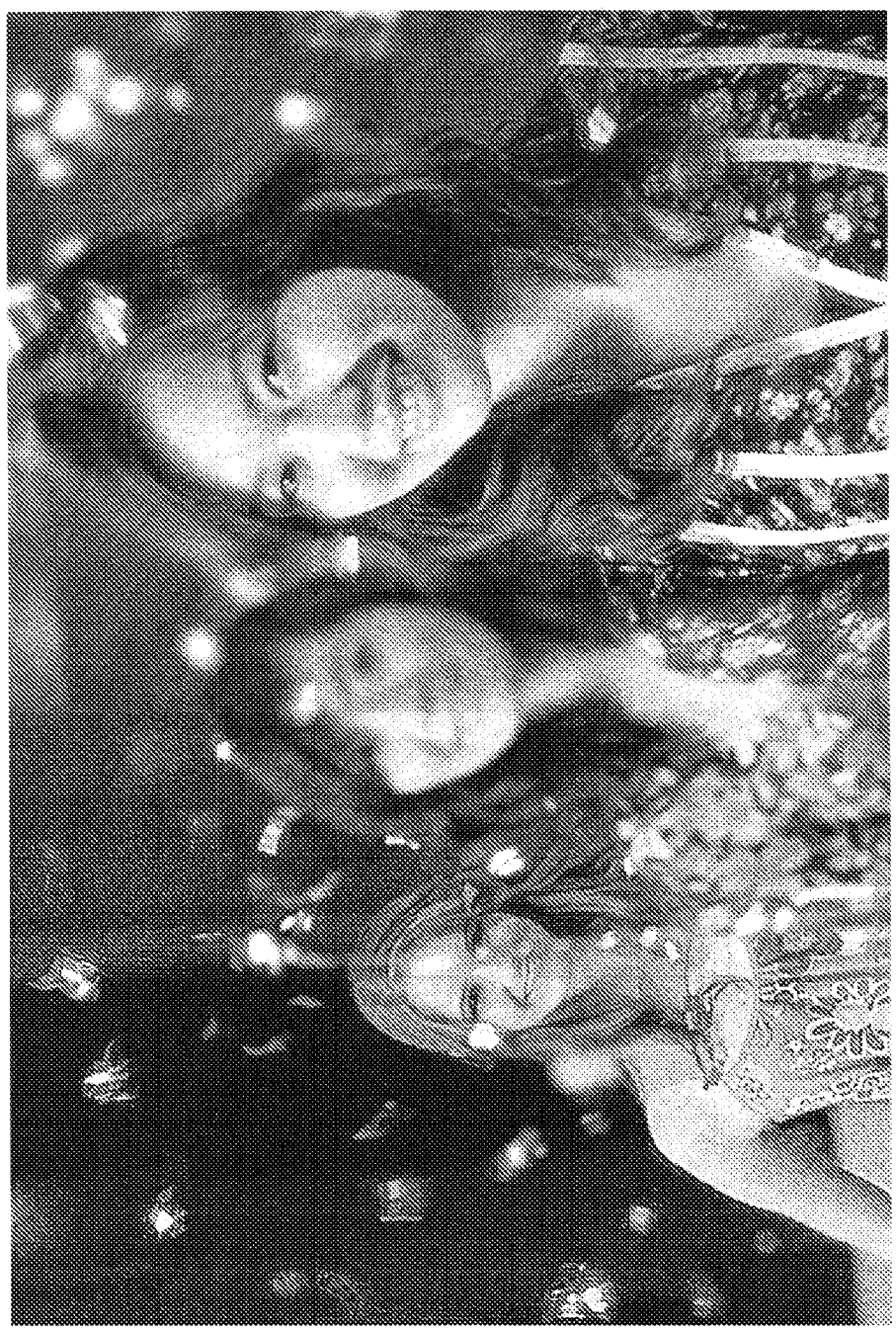
FIG. 26 is an image illustrating split-screen focus; in the image, the left side is focused on a focal plane that focuses on the image of the girl on the left while the right half of the image is focused on a focal plane that focuses on the image of the girl on the right.

In one exemplary embodiment, N equals 2, the separation between the two regions is a line, and the focus is set independently on each portion of the screen in order to produce a "spit-screen" focus effect (See FIG. 26). In one specific exemplary embodiment, N equals 2, and each region may use "Focus Subject Tracking", presented herein, to maintain focus on a separate object in both of the regions.

Slow-Motion Focus Pull

In yet another exemplary embodiment, refocusable video editing system 100, in response to user or operator inputs, may generate, produce and/or output video data, using the refocusable video data (acquired by refocusable video data acquisition unit 12) that includes a real-time focus pull, including slow-motion video. In this embodiment, the user or operator, via the user interface of refocusable video editing system 100, may designate, define and/or indicate a portion or section of the video data to be rendered in slow motion, for example, by indicating the duration of input footage and the duration of output rendered playback video (for example, where 1 second of footage takes 20 seconds of playback). In addition, the user or operator may designate, define and/or indicate for this speed-modified video sequence a desired change in appearance of focus, aperture, exposure, and/or etc. of the refocusable video data, for example, using one or more of the techniques described herein. (See, for example, the technique of "Focus Subject Tracking" or "Two Subject Tracking with Tilt-Shift"). In response, refocusable video editing system 100 generates, produces, renders and/or outputs the video data at the desired rates with the desired change in appearance.

In some embodiments, the refocusable video data may have been originally captured at a higher frame rate (for example, 120 frames per second) than the frame rate desired for output video (for example, 30 frames per second). In these embodiments, the output video speed may appear in "slow motion" by rendering the originally captured refocusable frames over a longer duration than the time of capture (for example, 120 refocusable frames captured in 1 second may be rendered as 120 output frames lasting for 4 seconds), using one or more of the techniques described herein. (See, for example, the technique of "Focus Subject Tracking" or "Two Subject Tracking with Tilt-Shift"). In other embodiments, the refocusable video data may have been originally captured at the same or similar frame rate desired for output video. In these embodiments, it may be desirable during "slow motion" to maintain a consistent frame rate for output video (for example, 30 frames per second) by interpolating between frames in the refocusable video data. In one specific embodiment, frames in the refocusable video data may be repeated to maintain the proper output frame rate. In another specific embodiment, the refocusable video data may be rendered at the originally captured frame rate, and intermediate frames may be generated by interpolating between output video frames (for example, by blending or by applying motion and/or scene analysis to create intermediate frames). Indeed, any video frame interpolation method(s) now known or later developed may be used.

Notably, Split Screen focus and Slow-motion Focus Pull embodiments described above, processing circuitry generates, calculates and/or determines virtual focus parameters (including a virtual focus) for the refocusable video data that provides the predetermined effect as described immediately above. Thereafter, processing circuitry may generate, compute and/or output video data or frames using the refocusable video data and such virtual focus parameter (including virtual focus).

Painted Focus

In another exemplary embodiment, refocusable video editing system 100 employs a technique that allows the user or operator to "paint" one or more different depths of focus for one or more areas of a frame to create painted focus key frames. For example, the user or operator may, via the user interface of refocusable video editing system 100, use a "brush"-like tool that sets, defines and/or establishes a focus depth of one or more areas of a given frame "directly" on the rendition of the frame presented to the user on a display of the user interface. In response, refocusable video editing system 100 defines, establishes and designates a focus depth for each of the one or more areas of the frame. In this way, the user or operator, via the user interface of refocusable video editing system 100, "paints" or defines the depth(s) of focus of such one or more areas "directly" onto a representation of the frame. The system may interpolate focus for each pixel independently between key frames using, for example, nearest neighbor interpolation, linear interpolation, non-linear interpolation, cubic interpolation, Bezier curve interpolation, and spline-based interpolation. Notably, any interpolation technique now known or later developed may be used. (See, for example, U.S. Patent Application Publication 2008/0131019 (U.S. patent application Ser. No. 11/948,901).

Integrated Refocusable Video System

As noted above, refocusable video editing systems 100 and techniques implemented thereby, may be integrated into refocusable video acquisition system 10, and, as such, some, most or all of the processing may be performed on/in acquisition system 10 or unit 12 and that processing not performed on/in acquisition system 10 or unit 12 may be performed in a physically separate and external system/device. One exemplary embodiment of this system is shown in FIGS. 3B, 3E and 3G and 20.

Recording

Also noted above, refocusable video acquisition unit may operate as a still camera and a video camera according to one or more, or all of the embodiments described herein. Indeed, in certain embodiments, the refocusable video acquisition unit may be configured as a conventional video acquisition unit (see, for example, FIGS. 2D, 2F and 4A-4E).

Selectable Refocusing Power System (On/Off System)

In this exemplary embodiment, the refocusable video acquisition unit 12 has a method for shooting in conventional 2D imaging mode, or in refocusable mode. A method for implementing such a selectable refocusing power system utilizing a light field recording system is described in Patent Cooperation Treaty Application WO 2007/092545 A2.

As discussed above, in one exemplary embodiment, refocusable video acquisition unit 12 is switched between modes as follows: when shooting in still mode, refocusable video acquisition unit 12 is configured to shoot in conventional 2D imaging mode; when shooting in video mode, refocusable video acquisition unit 12 functions or operates as a refocusable video camera that records light field video. (See, for example, FIG. 2C and FIG. 2D).

Focus Planned Recording

In another exemplary embodiment, the system and technique of the present inventions may include "Focus Planning" to determine the correct, desired and/or predetermined location of focus. In this regard, in one embodiment, processing circuitry of refocusable video acquisition system 10 and/or refocusable video editing systems 100 may evaluate or analyze a plurality of frames of the refocusable video data, including (i) data which is representative of video frames that precede the current frame and (ii) data which is representative of video frame that follow the current frame. Notably, in the context of "Focus Planned Recording", the "current frame" refers to a refocusable frame that is being processed by the refocusable video acquisition system 10 in order to render a 2D output video frame. In this sense, the "current frame" may be a frame captured at a point in the past relative to events that are occurring "live". In one embodiment, refocusable video acquisition system 10 and/or refocusable video editing systems 100 includes memory (for example, one or more buffers) to store light field data or information of the refocusable input video data or stream corresponding to (i) video frames that precede the current frame and (ii) video frames that follow the current frame. Using such refocusable video data, data processing circuitry may perform a temporal video analysis thereof to calculate, determine and/or obtain the predetermined, correct or desired focus depth. An exemplary embodiment of flow of the focus planning is shown in FIG. 21A.

Figure 21A:
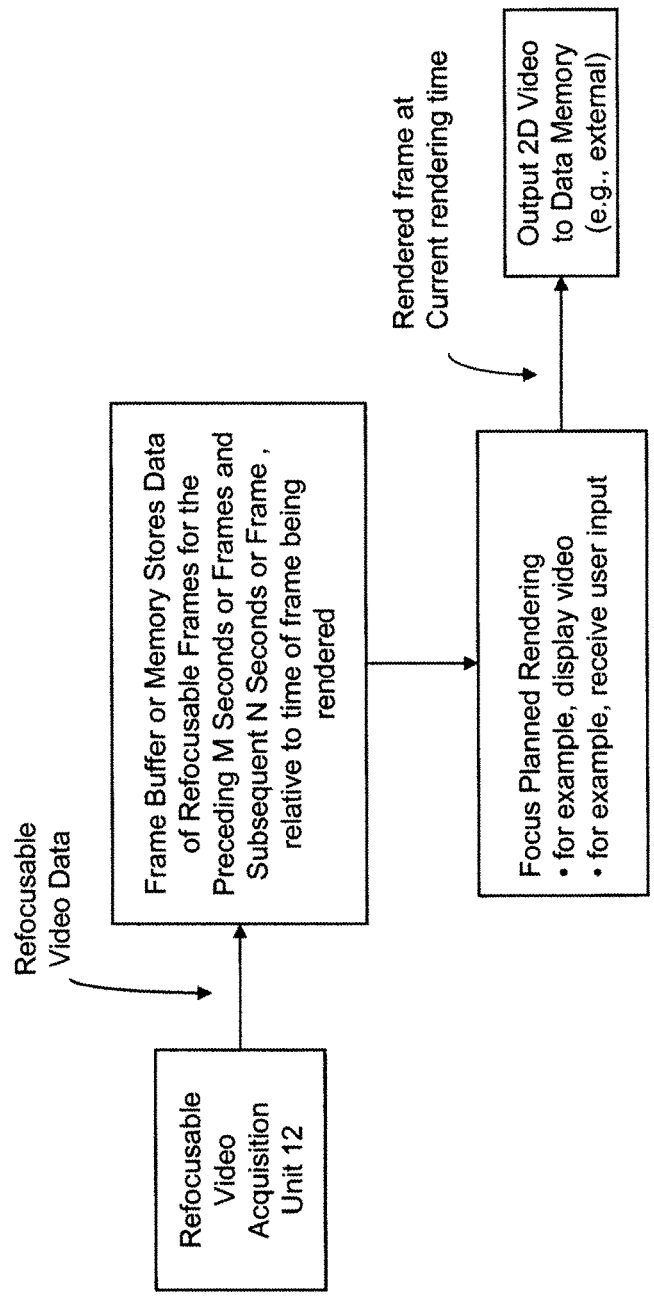
FIG. 21A illustrates an exemplary embodiment of "Focus Planning" according to at least certain aspects of certain embodiments of the present inventions, wherein the user, refocusable video acquisition system and/or refocusable video editing systems may evaluate or analyze a plurality of frames of the refocusable video data, including (i) data which is representative of video frames that precede the current and/or a given frame and (ii) data which is representative of video frame that follow the current and/or the given frame to analyze the video to calculate, set, define, determine and/or obtain a predetermined, correct or desired focus depth.

With reference to FIG. 21A, in one embodiment of refocusable data acquisition or capture using Focus Planning according to the present inventions, refocusable video acquisition system 10 and/or refocusable video editing systems 100 stores/buffers refocusable video data corresponding to a plurality of video frames (for example, temporally contiguous refocusable light field video data frames) including, for example, video frames before and after the video frame to render, acquire and/or output. Such systems 10 and/or 100 use(s) the refocusable video data of the preceding and subsequent frames to calculate, determine and/or obtain virtual focus characteristic(s) or parameter(s) including the location of the focal plane(s), aperture(s) and/or focus effect(s) (that is, where to focus and/or the amount of focus).

In one embodiment, during operation, N seconds of refocusable video light field data (corresponding to a plurality of refocusable video frames) are stored (for example, buffered) for video frames that occur after a given video frame to render, acquire and/or output, and M seconds of refocusable video data (corresponding to refocusable video frames) that occur before the given video frame to render, acquire and/or output. For example, systems 10 and/or 100 may store (i) 5 seconds of refocusable video data corresponding to frames that occurred before the given video frame to render, acquire and/or output and (ii) 5 seconds of refocusable video data corresponding to frames that occurred after the given video frame to render, acquire and/or output.

Notably, N and M may be equal. Moreover, data which is representative of the amount of time may be user or operator programmable (via the user interface wherein such user input is stored in memory, for example, a register or buffer) and/or system defined (for example, based on the amount of memory available to implement Focus Planning).

Notably, in some embodiments, refocusable video acquisition system 10 may reach a state where the entire N+M second buffer has filled with refocusable video data while the system continues to acquire additional refocusable video data. During this "steady state" operation, one or more refocusable video frames may be deleted from the buffer or be overwritten by newly acquired refocusable video frames. In some embodiments, the oldest refocusable video frames in the buffer are deleted and/or overwritten. In a specific embodiment, in "steady state" the system may continually remove and/or overwrite the single "oldest" or earliest acquired refocusable video frame and acquire a new refocusable video frame (whether concurrently with or after the removal of the refocusable video frame from the memory).

In another embodiment, refocusable video acquisition system 10 and/or refocusable video editing systems 100 employ(s) the refocusable video data of the frames acquired after a selected video frame to derive, calculate and/or determine virtual focus characteristic(s) or parameter(s) (for example, data which is representative of the location of the focal plane(s), focus depth(s), size and shape of the aperture(s) and/or focus effect(s) (that is, where to focus and/or the amount of focus)) of one or more previously acquired video data frames). In this regard, processing circuitry in systems 10 and/or 100, using or based on data corresponding to video frames acquired after refocusable video data corresponding to the selected video frame, may derive, calculate and/or determine virtual focus characteristic(s) or parameter(s) associated with the previously acquired refocusable video data. In response, refocusable video acquisition system 10 and/or refocusable video editing systems 100 generates and outputs (for example, to internal or external memory) video frame(s) or data using (i) the virtual focus characteristic(s) or parameter(s) (for example, data which is representative of the characteristic or parameter) and (ii) the refocusable video data corresponding to or associated of the corresponding video frame.

For example, in one embodiment, the focus depth of one or more selected video refocusable video data frames may be changed, determined, defined and/or re-defined after acquisition of the corresponding refocusable light field video data based on or using refocusable video data corresponding to or associated with the video frames acquired after the selected video refocusable video data frames. That is, in this embodiment, the focus depth of the virtual focus characteristic(s) or parameter(s) of a selected video frame may be determined based on or using data corresponding to video frames acquired after refocusable video data corresponding to the selected video frame.

Moreover, until redefined, the virtual focus characteristic or parameter may also define or determine the focus depth(s) of those video frames obtained, captured and/or acquired after the video frame of the one or more selected video frames. That is, if and until the virtual focus characteristic or parameter are redefined, the output video frames or data may be determined, generated and/or calculated using (i) the "current" virtual focus characteristic or parameter and (ii) the refocusable video data corresponding to or associated of the video frames to be rendered or output.

Notably, processing circuitry in refocusable video acquisition system 10 and/or refocusable video editing systems 100 may calculate, determine and/or generate the virtual focus characteristic(s) or parameter(s) which may include data which is representative of or defines the location of the focal plane(s), focus depth(s), size and shape of the aperture(s) and/or focus effect(s) (that is, where to focus and/or the amount of focus)) of one or more refocusable video frames or data. In this regard, the processing circuitry may calculate, determine and/or generate a virtual focus characteristic or parameter in accordance with, for example, subject/object focus tracking (for example, as described herein), maintaining a predetermined focus depth of an area of the acquired scene (for example, as described herein), the manner, form or type of focus transition (similar to that as described herein in connection with key frames), and/or in response to one or more user inputs (which may be, for example, indicative of subject/object tracking or a position or location in the scene, or an absolute focus depth).

For example, in one embodiment, in connection with subject/object focus tracking (which may be system or user defined), the processing circuitry calculates, determines and/or generates a virtual focus depth of a virtual focus characteristic or parameter of the video frames based on a focus depth of one or more subjects/objects in a scene. In this regard, the virtual focus characteristic or parameter of the video frame provides a predetermined virtual focus depth relative to one or more subjects/objects for a plurality of video frames such that the virtual focus characteristic or parameter provides or maintains the one or more subjects/objects in a predetermined focus (whether relative or absolute focus) over the plurality of frames. Again, the system or user may implement subject/object tracking and/or identify the subject/object in connection with the subject/object tracking. Moreover, the subject/object to be tracked may be initially identified in or using refocusable light field video data which is acquired after acquisition of the refocusable light field video data and the system corresponding to the video data to be output or rendered. In addition, the system thereafter determines a virtual focus depth of the virtual focus characteristic or parameter, on a frame by frame basis, to provide a predetermined virtual focus depth relative to one or more subjects/objects such that the virtual focus characteristic or parameter provides or maintains the one or more subjects/objects in a predetermined focus (whether relative or absolute focus) over the plurality of frames—notwithstanding the fact that the corresponding refocusable light field video data or frames were acquired using an optical focus that is unrelated to and/or different from the virtual focus depth of the individual frames which provide a predetermined virtual focus depth relative to one or more subjects/objects.

Figure 21B:
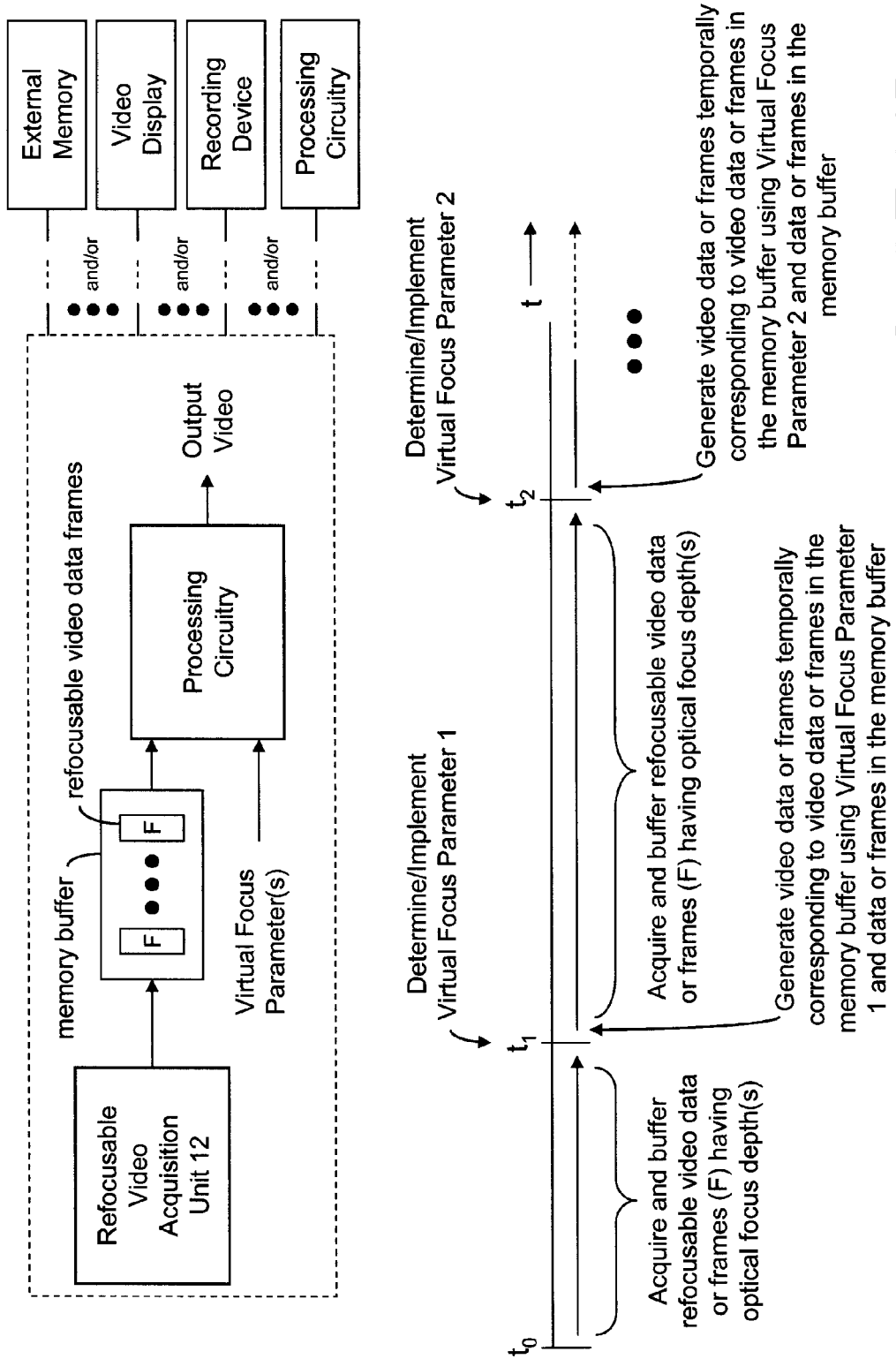
FIG. 21B illustrates a block diagram representation of systems and techniques to generate and output video data or frames (for example, to external storage, to a video display, to a recording device, and/or to processing circuitry) using one or more virtual focus parameters and refocusable video data or frames which temporally corresponds to the output video data or frames, wherein one or more of the virtual focus parameters (which may include data which is representative of a predetermined, selected and/or desired (absolute or relative) virtual focus depth) is/are determined using video data acquired after the refocusable video data or frames which temporally corresponds to the output video data or frames; notably, an exemplary timing diagram of certain operations of an exemplary embodiment is also illustrated in FIG. 21B.

In an exemplary embodiment, with reference to FIG. 21B, in operation, refocusable video acquisition unit 12 acquires, samples and/or captures of refocusable light field video data (which correspond to a plurality of temporally contiguous refocusable video data frames) and data which is representative thereof (for example, the refocusable light field video data itself or a compressed version thereof) is stored in a memory buffer (see, (F)). Each frame of the refocusable light field video data includes an optical focus that corresponds to or is associated with an optical focus of refocusable video acquisition unit 12 during acquisition of the refocusable light field video data. The memory buffer may store up to a predetermined amount of temporally contiguous frames of refocusable video data which corresponds to, for example, three or more seconds and/or less than ten seconds of refocusable light field video data or frames.

Thereafter, refocusable video acquisition system 10 and/or refocusable video editing system 100 generate(s) the output video data or frames corresponding to the refocusable video data frames and a virtual focus characteristic or parameter. For example, refocusable video acquisition system 10 and/or refocusable video editing systems 100 may generate output video data or frames having a virtual focus depth that is different from and/or unrelated to the optical focus depth of the corresponding refocusable light field video data or frames. In this embodiment, the virtual focus depth of certain video data frames (i.e., those frames which are acquired before determination and/or implementation of the virtual focus characteristic or parameter) are determined by the processing circuitry using refocusable light field video data which is acquired after the refocusable light field video data or frames corresponding to the video frames or data to be rendered or output. Notably, the system may remove and/or overwrite the refocusable video frames/data corresponding to the rendered video frames/data and store/buffer newly acquired refocusable video frames (whether concurrently with or after removal of the refocusable video frames/data corresponding to the rendered video frames/data).

In one embodiment, systems 10 and/or 100 receive, calculate, determine and/or generate the virtual focus characteristic or parameter for refocusable video data or frames stored in the memory buffer after acquisition and storage in the memory buffer. For example, in one embodiment, processing circuitry in systems 10 and/or 100 calculates, determines and/or generates, for one or more previously acquired refocusable video frames or data, the virtual focus characteristic or parameter which determines, for example, the virtual focus depth(s) of the one or more refocusable video frames or data. Thereafter, systems 10 and/or 100 generate the output video data or frames corresponding to the refocusable video data frames and the virtual focus characteristic or parameter (for example, the virtual focus depth(s)).

In one exemplary embodiment, upon implementing subject/object focus tracking, the processing circuitry of systems 10 and/or 100 calculates, determines and/or generates a virtual focus depth of the virtual focus characteristic or parameter for a plurality of refocusable light field video data or frames which provide or maintain the one or more subjects/objects in a predetermined focus in the output video data or frame. The processing circuitry analyzes the refocusable light field video data or frames to identify the one or more subjects/objects in such refocusable light field video data or frames and, in response thereto, generates a virtual focus depth which provides or maintains the one or more subjects/objects in a predetermined focus (relative to the one or more subjects) in the output video data or frame. In one embodiment, the processing circuitry generates output data or frames using (i) the virtual focus depth of the virtual focus characteristic or parameter and (ii) the associated or corresponding refocusable light field video data or frames in order to render, output or provide output video data or frames having a predetermined focus relative to the one or more subjects/objects. Accordingly, as the one or more subjects/objects move within the scene, the virtual focus depth of the virtual focus characteristic or parameter may change to provide or maintain the one or more subjects/objects in a predetermined focus over the plurality of frames.

Notably, in one embodiment, when the virtual focus characteristic or parameter is determined, refocusable video acquisition system 10 and/or refocusable video editing systems 100 generates or renders output video data or frames using such virtual focus characteristic or parameter and the refocusable video data frames then present in the memory buffer. For example, in those embodiments where the virtual focus characteristic or parameter is indicative of maintaining a predetermined focus depth of an area of the scene (for example, an "x,y" location in the scene reflective of a user input), the processing circuitry may determine a virtual focus depth associated with the area of the scene (for example, a virtual focus depth which provides a predetermined focus (for example, a virtual focus depth that provides such area "in-focus") in connection with that area of the scene). Thereafter, systems 10 and/or 100 may generate output video data or frames using the virtual focus depth associated with the area of the scene and the refocusable video data or frames stored or contained in the memory buffer (which correspond to video data or frames acquired before the refocusable video data or frames used to determine a virtual focus depth associated with the area of the scene). Under these circumstances, the output video data or frames is generated using a virtual focus depth that corresponds to the focus depth associated with the area of the scene which was defined or determined after acquisition of the refocusable video data or frames stored or contained in the memory buffer. In addition, the output video data or frames includes a virtual focus depth—notwithstanding the fact that the corresponding refocusable video data or frames were acquired using an optical focus that is unrelated to and/or different from the virtual focus depth.

In another exemplary embodiment, where the virtual focus characteristic or parameter is indicative or representative of subject/object focus tracking, the processing circuitry analyzes the previously acquired refocusable video data or frames (which, in this example, are stored in the memory buffer) to identify the subject/object therein and calculates, determines and/or generates an appropriated, selected and/or suitable virtual focus depth of the virtual focus characteristic or parameter to provide or maintain the subject/object in the predetermined focus. The refocusable video acquisition system 10 and/or refocusable video editing systems 100 employs the virtual focus depth for the associated refocusable video data or frame to generate an output video data or frame which provides or maintains the subject/object in a predetermined focus (whether relative or absolute focus) over the plurality of frames. The systems 10 and/or 100 generate the output video data or frames having the subject/object in the predetermined focus using (i) a virtual focus depth which provides the subject/object in the predetermined focus and (ii) the refocusable video data or frames—notwithstanding the fact that the refocusable video data or frames were acquired using an optical focus that is unrelated to and/or different from the virtual focus depth which provides the subject/object in the predetermined focus. Notably, in this embodiment, as the subject/object moves within the scene, the virtual focus depth of the virtual focus characteristic or parameter may change in order to provide, generate, output and/or render video data or frames having a predetermined virtual focus depth relative to the one or more subjects (which thereby maintains the subject/object in the predetermined focus over the plurality of frames).

As noted above, the processing circuitry may calculate, determine and/or generate a virtual focus characteristic or parameter in accordance with, for example, the manner, form or type of virtual focus transition (similar to that as described herein in connection with key frames). In this regard, the manner, form or type of focus transition may define or determine a virtual focus transition(s) (for example, the Slow Focus Pull, Jump Focus Pull, Peek Focus Pull, described herein (see, FIGS. 11A-13C)) from a particular virtual focus depth of a first virtual focus parameter to a second virtual focus depth of a second virtual focus parameter.

Figure 21C:
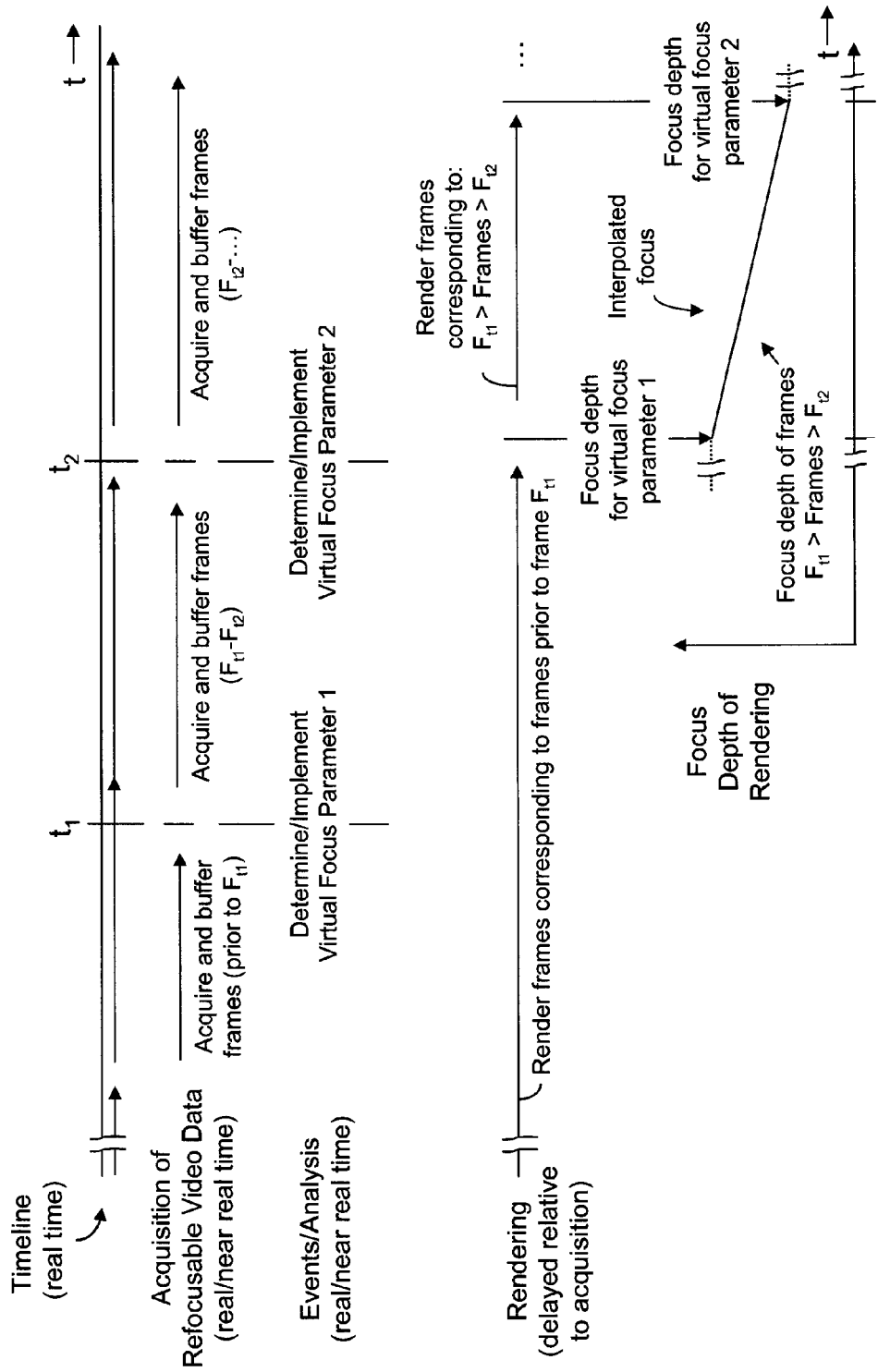
FIG. 21C illustrates a timing diagram to generate and output video data or frames (for example, using block diagram representation of system of FIG. 21B) using one or more virtual focus parameters and refocusable video data or frames which temporally corresponds to the output video data or frames, wherein processing circuitry may calculate, determine and/or generate a virtual focus characteristic or parameter in accordance with, for example, the manner, form or type of virtual focus transition (similar to that as described herein in connection with key frames), notably, the manner, form or type of focus transition may define or determine a virtual focus transition(s) (for example, the Slow Focus Pull, Jump Focus Pull, Peek Focus Pull, described herein (see, FIGS. 11A-13C)) from a particular virtual focus depth of a first virtual focus parameter to a second virtual focus depth of a second virtual focus parameter (in the illustrated embodiment, video frames corresponding to $F_{t1}$-$F_{t2}$)

For example, with reference to FIG. 21C, in an embodiment including a refocusable video acquisition system 10 incorporating Focus Planning (described herein), the processing circuitry may implement transitions from virtual focus parameter 1 to virtual focus parameter 2 in accordance with a virtual focus transition. The characteristics of the virtual focus transition include a time period (or a number of frames) between the transition and the focus manner, form or type (for example, the Slow Focus Pull, Jump Focus Pull, Peek Focus Pull). The transition may be implemented concurrently with or after (for example, immediately after) the determination or implementation of the "new" virtual focus parameter (virtual focus parameter 2 in the illustration of FIG. 21C). Indeed, one or more of these variables may be controlled, defined and/or determined by, for example, the user via a user input (wherein, for example, such data/information may be stored in a register) and/or system controlled, defined and/or determined.

Figure 21D:
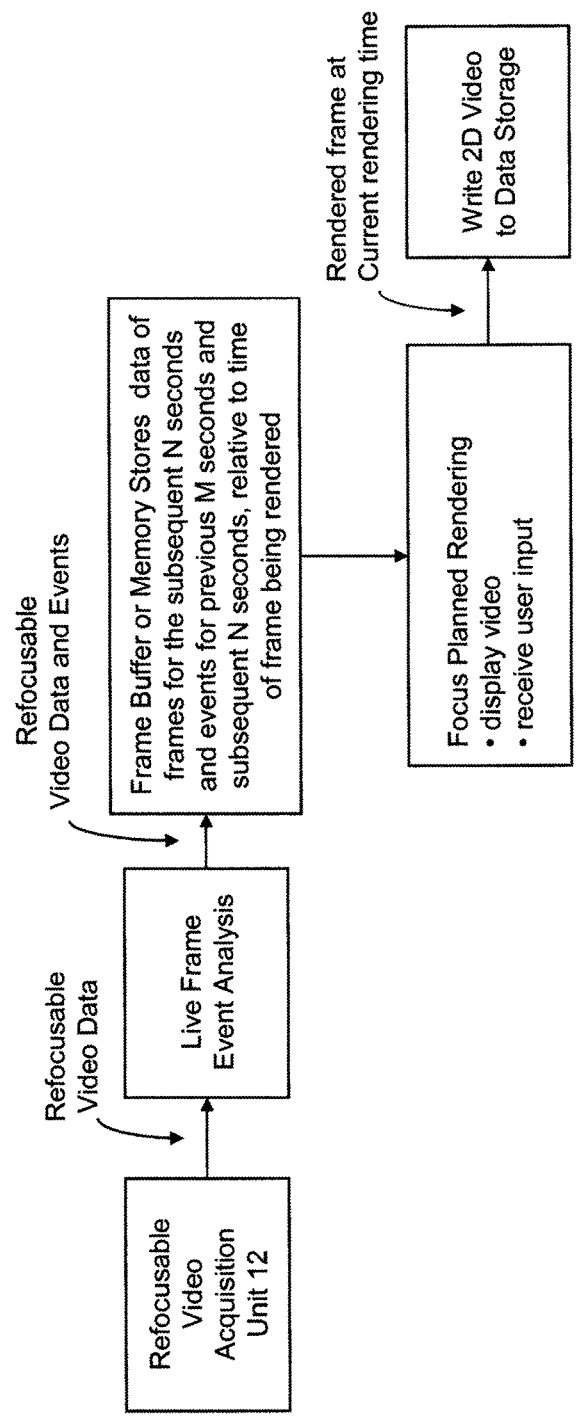
FIG. 21D illustrates an exemplary embodiment of "Focus Planning" according to at least certain aspects of certain embodiments of the present inventions, wherein the user, refocusable video acquisition system and/or refocusable video editing systems may evaluate or analyze a plurality of frames of the refocusable video data, including (i) data which is representative of video frames that precede the frame being rendered to output video, (ii) data which is representative of video frame that follow the frame being rendered to output video, (iii) data which is representative of events that precede the frame being rendered to output video, and (iv) data which is representative of events that follow the frame being rendered to output video to analyze the video to calculate, set, define, determine and/or obtain a predetermined, correct or desired focus depth.

Another exemplary embodiment is illustrated in FIG. 21D. With reference to FIG. 21D, in one exemplary embodiment of refocusable data acquisition or capture using Focus Planning according to certain aspects of the present inventions, refocusable video acquisition system 10 and/or refocusable video editing systems 100 may perform frame event analysis and output rendering operations. At or near the time refocusable light field video frames are captured, the frames may be analyzed for events of interest. For example, the system(s) may analyze and record any type of events, including but not limited to:

Face detection, tracking, analysis and/or recognition may be performed to determine if any individuals and/or specific individuals are entering the field of view, are present, performing a specific action (for example, speaking or gesturing) and/or leaving the field of view.

Object detection, tracking, analysis and/or recognition may be performed to determine if any objects and/or specific objects are entering the field of view, are present, performing a specific action (for example, moving quickly) and/or leaving the field of view.

Scene analysis and/or recognition may be performed to determine the current scene type (for example, outdoors) and/or any changes to the scene.

Indeed, any type of video, image and/or light field analysis presented herein, whether now known or later developed, may be performed to generate events of interest. These events may be stored in memory for P seconds prior to the current frame and Q seconds following the current frame. In some embodiments, P is equal to the total time before the current frame that the system has been recording (for example, all events since prior to the current frame since the user/operator last started recording). In some embodiments, Q may be equal to M. In some embodiments, N may be 0, indicating that only events and not refocusable frames are stored prior to the current frame.

Figure 21E:
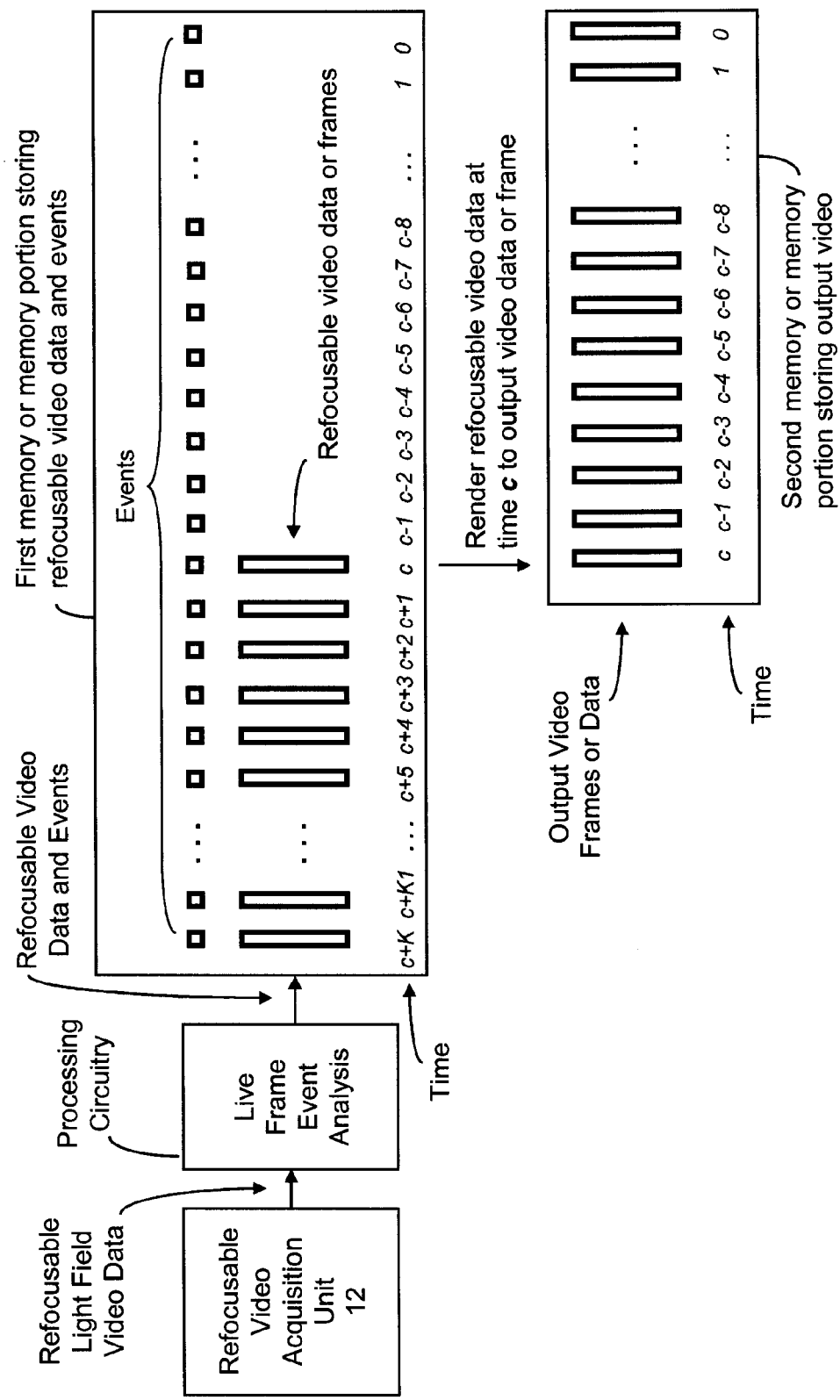
FIG. 21E illustrates another exemplary embodiment of "Focus Planning" according to at least certain aspects of certain embodiments of the present inventions, wherein the refocusable video acquisition system and/or refocusable video editing systems may evaluate or analyze for events of interest refocusable video frames immediately or nearly immediately as they are acquired, and store a plurality of frames and events of interest of the refocusable video data, including (i) data which is representative of video frame that follow the frame being rendered to output video, (ii) data which is representative of events that precede the frame being rendered to output video, and (iii) data which is representative of events that follow the frame being rendered to output video to analyze the video to calculate, set, define, determine and/or obtain a predetermined, correct or desired focus depth.

With reference to FIG. 21E, in one exemplary embodiment, a buffer may be located in a first memory on refocusable video acquisition unit 12 and may contain K refocusable frames (where, for example, K may equal N times the acquisition frame rate) after the current frame and all events of interest for the current recording session. In this embodiment, refocusable frames may be rendered to output video using, in part, the current refocusable video frame or data and one, some or all events of interest stored in the first memory. These output video frames may be rendered to a second memory. Notably, the second memory may be the same as, or a portion of the first memory (for example, internal memory) or may be different. After rendering, generating and/or outputting the output video frame or data, the refocusable frame or data corresponding to such output video frame or data may be deleted, removed, and/or overwritten from/in the memory buffer. Notably, the output video frame or data may be stored in a second memory (for example, an external memory having a larger capacity), for example, non-volatile storage (for example, Flash memory or a hard drive).

When rendering the current frame to output video, this set of events may be used and/or analyzed to calculate, determine and/or obtain a virtual focus characteristic or parameter (for example, the location of the focal plane(s), aperture(s) and/or focus effect(s) (that is, where to focus and/or the amount of focus)). In one specific embodiment, the system may adjust the focus (define a virtual focus plane) on person(s) as they enter the scene or a field of view of the video (hereinafter collectively, the scene). In this case, it may be desirable to begin to shift the plane of focus gradually over X seconds (for example, over 2 seconds) so that the person(s) are in focus as they appear. Indeed, any set of rules, system and/or method(s) of analysis, whether now known or later developed, may be used to calculate, determine and/or obtain the location of the focal plane(s), aperture(s) and/or focus effect(s).

In some embodiments, the system may include, determine and/or maintain data representing a timeline of virtual focus depth values, which at any time may include data representing the virtual focus depth of all refocusable frames currently in the memory buffer. At the time the current refocusable frame is rendered to output video, the virtual focus parameter may be the timeline, and the current refocusable frame may be rendered with the focus depth of time corresponding to the current refocusable frame to render according to the data representing a focus timeline. As new frames are acquired and events of interest are generated, the data representing the timeline of focus depth values may be adjusted and/or modified based on the events of interest. In one embodiment, the system may select key frames of focus based on selected events of interest (for example, a subject begins to speak) and may insert focus transition(s) (for example, the Slow Focus Pull, described herein) temporally prior to or after the event of interest so that the rendered video contains focus transitions and renders the frames corresponding to the selected events of interest in predetermined focus (for example, sharp focus).

Figure 27A:
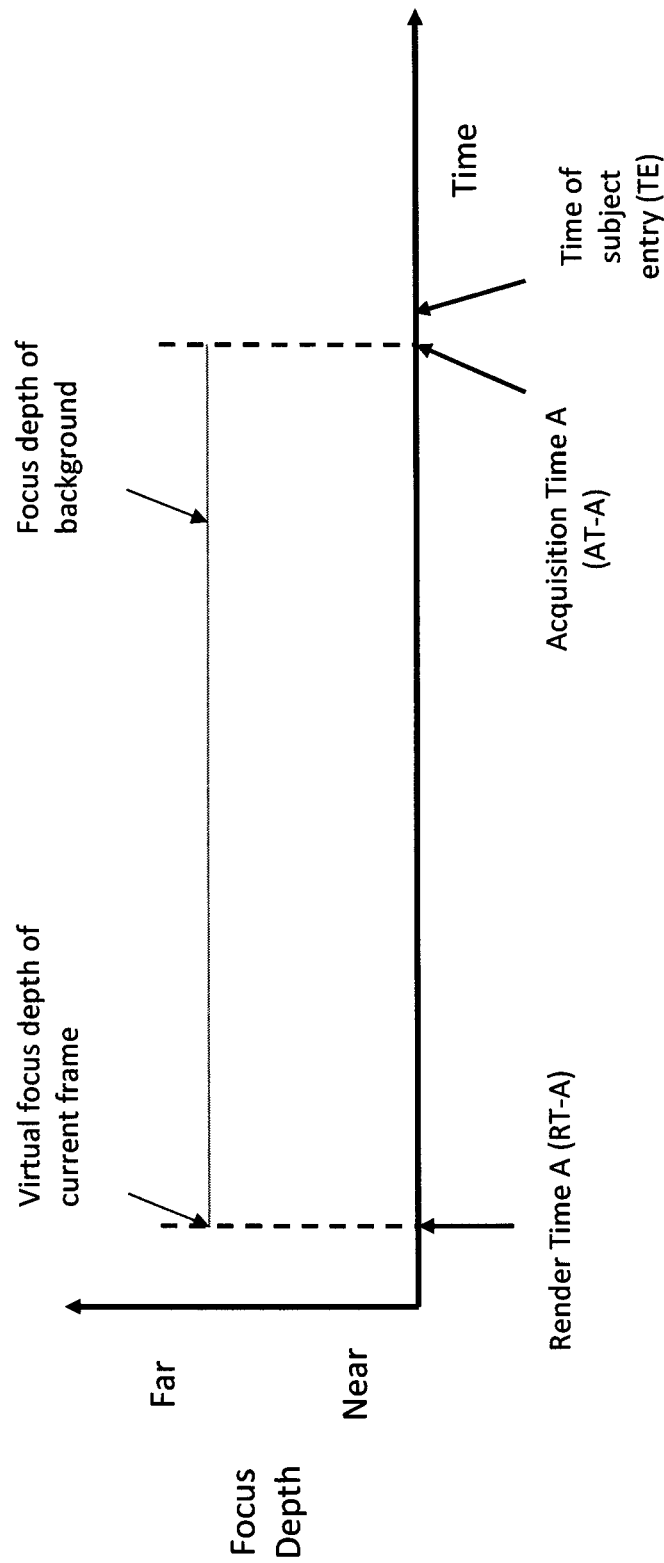
FIGS. 27A and 27B are block diagrams that illustrate focus timelines at two different and partially overlapping times during acquisition of the refocusable video data or frames.
Figure 27B:
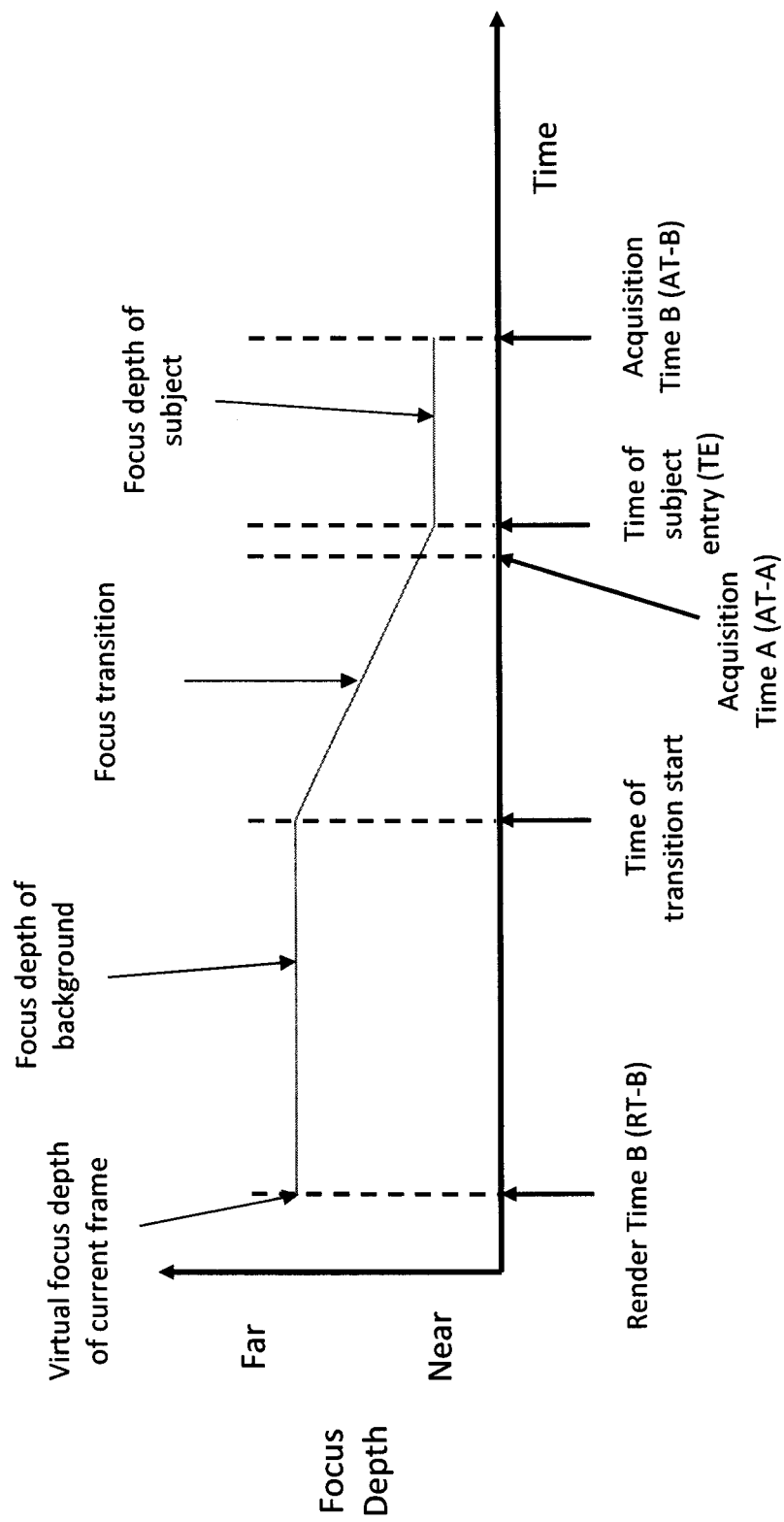

With reference to FIGS. 27A and 27B, these figures illustrate exemplary focus timelines at two different and partially overlapping times during acquisition. Notably, the time periods covered in FIGS. 27A and 27B are illustrated as overlapping, and the time covered in FIG. 27B that is not covered in FIG. 27A occurs temporally after the time period covered in FIG. 27A. In FIG. 27A, the focus timeline is set to a first focus depth (for example, the focus depth of the background (for example, a wall or a mountain)) for all times represented in the timeline. Also displayed in FIG. 27A is a time of subject entry (TE), which occurs (for example, when a subject enters the scene) temporally just after the time of acquisition. Notably, with respect to FIG. 27A, TE has not yet occurred. Temporally between the acquisition times in FIGS. 27A and 27B (AT-A and AT-B), TE occurs (for example, a subject of interest enters the scene). As a result of the subject entry, two key frames may be inserted into the focus timeline, one at the time of transition start and one at TE, that may allow for a transition of focus from the first depth to a second focus depth (for example, the focus depth that brings the subject into sharp focus). The resulting focus timeline is displayed in FIG. 27B, wherein the focus timeline is conceptually composed of three partitions: the earliest period of time has a focus depth corresponding to the background, the latest part, beginning at TE, has a focus depth corresponding to a subject that has entered the scene, and the middle part has a transition in focus from the background to the subject of interest. Notably, the focus depth of the focus timeline at Acquisition Time A (AT-A) changes between the times represented in FIGS. 27A and 27B, due to an event that occurred temporally after AT-A. As a result, the output video frame temporally corresponding with AT-A may be rendered using a focus depth determined by an event that occurs in the future relative to AT-A, in a manner that may appear as if the system had knowledge future events.

Using that refocusable video data, the data processing circuitry may generate output video and present the user or operator (via the user interface) with video frames corresponding to before and after the frame to render, acquire and/or output. Based on such video, the user or operator may define, set and/or determine the focus characteristics of acquisition or capture by refocusable video acquisition unit 12. In response thereto, refocusable video acquisition unit 12 implements the selected focus and acquires, samples, stores and/or records refocusable video data based on the selected focus. Indeed, in one embodiment, in addition to implementing the selected focus of the virtual focus characteristic or parameter in connection with the video frame or data to be rendered, acquired and/or output, systems 10 and/or 100 implement the selected focus in connection with the preceding and/or subsequent frames.

The data processing circuitry may employ refocusable data of immediately preceding and immediately subsequent frames. Indeed, in some embodiments, the immediately preceding frames and/or immediately subsequent frames are contiguous. Moreover, the data processing circuitry may employ certain data acquisition parameters (for example, aperture size) that accelerate or facilitate generation and/or output video to the user interface for Focus Planning consideration by the device and/or user/operator. For example, the adjusting of certain acquisition parameters (for example, aperture size or optical focus depth) may facilitate acquisition of refocusable light field video data that allows for the generation and/or output video implementing the Focus Planning consideration by the device and/or user/operator (for example, that allows for implementing the selected, desired or predetermined virtual focus characteristic or parameter (for example, the selected, desired or predetermined virtual focus depth)).

The selection of focus may be controlled using a variety of different analysis methods, all of which are intended to fall within the scope of the present inventions. Indeed, all techniques and circuitry for controlling the focus selection, whether now known or later developed, are intended to fall within the scope of the present inventions. Several examples are presented herein.

Focus Tracking Mode

As noted above, when in the Focus Planning Mode, systems 10 and/or 100 or the user/operator may identify one or more subjects/objects (hereinafter collectively "subject" or "subjects") of interest and track, define, maintain and/or set the focus of the refocusable video data to the one or more subjects. In one embodiment, the Focus Planning Mode allows systems 10 and/or 100 or the user/operator to determine whether a subject/object is transitory (and, as such, perhaps not of interest). A subject to which focus is tracked, defined, maintained and/or set to may be selected based on, for example, one or more of the following criteria:

The subject is not part of the background (for example, by using automatic foreground-background segmentation based on pixel clustering). In this case, the subject may be more likely to be selected.

The length of time the subject is in the field of view. If the duration of time that the subject is in the field of view is very short, the subject may be less likely to be selected.

Proximity of the subject to the center of the field of view. The closer the subject is to the center, the more likely it may be to be selected.

The size of the subject. The larger the subject is, the more likely it may be to be selected.

Whether the subject is or includes a face. Face detection methods (for example, a suitably configured Haar cascade classifier) may be used to identify whether the subject region is a face. If so, it may be more likely to be selected.

The identity of the face. If the subject region is a face, it may be more likely to be selected if a face recognition method determines that it is someone from a set of known identities. Any facial recognition method now known or later developed may be used, including principal component analysis (PCA) or elastic bunch graph matching (EBGM).

Whether the subject is talking or moving (for example, running, climbing and/or fighting). If the subject is determined to be a face, it may be more likely to be selected if the person is talking (for example, by using a detection approach based on latent semantic indexing) or moving (for example, running, climbing and/or fighting).

In one exemplary embodiment, the subject tracking operations may implement focus transitions that minimize the number of transitions. In this way, the output video may appear to be smoother relative to a large number of focus transitions. Notably, the system may employ or implement any of the embodiments of focus transition between key frames (as discussed herein) in connection with the subject tracking operations. For example, the subject tracking operations may implement a slow focus pull, jump focus pull, peek focus pull manner, form or type of focus transition (as described herein in connection with key frames) during focus transitions.

Dialogue Mode

In another exemplary embodiment of the present inventions, when in the dialogue mode, the systems 10 and/or 100 may track, define, maintain and/or set the virtual focus on the subject that is speaking (for example, by using a talking detection approach based on latent semantic indexing) or moving (for example, running, climbing and/or fighting). Notably, the focus planning may identify between a primary speaker(s) and secondary speakers or others in a group in a scene. In one embodiment, for example, a primary speaker is a speaker that spends the largest fraction of the time encompassed by the focus planning time window.

Party Mode

In yet another exemplary embodiment of the present invention, in party mode, systems 10 and/or 100 adjusts, defines, maintains and/or sets the virtual aperture and/or focus to keep all subjects of interest in focus. As more subjects of interest enter the scene, the aperture may be reduced. Subjects of interest may be determined, for example, using criteria as described in the Focus Tracking Mode section or any other criteria now known or later developed.

Live "is Shot Refocusable?"

As noted above, systems 10 and/or 100 may use the methods or techniques described in the Live "Is Shot Refocusable" section for indicating to the operator or user which portions of the field of view are amenable to refocusing after recording.

On-System Editing and Saving

Once the refocusable video data has been captured, acquired and/or obtained, it may be stored in on-system or external memory. A list of possible storage formats is set forth above. While video output from the integrated embodiments of the present inventions may be stored in any one or more of a plurality of formats (including those listed herein), refocusable video acquisition unit 12 may operate or output a standard video data stream. The data stream may be generated fully automatically by allowing refocusable video acquisition unit 12 to select, designate and/or choose the subject or focus depth, or alternatively, refocusable video acquisition unit 12 may temporarily store refocusable video data (for example, the light field video data) and allow immediate focus editing of the refocusable video data stream.

In the exemplary embodiments described herein, operations, computations, generations, and/or functions of refocusable video acquisition system 10, refocusable video editing system 100, and/or components or elements thereof, may be implemented with processing circuitry disposed (in part or in whole) in/on systems 10 and/or 100 or in/on an external processing system. The integrated circuitry may include one or more microprocessors, Application-Specific Integrated Circuits (ASICs), digital signal processors (DSPs), and/or programmable gate arrays (for example, field-programmable gate arrays (FPGAs)). Indeed, the processing circuitry may be any type or form of circuitry whether now known or later developed. For example, the processing circuitry may include a single component or a multiplicity of components (microprocessors, ASICs and DSPs), either active and/or passive, which are coupled together to implement, provide and/or perform a desired operation/function/application.

Further, as mentioned above, in operation, the processing circuitry and/or the circuitry of the systems 10 and/or 100 may perform or execute one or more applications, routines, programs and/or data structures that implement particular methods, tasks or operations described and illustrated herein. The functionality of the applications, routines or programs may be combined or distributed. Further, the applications, routines or programs may be implementing by the processing circuitry using any programming language whether now known or later developed, including, for example, assembly, FORTRAN, C, C++, and BASIC, whether compiled or uncompiled code; all of which are intended to fall within the scope of the present invention.

Software Autofocus

Figure 22:
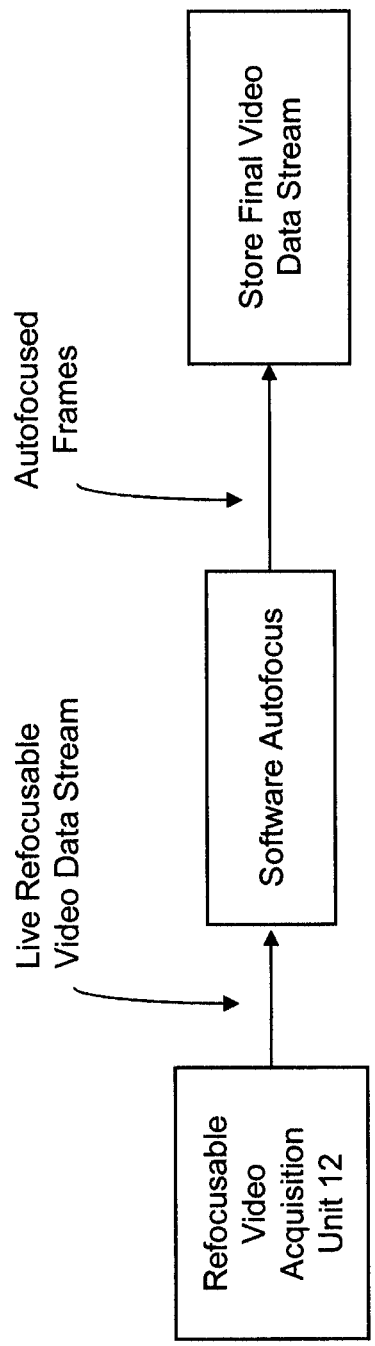
FIG. 22 illustrates an exemplary embodiment of the software autofocus to determine a focus setting or parameter for the refocusable video data, according to at least certain aspects of certain embodiments of the present inventions.

In yet another exemplary embodiment, refocusable video acquisition system 10 or unit 12 may employ software autofocus which may implement focus planned recording (see the "Focus Planned Recording" section) or any other method or technique for identifying, determining, defining and/or selecting a virtual focus parameter while refocusable video acquisition unit 12 captures, acquires and/or obtains refocusable video data. Under these circumstances, the input refocusable video data stream may be processed to generate a single stream of standard video. Such standard video may be stored in on-system or external memory. (See, for example, FIG. 22). Notably, FIG. 22 relates to an exemplary embodiment of refocusable video acquisition system 10 or unit 12 employing software autofocus which reads in a refocusable video data stream and outputs automatically focused frames.

Buffer and Edit

As noted above, refocusable video acquisition system 10 or unit 12 may buffer the input refocusable video stream, and thereafter output video which is representative thereof to the user interface. In this embodiment, the user or operator may control the focus selection, aperture size and/or shape and/or exposure with an on-camera edit user interface. In this way, the user or operator may control the acquisition parameters (for example, control the focus selection) of the refocusable video data. In this embodiment, refocusable video acquisition system 10 or unit 12 captures or acquires refocusable video data and temporarily stores such data (for example, stores the full light field video). The video may be saved to a non-volatile storage such as Flash memory or hard drive, or it may be saved in volatile memory, such as DRAM or SRAM. In this embodiment, the system 10 may attempt to initially select the focus of the video acquisition automatically or it may be left to the user.

The system 10 and/or 100 may next present the user or operator with an interface to edit the virtual focus parameter of the refocusable video data by playing the video back to the user or operator and selecting or allowing selection of the subject of focus. This selection may, for example, be menu driven or may use a touch screen where the use simply taps on the subject of focus during the stream. Once the focus has been selected for the refocusable video data stream, a final stream of standard 2D video may be rendered or generated and thereafter provided to storage (for example, non-volatile on-system or external storage), and the original stream of refocusable video may be discarded. This embodiment is show in FIG. 23.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Moreover, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For example, systems and/or techniques according to the present inventions may employ one or more of the embodiments of the (1) setting the focus based on key frames in post-production, and/or (2) setting the focus based on tracking subjects, and/or (3) an indicator used during a live shoot that allows the operator to understand the sharply refocusable range in the scene. Indeed, such embodiments may be implemented on a stand-alone refocusable video acquisition system and stand-alone refocusable video editing system and/or an integrated refocusable video acquisition and editing system. For the sake of brevity, many of those permutations and combinations are not discussed separately herein.

In addition, the exemplary embodiments set forth herein are at times described in the context where refocusable light field video data. However, it is intended that these exemplary embodiments, although set forth in the context of light field video data, are applicable to and may utilize any refocusable video data, whether now known or later developed, where that video data enables computation of images focused at different depths for various frame of the video. As such, the above embodiments of the present inventions are merely exemplary embodiments. They are not intended to be exhaustive or to limit the inventions to the precise forms, techniques, materials and/or configurations disclosed.

Many modifications, variations combination and/or permutations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. It is intended that the scope of the inventions not be limited solely to the description above.

Notably, the storage, memory and/or memory buffer(s) described and/or illustrated herein may be integrated (for example, integrated in the processing circuitry) or discrete memory of any kind or type, including SRAM, DRAM, latches, and/or registers. All memory types, architectures and forms, and permutations and/or combinations thereof, whether now known or later developed, are intended to fall within the scope of the present inventions.

Further, as mentioned above, in operation, the processing circuitry may perform or execute one or more applications, routines, programs and/or data structures that implement particular methods, tasks or operations described and illustrated herein (for example, acquiring and/or editing the refocusable video data and/or generating or rendering output video data corresponding to refocusable video data using one, some or all of the aforementioned editing and/or rendering techniques). The operations of the applications, routines or programs may be combined or distributed. Further, the processing circuitry may implement one or more, or all of such editing and/or rendering techniques in any combination and all permutations; such techniques may be employed alone or in combination with one or more of the other techniques of acquiring and/or editing the refocusable video data and/or generating or rendering output video data corresponding to refocusable video data. The techniques, methods and/or applications may be implemented by the processing circuitry using any programming language whether now known or later developed, including, for example, assembly, FORTRAN, C, C++, and BASIC, whether compiled or uncompiled code; all of which are intended to fall within the scope of the present invention.

It should be noted that the term "circuit" may mean, among other things, a single component (for example, electrical/electronic) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors implementing software, one or more gate arrays, programmable gate arrays and/or field programmable gate arrays. The term "data" may mean, among other things, a current or voltage signal(s) (plural or singular) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

What is claimed is:

1. A method of processing light field video data, comprising:
   acquiring light field video data of a scene, the acquired light field video data having an optical focus depth, the acquired light field video data comprising a representation having at least four dimensions and comprising at least an indication of a direction of travel of light;
   in a processor, determining a focus parameter;
   in the processor, generating refocused video data using the acquired light field video data and the focus parameter, wherein the generated refocused video data has a focus depth that is different from the optical focus depth of the acquired light field video data; and
   at an output device, outputting the refocused video data.

2. The method of claim 1, wherein generating the refocused video data occurs substantially concurrently with acquiring the light field video data.

3. The method of claim 1, further comprising storing the acquired light field video data in a storage device;
   and wherein generating refocused video data using the acquired light field video data comprises processing the stored light field video data.

4. The method of claim 1, wherein the focus parameter comprises information representing a predetermined focus depth of an area of the scene.

5. The method of claim 1, wherein the focus parameter comprises information representing focus tracking.

6. The method of claim 5, further comprising:
   in the processor, identifying at least one subject of interest in the scene; and
   in the processor, generating the focus parameter based on the at least one subject of interest.

7. The method of claim 6, wherein identifying at least one subject of interest in the scene comprises receiving, at a user input device, user input indicative of the at least one subject.

8. The method of claim 1, wherein the optical focus depth of the acquired light field video data varies during acquisition thereof.

9. The method of claim 8, wherein generating the refocused video data comprises generating refocused video data having a predetermined focus depth.

10. The method of claim 1, wherein the optical focus depth of the acquired light field video data is fixed during acquisition thereof.

11. The method of claim 1, further comprising:
    at a user input device, receiving user input after acquiring the light field video data, wherein the user input is indicative of a selected focus depth, and wherein determining the focus parameter comprises using the selected focus depth.

12. The method of claim 1, wherein generating the refocused video data comprises generating refocused video data using a tilted refocus plane.

13. The method of claim 1, wherein:
    the acquired light field video data has a first perspective;
    and wherein generating the refocused video data comprises generating refocused video data having a second perspective that is shifted with respect to the first perspective.

14. The method of claim 1, wherein the determined focus parameter is time-varying.

15. The method of claim 1, wherein the light field video data comprises a plurality of key frames, at least one of the key frames comprising an indication of a time-varying focus parameter;
    and wherein determining a focus parameter comprises determining the focus parameter based on at least one key frame.

16. The method of claim 1, wherein the light field video data comprises a plurality of key frames, at least one of the key frames comprising an indication of a selected subject;
    and wherein determining a focus parameter comprises determining a time-varying focus parameter based on determined time-varying focus depths for the selected subject.

17. A light field video acquisition device comprising:
    optics;
    a photosensor array, configured to acquire light field video data of a scene, the acquired light field video data having an optical focus depth, the acquired light field video data comprising a representation having at least four dimensions and comprising at least an indication of a direction of travel of light;
    a microlens array, positioned between the optics and the photosensor array so that light rays are directed onto the photosensor array via the optics and the microlens array;
    processing circuitry, communicatively coupled to the photosensor array, configured to:

determine a focus parameter; and
generate refocused video data using the acquired light field video data and the focus parameter, wherein the generated refocused video data has a focus depth that is different from the optical focus depth of the acquired light field video data; and
an output device, communicatively coupled to the processing circuitry, configured to output the refocused video data.

18. The light field video acquisition device of claim 17, wherein the processing circuitry is configured to generate the refocused video data substantially concurrently with the photosensor array acquiring the light field video data.

19. The light field video acquisition device of claim 17, further comprising:
a storage device, communicatively coupled to the photosensor array, configured to store the acquired light field video data;
and wherein the processing circuitry is configured to generate the refocused video data by processing the stored light field video data.

20. The light field video acquisition device of claim 17, wherein the focus parameter comprises information representing a predetermined focus depth of an area of the scene.

21. The light field video acquisition device of claim 17, wherein the focus parameter comprises information representing focus tracking.

22. The light field video acquisition device of claim 21, wherein the processing circuitry is further configured to:
identify at least one subject of interest in the scene; and
generate the focus parameter based on the at least one subject of interest.

23. The light field video acquisition device of claim 22, further comprising:
a user input device, communicatively coupled to the processing circuitry
and configured to receive user input indicative of the at least one subject;
and wherein the processing circuitry is configured to identify the at least one subject of interest in the scene based on the received user input.

24. The light field video acquisition device of claim 17, wherein the optical focus depth of the acquired light field video data varies during acquisition thereof.

25. The light field video acquisition device of claim 24, wherein the processing circuitry is configured to generate refocused video data having a predetermined focus depth.

26. The light field video acquisition device of claim 17, wherein the optical focus depth of the acquired light field video data is fixed during acquisition thereof.

27. The light field video acquisition device of claim 17, further comprising:
a user input device, communicatively coupled to the processing circuitry and configured to receive user input after the photosensor array has acquired the light field video data, wherein the user input is indicative of a selected focus depth;
and wherein the processing circuitry is configured to determine the focus parameter using the selected focus depth.

28. The light field video acquisition device of claim 17, wherein the processing circuitry is configured to generate the refocused video data using a tilted refocus plane.

29. The light field video acquisition device of claim 17, wherein:
the acquired light field video data has a first perspective;
and wherein the processing circuitry is configured to generate refocused video data having a second perspective that is shifted with respect to the first perspective.

30. The light field video acquisition device of claim 17, wherein the determined focus parameter is time-varying.

31. The light field video acquisition device of claim 17, wherein the light field video data comprises a plurality of key frames, at least one of the key frames comprising an indication of a time-varying focus parameter;
and wherein the processing circuitry is configured to determine the focus parameter based on at least one key frame.

32. The light field video acquisition device of claim 17, wherein the light field video data comprises a plurality of key frames, at least one of the key frames comprising an indication of a selected subject;
and wherein the processing circuitry is configured to determine the focus parameter by determining a time-varying focus parameter based on determined time-varying focus depths for the selected subject.

33. A computer program product for processing light field video data, comprising:
a nontransitory storage medium; and
computer program code, encoded on the medium, configured to cause at least one processor to perform the steps of:
determining a focus parameter for acquired light field video data of a scene, the acquired light field video data having an optical focus depth, the acquired light field video data comprising a representation having at least four dimensions and comprising at least an indication of a direction of travel of light;
generating refocused video data using the acquired light field video data and the focus parameter, wherein the generated refocused video data has a focus depth that is different from the optical focus depth of the acquired light field video data; and
causing an output device to output the refocused video data.

34. The computer program product of claim 33, wherein the computer program code configured to cause at least one processor to generate the refocused video data comprises computer program code configured to cause at least one processor to generate the refocused video data substantially concurrently with acquiring the light field video data.

35. The computer program product of claim 33, further comprising computer program code configured to cause a storage device to store the acquired light field video data in a storage device;
and wherein the computer program code configured to cause at least one processor to generate the refocused video data comprises computer program code configured to cause at least one processor to process the stored light field video data.

36. The computer program product of claim 33, wherein the focus parameter comprises information representing a predetermined focus depth of an area of the scene.

37. The computer program product of claim 33, wherein the focus parameter comprises information representing focus tracking.

38. The computer program product of claim 37, further comprising computer program code, encoded on the medium, configured to cause the at least one processor to perform the steps of:
identifying at least one subject of interest in the scene; and
generating the focus parameter based on the at least one subject of interest.

39. The computer program product of claim 38, wherein the computer program code configured to cause at least one processor to identify at least one subject of interest in the scene comprises computer program code configured to cause at least one processor to receive, from a user input device, user input indicative of the at least one subject.

40. The computer program product of claim 33, wherein the optical focus depth of the acquired light field video data varies during acquisition thereof.

41. The computer program product of claim 40, wherein the computer program code configured to cause at least one processor to generate the refocused video data comprises computer program code configured to cause at least one processor to generate refocused video data having a predetermined focus depth.

42. The computer program product of claim 33, wherein the optical focus depth of the acquired light field video data is fixed during acquisition thereof.

43. The computer program product of claim 33, further comprising:
computer program code configured to cause at least one processor to receiving, from a user input device, user input after acquiring the light field video data,
wherein the user input is indicative of a selected focus depth, and
wherein the computer program code configured to cause at least one processor to determine the focus parameter comprises computer program code configured to cause at least one processor to determine the focus parameter using the selected focus depth.

44. The computer program product of claim 33, wherein the computer program code configured to cause at least one processor to generate the refocused video data comprises computer program code configured to cause at least one processor to generate refocused video data using a tilted refocus plane.

45. The computer program product of claim 33, wherein:
the acquired light field video data has a first perspective; and wherein the computer program code configured to cause at least one processor to generate the refocused video data comprises computer program code configured to cause at least one processor to generate refocused video data having a second perspective that is shifted with respect to the first perspective.

46. The computer program product of claim 33, wherein the determined focus parameter is time-varying.

47. The computer program product of claim 33, wherein the light field video data comprises a plurality of key frames, at least one of the key frames comprising an indication of a time-varying focus parameter;
and wherein the computer program code configured to cause at least one processor to determine a focus parameter comprises computer program code configured to cause at least one processor to determine the focus parameter based on at least one key frame.

48. The computer program product of claim 33, wherein the light field video data comprises a plurality of key frames, at least one of the key frames comprising an indication of a selected subject;
and wherein the computer program code configured to cause at least one processor to determine a focus parameter comprises computer program code configured to cause at least one processor to determine a time-varying focus parameter based on determined time-varying focus depths for the selected subject.

* * * * *